United States Patent
Kimura et al.

(10) Patent No.: US 11,424,737 B2
(45) Date of Patent: Aug. 23, 2022

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Hajime Kimura, Kanagawa (JP); Yoshiyuki Kurokawa, Kanagawa (JP); Tatsunori Inoue, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/973,223

(22) PCT Filed: May 31, 2019

(86) PCT No.: PCT/IB2019/054515
§ 371 (c)(1),
(2) Date: Dec. 8, 2020

(87) PCT Pub. No.: WO2019/239246
PCT Pub. Date: Dec. 19, 2019

(65) Prior Publication Data
US 2021/0257016 A1    Aug. 19, 2021

(30) Foreign Application Priority Data

Jun. 15, 2018 (JP) .............................. JP2018-114294
Aug. 1, 2018 (JP) .............................. JP2018-144980

(51) Int. Cl.
*H03K 17/30* (2006.01)
*H03K 17/0812* (2006.01)
(Continued)

(52) U.S. Cl.
CPC ............ *H03K 17/302* (2013.01); *G06N 3/063* (2013.01); *G11C 5/06* (2013.01); *G11C 11/54* (2013.01);
(Continued)

(58) Field of Classification Search
CPC ............ H03K 17/302; H03K 17/0812; H03K 17/08122; H03K 17/08124;
(Continued)

(56) References Cited

U.S. PATENT DOCUMENTS 8,710,505 B2    4/2014  Kimura
8,878,589 B2    11/2014 Kimura
(Continued)

FOREIGN PATENT DOCUMENTS

JP    2013-033228 A    2/2013
JP    2013-054346 A    3/2013
(Continued)

OTHER PUBLICATIONS

International Search Report (Application No. PCT/IB2019/054515) dated Aug. 20, 2019.
(Continued)

*Primary Examiner* — Patrick C Chen
(74) *Attorney, Agent, or Firm* — Fish & Richardson P.C.

(57) ABSTRACT

In a semiconductor device capable of product-sum operation, variations in transistor characteristics are reduced. The semiconductor device includes a first circuit including a driver unit, a correction unit, and a holding unit, and an inverter circuit. The first circuit has a function of generating an inverted signal of a signal input to an input terminal of the first circuit and outputting the inverted signal to an output terminal of the first circuit. The driver unit includes a p-channel first transistor and an n-channel second transistor having a back gate. The correction unit has a function of
(Continued)

correcting the threshold voltage of one or both of the first transistor and the second transistor. The holding unit has a function of holding the potential of the back gate of the second transistor. The output terminal of the first circuit is electrically connected to an input terminal of the inverter circuit. The time from the input of a signal to the input terminal of the first circuit to the output of a signal from an output terminal of the inverter circuit depends on the potential of the back gate of the second transistor.

8 Claims, 48 Drawing Sheets

(51) Int. Cl.
    *H03K 17/687*     (2006.01)
    *G06N 3/063*     (2006.01)
    *G11C 5/06*     (2006.01)
    *G11C 11/54*     (2006.01)

(52) U.S. Cl.
    CPC . *H03K 17/0812* (2013.01); *H03K 2017/6878* (2013.01)

(58) Field of Classification Search
    CPC ....... H03K 17/08126; H03K 17/08128; G06N 3/063; G06N 3/0635; G11C 5/06; G11C 5/063
    See application file for complete search history.

(56) References Cited

U.S. PATENT DOCUMENTS

| | | | |
|---|---|---|---|
| 9,136,287 | B2 | 9/2015 | Kimura |
| 9,344,037 | B2 | 5/2016 | Okamoto et al. |
| 9,361,577 | B2 | 6/2016 | Miyashita |
| 9,397,637 | B2 | 7/2016 | Kozuma et al. |
| 9,508,759 | B2 | 11/2016 | Kimura |
| 9,742,419 | B2 | 8/2017 | Okamoto et al. |
| 9,843,308 | B2 | 12/2017 | Kozuma et al. |
| 9,935,143 | B2 * | 4/2018 | Ohmaru ............ H01L 27/14636 |
| 10,038,402 | B2 | 7/2018 | Okamoto et al. |
| 10,333,521 | B2 | 6/2019 | Okamoto |
| 10,651,790 | B2 | 5/2020 | Okamoto et al. |
| 2007/0262793 | A1* | 11/2007 | Kapoor ............... H01L 29/8086 326/101 |
| 2013/0003269 | A1 | 1/2013 | Kimura |
| 2013/0032806 | A1 | 2/2013 | Kimura |
| 2015/0256156 | A1 | 9/2015 | Kozuma et al. |
| 2016/0028347 | A1 | 1/2016 | Okamoto et al. |
| 2017/0126176 | A1 | 5/2017 | Okamoto et al. |
| 2017/0154909 | A1* | 6/2017 | Ishizu .................. G09G 3/2092 |
| 2017/0331479 | A1 | 11/2017 | Okamoto |
| 2017/0364791 | A1 | 12/2017 | Miyashita et al. |
| 2018/0040274 | A1* | 2/2018 | Kurokawa ........... G09G 3/2092 |
| 2018/0181862 | A1 | 6/2018 | Ikeda |
| 2020/0266761 | A1 | 8/2020 | Okamoto et al. |

FOREIGN PATENT DOCUMENTS

| | | |
|---|---|---|
| JP | 2015-181228 A | 10/2015 |
| JP | 2016-032297 A | 3/2016 |
| JP | 5885719 | 3/2016 |
| JP | 2017-085571 A | 5/2017 |
| JP | 2017-208815 A | 11/2017 |
| JP | 2017-228295 A | 12/2017 |
| JP | 2018-109968 A | 7/2018 |
| KR | 2013-0007471 A | 1/2013 |
| KR | 2013-0016119 A | 2/2013 |
| KR | 2017-0035946 A | 3/2017 |
| KR | 2017-0051296 A | 5/2017 |
| WO | WO-2016/012893 | 1/2016 |

OTHER PUBLICATIONS

Written Opinion (Application No. PCT/IB2019/054515) dated Aug. 20, 2019.

Miyashita.D et al., "Time-Domain Neural Network:A 48.5 TSOp/s/W Neuromorphic Chip Optimized for Deep Learning and CMOS Technology", IEEE ASSCC 2016 (IEEE Asian Solid-State Circuits Conference), Nov. 7, 2016, pp. 25-28.

Miyashita.D et al., "A Neuromorphic Chip Optimized for Deep Learning and CMOS Technology With Time-Domain Analog and Digital Mixed-Signal Processing", IEEE Journal of Solid-State Circuits, Oct. 1, 2017, vol. 52, No. 10, pp. 2679-2689.

* cited by examiner

FIG. 12A1
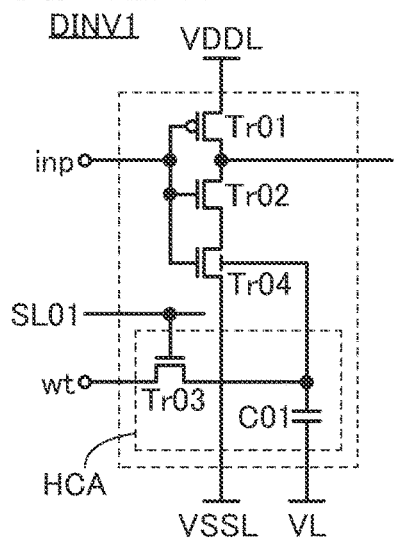
FIG. 12A2
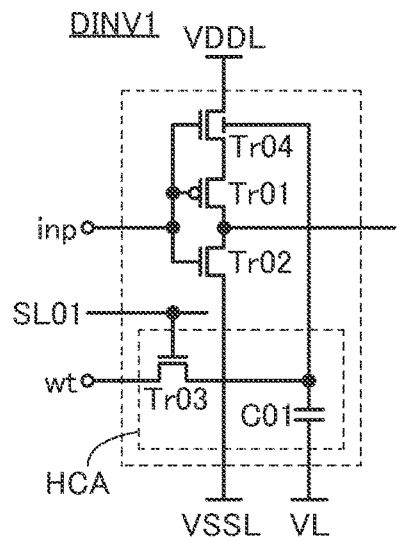
FIG. 12B
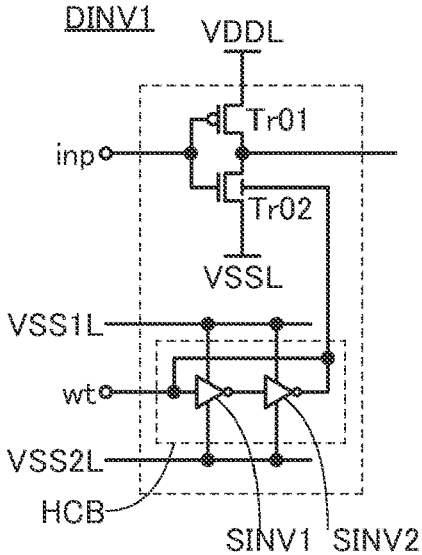
FIG. 12C
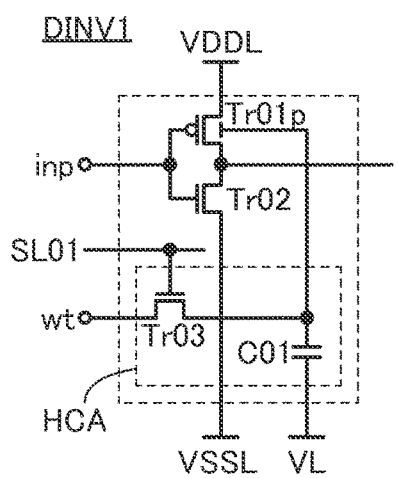
FIG. 12D
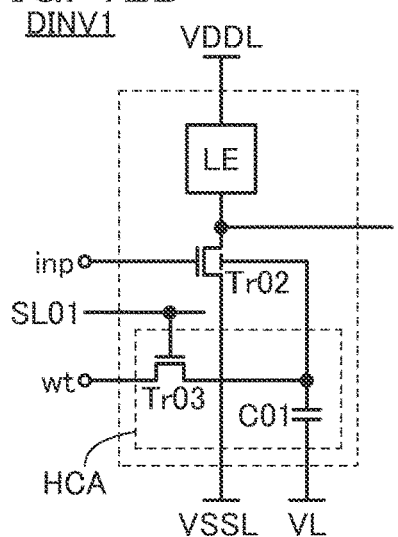

SEMICONDUCTOR DEVICE AND ELECTRONIC DEVICE

CROSS REFERENCE TO RELATED APPLICATIONS

This application is a U.S. National Phase Application under 35 U.S.C. § 371 of International Application PCT/IB2019/054515, filed on May 31, 2019, which is incorporated by reference and claims the benefit of foreign priority applications filed in Japan on Jun. 15, 2018, as Application No. 2018-114294 and on Aug. 1, 2018, as Application No. 2018-144980.

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to neurons and synapses of the human brain. Such integrated circuits may therefore be referred to as "neuromorphic" or "brainmorphic" circuits. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including neurons and synapses is referred to as an artificial neural network (ANN). For example, Patent Document 1, Patent Document 2, Non-Patent Document 1, and Non-Patent Document 2 each disclose an arithmetic device including an artificial neural network constructed using ReRAM (Resistive Random Access Memory). In particular, Non-Patent Document 1 and Non-Patent Document 2 each disclose a circuit that includes the arithmetic device and imitates the brain mechanism.

REFERENCES

[Patent Documents]

[Patent Document 1] Japanese Patent No. 5885719

[Patent Document 2] Japanese Published Patent Application No. 2017-228295

[Non-Patent Documents]

[Non-Patent Document 1] D. Miyashita et al., IEEE Asian Solid-State Circuits Conference, Nov. 7-9, 2016, S4-2 (4077), pp. 25-28.

[Non-Patent Document 2] D. Miyashita et al., IEEE JOURNAL OF SOLID-STATE CIRCUITS, VOL. 52, NO. 10, October 2017, pp. 2679-2689.

SUMMARY OF THE INVENTION

Problems to be Solved by the Invention

In general, an artificial neural network performs calculations in which the connection strength (sometimes referred to as weight coefficient) of a synapse that connects two neurons is multiplied by a signal transmitted between the two neurons. In particular, in a hierarchical artificial neural network, the connection strength of synapses between a plurality of first neurons in a first layer and one of second neurons in a second layer and signals input from the plurality of first neurons in the first layer to the one of the second neurons in the second layer need to be multiplied and summed; the connection strength and the number of parameters indicating the signals are determined in accordance with the scale of the artificial neural network. That is, in the artificial neural network, as the number of layers, the number of neurons, and the like increase, the number of circuits corresponding to the neurons and synapses also increases, which sometimes makes the amount of arithmetic operation enormous.

As the number of circuits included in a chip increases, the power consumption increases and the amount of heat generated when a device is driven also increases. In particular, a larger amount of heat generation is more likely to affect the characteristics of circuit components included in a chip; thus, a circuit constituting the chip preferably includes circuit components that are less affected by temperature. In addition, when a plurality of circuit components are formed in the process of fabricating a chip, the characteristics of the circuit components might vary; hence, a circuit constituting the chip preferably has a function of correcting variations in characteristics of the circuit components.

An object of one embodiment of the present invention is to provide a semiconductor device and the like including a hierarchical artificial neural network. Another object of one embodiment of the present invention is to provide a semiconductor device and the like with low power consumption. Another object of one embodiment of the present invention is to provide a semiconductor device and the like that are less affected by environmental temperature. Another object of one embodiment of the present invention is to provide a semiconductor device and the like having a function of correcting variations in characteristics of circuit components. Another object of one embodiment of the present invention is to provide a novel semiconductor device and the like.

Note that the objects of one embodiment of the present invention are not limited to the objects listed above. The objects listed above do not preclude the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and the other objects. Note that one embodiment of the present invention does not necessarily solve all the objects listed above and the other objects.

Means for Solving the Problems (1) One embodiment of the present invention is a semiconductor device that includes a circuit including an input terminal, an output terminal, and a first transistor; and a first holding unit including a sixth transistor and a capacitor. The first transistor includes a first gate and a second gate. The second gate of the first transistor is electrically connected to a first terminal of the sixth transistor and a first terminal of the capacitor. The first holding unit has a function of holding a potential in the first terminal of the capacitor. The semiconductor device has a function of determining the time it takes after an input signal is input to the input terminal of the circuit until an output signal is output from the output terminal, in accordance with the potential.

(2) One embodiment of the present invention is a semiconductor device including a first circuit. The first circuit includes a first input terminal, a second input terminal, a first output terminal, a second output terminal, a second circuit, a third circuit, and a switching circuit. The second circuit includes a first transistor. The first transistor includes a first gate and a second gate. The switching circuit includes third to fifth input terminals. The first input terminal is electrically connected to an input terminal of the second circuit. The second input terminal is electrically connected to an input terminal of the third circuit. An output terminal of the second circuit is electrically connected to the third input terminal. An output terminal of the third circuit is electrically connected to the fourth input terminal. The second circuit has a function of correcting a signal input to the input terminal of the second circuit and outputting the corrected signal from the output terminal of the second circuit; and a function of changing a time it takes after the signal is input to the input terminal of the second circuit until the corrected signal is output from the output terminal of the second circuit, in accordance with a potential of the second gate of the first transistor. The third circuit has a function of correcting a signal input to the input terminal of the third circuit and outputting the corrected signal to the output terminal of the third circuit. The switching circuit has a function of electrically connecting the third input terminal to one of the first output terminal and the second output terminal and electrically connecting the fourth input terminal to the other of the first output terminal and the second output terminal, in accordance with a signal input to the fifth input terminal.

(3) One embodiment of the present invention is the semiconductor device having the above structure (2), including a plurality of stages of first circuits. The first output terminal of the first circuit in one stage is electrically connected to the first input terminal of the first circuit in a subsequent stage. The second output terminal of the first circuit in the one stage is electrically connected to the second input terminal of the first circuit in the subsequent stage. When potentials corresponding to correspondent first data are applied to the second gates of the first transistors of all the first circuits and first signals corresponding to correspondent second data are applied to the fifth input terminals of all the switching circuits, by input of input signals to the first input terminal and the second input terminal of the first circuit in the first stage, a time lag between output signals output from the first output terminal and the second output terminal of the first circuit in the last stage becomes a time corresponding to a sum of products of the first data and the second data.

(4) One embodiment of the present invention is the semiconductor device having the above structure (3), including a fourth circuit. The fourth circuit is electrically connected to the first output terminal and the second output terminal of the first circuit in the last stage. The fourth circuit has a function of generating a signal corresponding to the time lag between the output signals.

(5) One embodiment of the present invention is the semiconductor device having any one of the above structures (2) to (4), in which the second circuit includes a second transistor, a first holding unit, and a first inverter circuit. The first transistor is an n-channel transistor. The second transistor is a p-channel transistor. The input terminal of the second circuit is electrically connected to a gate of the second transistor and the first gate of the first transistor. A first terminal of the second transistor is electrically connected to a first terminal of the first transistor and an input terminal of the first inverter circuit. An output terminal of the first inverter circuit is electrically connected to the output terminal of the second circuit. The second gate of the first transistor is electrically connected to the first holding unit. The first holding unit has a function of holding the potential of the second gate of the first transistor.

(6) One embodiment of the present invention is the semiconductor device having any one of the above structures (2) to (4), in which the second circuit includes second to fifth transistors, a first holding unit, a second holding unit, and a first inverter circuit. The first transistor and the third transistor are n-channel transistors. The second transistor is a p-channel transistor. The fourth transistor includes a third gate and a fourth gate. The input terminal of the second circuit is electrically connected to a gate of the second transistor, the third gate of the fourth transistor, and the first gate of the first transistor. A first terminal of the second transistor is electrically connected to a first terminal of the third transistor, a first terminal of the fifth transistor, and an input terminal of the first inverter circuit. A second terminal of the third transistor is electrically connected to a first terminal of the first transistor. A second terminal of the fifth transistor is electrically connected to a first terminal of the fourth transistor. An output terminal of the first inverter circuit is electrically connected to the output terminal of the second circuit. The second gate of the first transistor is electrically connected to the first holding unit. The fourth gate of the fourth transistor is electrically connected to the second holding unit. The first holding unit has a function of holding the potential of the second gate of the first transistor. The second holding unit has a function of holding a potential of the fourth gate of the fourth transistor.

(7) One embodiment of the present invention is the semiconductor device having any one of the above structures (2) to (4), in which the second circuit includes a second transistor, a third transistor, a first holding unit, and a first inverter circuit. The first transistor and the third transistor are n-channel transistors. The second transistor is a p-channel transistor. The input terminal of the second circuit is electrically connected to a gate of the second transistor, a gate of the third transistor, and the first gate of the first transistor. A first terminal of the second transistor is electrically connected to a first terminal of the third transistor and an input terminal of the first inverter circuit. A second terminal of the third transistor is electrically connected to a first terminal of the first transistor. An output terminal of the first inverter circuit is electrically connected to the output terminal of the second circuit. The second gate of the first transistor is electrically connected to the first holding unit.

The first holding unit has a function of holding the potential of the second gate of the first transistor.

(8) One embodiment of the present invention is the semiconductor device having any one of the above structures (2) to (4), in which the second circuit includes a load element, a first holding unit, and a first inverter circuit. The input terminal of the second circuit is electrically connected to the first gate of the first transistor. A first terminal of the load element is electrically connected to a first terminal of the first transistor and an input terminal of the first inverter circuit. An output terminal of the first inverter circuit is electrically connected to the output terminal of the second circuit. The second gate of the first transistor is electrically connected to the first holding unit. The first holding unit has a function of holding the potential of the second gate of the first transistor.

(9) One embodiment of the present invention is the semiconductor device having any one of the above structures (5) to (8), in which the first holding unit includes a sixth transistor and a capacitor. The second gate of the first transistor is electrically connected to a first terminal of the sixth transistor and a first terminal of the capacitor. The sixth transistor includes a metal oxide in a channel formation region.

(10) One embodiment of the present invention is the semiconductor device having any one of the above structures (5) to (8), in which the first holding unit includes a second inverter circuit and a third inverter circuit. The second gate of the first transistor is electrically connected to an input terminal of the second inverter circuit and an output terminal of the third inverter circuit. An output terminal of the second inverter circuit is electrically connected to an input terminal of the third inverter circuit.

(11) One embodiment of the present invention is a semiconductor device including a circuit. The circuit includes a driver unit, a correction unit, and a first holding unit. The driver unit includes a first transistor and a second transistor. The second transistor is a p-channel transistor. The first transistor is an n-channel transistor including a first gate and a second gate. The driver unit has a function of generating an inverted signal of a signal input to an input terminal of the circuit and outputting the inverted signal to an output terminal of the circuit. The correction unit has a function of correcting a threshold voltage of the first transistor and/or the second transistor. The first holding unit has a function of holding a potential of the second gate of the first transistor.

(12) One embodiment of the present invention is the semiconductor device having the above structure (11), in which the correction unit includes first to fourth switches and a first capacitor. The input terminal of the circuit is electrically connected to the first gate of the first transistor and a gate of the second transistor. A first terminal of the second transistor is electrically connected to a first terminal of the first switch and the output terminal of the circuit. A first terminal of the first transistor is electrically connected to a second terminal of the first switch and a first terminal of the second switch. A second terminal of the first transistor is electrically connected to a first terminal of the third switch. The second gate of the first transistor is electrically connected to a second terminal of the second switch and a first terminal of the first capacitor. A second terminal of the first capacitor is electrically connected to a second terminal of the third switch and a first terminal of the fourth switch. A second terminal of the fourth switch is electrically connected to the first holding unit.

(13) One embodiment of the present invention is the semiconductor device having the above structure (11), in which the correction unit includes third to eighth switches and a first capacitor. The input terminal of the circuit is electrically connected to a gate of the second transistor and a first terminal of the fifth switch. A second terminal of the fifth switch is electrically connected to the first gate of the first transistor and a first terminal of the seventh switch. A first terminal of the second transistor is electrically connected to a first terminal of the first transistor and the output terminal of the circuit. A second terminal of the first transistor is electrically connected to a first terminal of the third switch, a second terminal of the seventh switch, and a first terminal of the eighth switch. The second gate of the first transistor is electrically connected to a first terminal of the sixth switch and a first terminal of the first capacitor. A second terminal of the first capacitor is electrically connected to a second terminal of the third switch and a first terminal of the fourth switch. A second terminal of the fourth switch is electrically connected to the first holding unit.

(14) One embodiment of the present invention is the semiconductor device having the above structure (11), in which the correction unit includes first to fourth switches and a first capacitor. The input terminal of the circuit is electrically connected to the first gate of the first transistor and a gate of the second transistor. A first terminal of the second transistor is electrically connected to a first terminal of the first transistor and the output terminal of the circuit. A second terminal of the second transistor is electrically connected to a first terminal of the first switch. The first terminal of the first transistor is electrically connected to a first terminal of the second switch. A second terminal of the first transistor is electrically connected to a first terminal of the third switch. The second gate of the first transistor is electrically connected to a second terminal of the second switch and a first terminal of the first capacitor. A second terminal of the first capacitor is electrically connected to a second terminal of the third switch and a first terminal of the fourth switch. A second terminal of the fourth switch is electrically connected to the first holding unit.

(15) One embodiment of the present invention is the semiconductor device having the above structure (11), in which the correction unit includes eighth to eleventh switches and a second capacitor. The input terminal of the circuit is electrically connected to a first terminal of the tenth switch and the first gate of the first transistor. A first terminal of the second transistor is electrically connected to a first terminal of the first transistor and a first terminal of the eleventh switch. A second terminal of the second transistor is electrically connected to a first terminal of the ninth switch. A second terminal of the tenth switch is electrically connected to a second terminal of the ninth switch and a first terminal of the second capacitor. A gate of the second transistor is electrically connected to a second terminal of the eleventh switch and a second terminal of the second capacitor. The first terminal of the first transistor is electrically connected to the output terminal of the circuit. The eighth switch is a circuit component electrically connected between the first terminal of the first transistor and the first terminal of the second transistor, or a circuit component electrically connected to a second terminal of the first transistor. The second gate of the first transistor is electrically connected to the first holding unit.

(16) One embodiment of the present invention is the semiconductor device having the above structure (11), in which the correction unit includes first, ninth, tenth, and eleventh switches and a second capacitor. The input terminal of the circuit is electrically connected to a first terminal of the tenth switch and the first gate of the first transistor. A first terminal of the second transistor is electrically connected to a first terminal of the first transistor and the output terminal of the circuit. A second terminal of the second transistor is electrically connected to a first terminal of the first switch and a first terminal of the ninth switch. A second terminal of the tenth switch is electrically connected to a second terminal of the ninth switch and a first terminal of the second capacitor. A gate of the second transistor is electrically connected to a first terminal of the eleventh switch and a second terminal of the second capacitor. The second gate of the first transistor is electrically connected to the first holding unit.

(17) One embodiment of the present invention is the semiconductor device having the above structure (12) or (13), in which the correction unit includes ninth to eleventh switches and a second capacitor. Between the input terminal of the circuit and the gate of the second transistor, the input terminal of the circuit and a first terminal of the tenth switch are electrically connected to each other, a second terminal of the tenth switch and a first terminal of the second capacitor are electrically connected to each other, and a second terminal of the second capacitor and the gate of the second transistor are electrically connected to each other. A first terminal of the ninth switch is electrically connected to the first terminal of the second transistor. A second terminal of the ninth switch is electrically connected to the second terminal of the tenth switch and the first terminal of the second capacitor. A first terminal of the eleventh switch is electrically connected to a second terminal of the second transistor. A second terminal of the eleventh switch is electrically connected to the second terminal of the second capacitor and the first gate of the second transistor.

(18) One embodiment of the present invention is the semiconductor device having the above structure (13), in which the correction unit includes a first switch, ninth to eleventh switches, and a second capacitor. The first switch is electrically connected to a second terminal of the second transistor. Between the input terminal of the circuit and the gate of the second transistor, the input terminal of the circuit and a first terminal of the tenth switch are electrically connected to each other, a second terminal of the tenth switch and a first terminal of the second capacitor are electrically connected to each other, and a second terminal of the second capacitor and the gate of the second transistor are electrically connected to each other. A first terminal of the ninth switch is electrically connected to the second terminal of the second transistor and a first terminal of the first switch. A second terminal of the ninth switch is electrically connected to the second terminal of the tenth switch and the first terminal of the second capacitor. A first terminal of the eleventh switch is electrically connected to the second terminal of the second capacitor and the gate of the second transistor.

(19) One embodiment of the present invention is the semiconductor device having the above structure (14), in which the correction unit includes ninth to eleventh switches and a second capacitor. Between the input terminal of the circuit and the gate of the second transistor, the input terminal of the circuit and a first terminal of the tenth switch are electrically connected to each other, a second terminal of the tenth switch and a first terminal of the second capacitor are electrically connected to each other, and a second terminal of the second capacitor and the gate of the second transistor are electrically connected to each other. A first terminal of the ninth switch is electrically connected to the second terminal of the second transistor and the first terminal of the first switch. A second terminal of the ninth switch is electrically connected to the second terminal of the tenth switch and the first terminal of the second capacitor. A first terminal of the eleventh switch is electrically connected to the second terminal of the second capacitor and the gate of the second transistor.

(20) One embodiment of the present invention is the semiconductor device having any one of the above structures (11) to (19), in which the first holding unit includes a third transistor and a third capacitor. The second gate of the first transistor is electrically connected to a first terminal of the third transistor and a first terminal of the third capacitor. The third transistor includes a metal oxide in a channel formation region.

(21) One embodiment of the present invention is the semiconductor device having any one of the above structures (11) to (19), in which the first holding unit includes a first inverter circuit and a second inverter circuit. The second gate of the first transistor is electrically connected to an input terminal of the first inverter circuit and an output terminal of the second inverter circuit. An output terminal of the first inverter circuit is electrically connected to an input terminal of the second inverter circuit.

(22) One embodiment of the present invention is the semiconductor device having any one of the above structures (11) to (21), including a first circuit including two circuits. The first circuit includes a first input terminal, a second input terminal, a first output terminal, a second output terminal, a second circuit, a third circuit, and a switching circuit. The switching circuit includes third to fifth input terminals and third and fourth output terminals. The first input terminal is electrically connected to the input terminal of one of the two circuits. The output terminal of the one of the two circuits is electrically connected to the third input terminal. The third output terminal is electrically connected to the first output terminal. The second input terminal is electrically connected to the input terminal of the other of the two circuits. The output terminal of the other of the two circuits is electrically connected to the fourth input terminal. The fourth output terminal is electrically connected to the second output terminal. The second circuit is electrically connected between the first input terminal and the input terminal of the one of the two circuits, between the output terminal of the one of the two circuits and the third input terminal, or between the third output terminal and the first output terminal. The third circuit is electrically connected between the second input terminal and the input terminal of the other of the two circuits, between the output terminal of the other of the two circuits and the fourth input terminal, or between the fourth output terminal and the second output terminal. The second circuit has a function of generating an inverted signal of a signal input to an input terminal of the second circuit and outputting the inverted signal to an output terminal of the second circuit. The third circuit has a function of generating an inverted signal of a signal input to an input terminal of the third circuit and outputting the inverted signal to an output terminal of the third circuit. The switching circuit has a function of electrically connecting the third input terminal to one of the third output terminal and the fourth output terminal and electrically connecting the fourth input terminal to the other of the third output terminal and the fourth output terminal, in accordance with a signal input to the fifth input terminal.

(23) One embodiment of the present invention is the semiconductor device having the above structure (22), including a plurality of stages of first circuits. The first output terminal of the first circuit in one stage is electrically connected to the first input terminal of the first circuit in a subsequent stage. The second output terminal of the first circuit in the one stage is electrically connected to the second input terminal of the first circuit in the subsequent stage. When potentials corresponding to correspondent first data are held in retention nodes of all the first circuits and first signals corresponding to correspondent second data are applied to the fifth input terminals of all the switching circuits, by input of input signals to the first input terminal and the second input terminal of the first circuit in the first stage, a time lag between output signals output from the first output terminal and the second output terminal of the first circuit in the last stage becomes a time corresponding to a sum of products of the first data and the second data.

(24) One embodiment of the present invention is the semiconductor device having the above structure (23), including a fourth circuit. The fourth circuit is electrically connected to the first output terminal and the second output terminal of the first circuit in the last stage. The fourth circuit has a function of generating a signal corresponding to the time lag between the output signals.

(25) One embodiment of the present invention is the semiconductor device having any one of the above structures (1) to (24), in which the first transistor includes a metal oxide in a channel formation region.

(26) One embodiment of the present invention is an electronic device including the semiconductor device according to any one of (1) to (25), in which arithmetic operation of a neural network is performed by the semiconductor device.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, the switch has a function of being in a conduction state (on state) or a non-conduction state (off state) to determine whether current flows or not.

For example, in the case where X and Y are functionally connected, at least one circuit that enables functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween). That is, the explicit expression "X and Y are electrically connected" is the same as the explicit simple expression "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples, and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a transistor includes three terminals called a gate, a source, and a drain. The gate functions as a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" are interchangeable in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential. When the reference potential is a ground potential, for example, the "voltage" can be expressed as the "potential". The ground potential does not necessarily mean 0 V. Potentials are relative values, and the potential applied to a wiring or the like is sometimes changed depending on the reference potential.

In general, "current" is defined as a charge transfer (electrical conduction) accompanied by transfer of positively charged particles; for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over" and "under", are sometimes used for convenience to describe the positional relation between components with reference to drawings. The positional relation between components is changed as appropriate in accordance with a direction in which the components are described. Thus, terms for the description are not limited to terms used in the specification and the like, and the description can be made appropriately depending on the situation. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly on or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, a term such as an "electrode" or a "wiring" does not limit the function of a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. In the case of an oxide semiconductor, oxygen vacancies might be formed by entry of impurities such as hydrogen. Furthermore, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch is in a conduction state (on state) or a non-conduction state (off state) to determine whether current flows or not. Alternatively, a switch has a function of selecting and changing a current path. For example, an electrical switch or a mechanical switch can be used. That is, a switch can be any element capable of controlling current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode that can be moved mechanically, and operates by controlling conduction and non-conduction with movement of the electrode.

Effect of the Invention

One embodiment of the present invention can provide a semiconductor device and the like including a hierarchical artificial neural network. Alternatively, one embodiment of the present invention can provide a semiconductor device and the like with low power consumption. Alternatively, one embodiment of the present invention can provide a semiconductor device and the like that are less affected by environmental temperature. Alternatively, one embodiment of the present invention can provide a semiconductor device and the like that have a function of correcting variations in characteristics of circuit components. Alternatively, one embodiment of the present invention can provide a novel semiconductor device and the like.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIGS. 12(A1), (A2), (B), (C), (D) Circuit diagrams illustrating configuration examples of a circuit included in a semiconductor device.

MODE FOR CARRYING OUT THE INVENTION

Figure 1A:
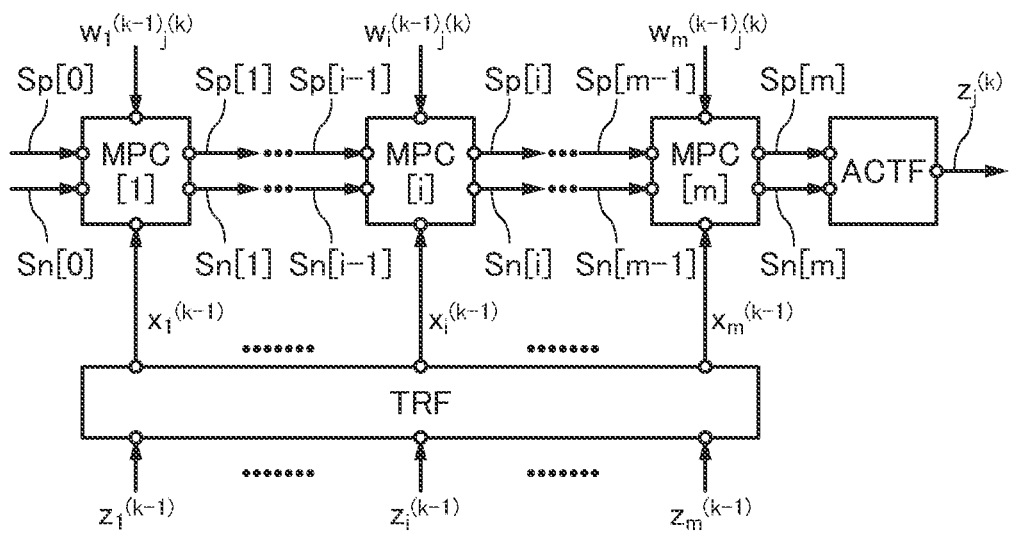
FIG. 1(A) A block diagram illustrating a structure example of a semiconductor device, and (B), (C) block diagrams each illustrating a structure example of a circuit included in the semiconductor device.

In an artificial neural network (hereinafter referred to as a neural network), the connection strength between synapses can be changed when existing data is given to the neural network. The processing for determining a connection strength by providing a neural network with existing data in such a manner is called "learning" in some cases.

Furthermore, when a neural network in which "learning" has been performed (the connection strength has been determined) is provided with some type of data, new data can be output on the basis of the connection strength. The processing for outputting new data on the basis of provided data and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. Moreover, when an OS FET or an OS transistor is described, it can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, the following can be included: variation in signal, voltage, or current due to noise or difference in timing.

Embodiment 1

In this embodiment, an arithmetic circuit that is a semiconductor device of one embodiment of the present invention and performs arithmetic operation of a neural network will be described.

<Hierarchical Neural Network>

Figure 4A:
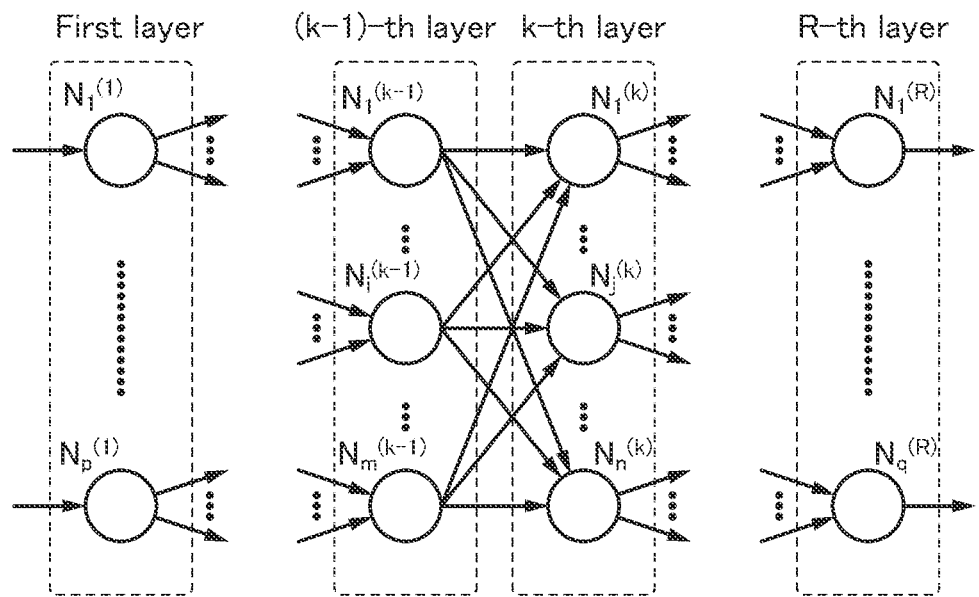
FIGS. 4(A), (B) Diagrams illustrating a hierarchical neural network.

First, a hierarchical neural network is described. A hierarchical neural network includes one input layer, one or a plurality of intermediate layers (hidden layers), and one output layer, for example, and is configured with a total of at least three layers. A hierarchical neural network 100 illustrated in FIG. 4(A) is one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 4(A) illustrates the (k−1)-th layer and the k-th layer (here, k is an integer greater than or equal to 3 and less than or equal to R−1) as the intermediate layers, and does not show the other intermediate layers.

Each of the layers of the neural network 100 includes one or a plurality of neurons. In FIG. 4(A), the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

FIG. 4(A) illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made with a focus on the neuron $N_j^{(k)}$ in the k-th layer.

Figure 4B:
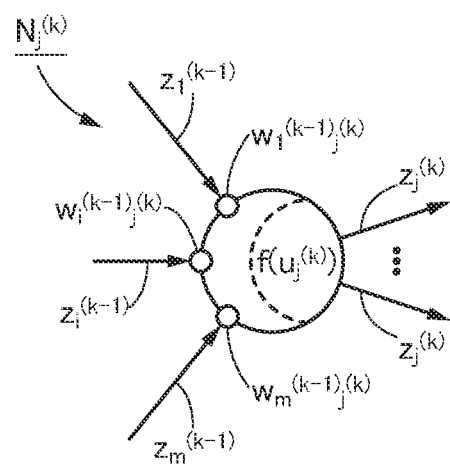

FIG. 4(B) illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter referred to as weight coefficient) of the synapse that connects the neurons to each other. In the neural network 100, a signal output from a neuron in one layer is multiplied by a corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)(k)}{}_j$, a signal input to the neuron $N_j^{(k)}$ in the k-th layer can be expressed by Formula (1.1).

[Formula 1]

$$w_i^{(k-1)(k)}{}_j \cdot z_i^{(k-1)} \quad (1.1)$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by respective weight coefficients ($w_1^{(k-1)(k)}{}_j$ to $w_m^{(k-1)(k)}{}_j$). Then, $w_1^{(k-1)(k)}{}_j \cdot z_1^{(k-1)}$ to $w_m^{(k-1)(k)}{}_j \cdot z_m^{(k-1)}$ are input to the neuron $N_j^{(k)}$ in the k-th layer. At that time, the total sum $u_j^{(k)}$ of the signals input to the neuron $N_j^{(k)}$ in the k-th layer is expressed by Formula (1.2).

[Formula 2]

$$u_j^{(k)} = \sum_{i=1}^{m} w_i^{(k-1)(k)}{}_j \cdot z_i^{(k-1)} \quad (1.2)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 3]

$$z_j^{(k)} = f(u_j^{(k)}) \quad (1.3)$$

A function $f(u_j^{(k)})$ is an activation function in a hierarchical neural network, and a step function, a linear ramp function, a sigmoid function, or the like can be used. Note that the activation function may be the same or different among all neurons. Additionally, the neuron activation function may be the same or different between the layers.

Signals output from the neurons in the layers may have an analog value or a binary value. In the former case, a linear ramp function or a sigmoid function is used as the activation function. In the latter case, a step function with an output of −1 or 1 is used.

The neural network 100 performs operation in which by input of an input signal to the first layer (the input layer), output signals are sequentially generated in layers from the first layer (the input layer) to the last layer (the output layer) according to Formulae (1.1) to (1.3) on the basis of the signals input from the previous layers, and the output signals are output to the subsequent layers. The signal output from the last layer (the output layer) corresponds to the calculation results of the neural network 100.

<Arithmetic Circuit>

Here, the description is made on an arithmetic circuit that is capable of performing the arithmetic operation in Formula (1.2) and Formula (1.3) in the neural network 100 using a step function with an output of −1 or 1 as the neuron activation function.

An arithmetic circuit 110 illustrated in FIG. 1(A) is a semiconductor device including a circuit MPC[1] to a circuit MPC[m], a circuit ACTF, and a converter circuit TRF. The arithmetic circuit 110 processes signals input to the neuron $N_j^{(k)}$ in the k-th layer in FIGS. 4(A) and 4(B) and generates the signal $z_j^{(k)}$ output from the neuron $N_j^{(k)}$. In this specification and the like, in the case where the circuit MPC[1] to the circuit MPC[m] are not distinguished from each other, they are referred to as circuits MPC.

«Circuit MPC»

Figure 1B:
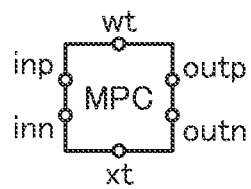

FIG. 1(B) illustrates terminals included in the circuit MPC. The circuit MPC includes, for example, a terminal inp, a terminal inn, a terminal outp, a terminal outn, a terminal wt, and a terminal xt.

The circuit MPC has a function of outputting a signal input to the terminal inp to one of the terminal outp and the terminal outn and outputting a signal input to the terminal inn to the other of the terminal outp and the terminal outn. The output destinations of the signals input to the terminal inp and the terminal inn can be determined by a signal input to the terminal xt, for example.

Moreover, the circuit MPC has a function of changing the time it takes after a signal is input to the terminal inp until a signal is output from one of the terminal outp and the terminal outn, for example. This time can be determined by a signal input to the terminal wt. In the following description, the time it takes after a signal is input to an input terminal of a circuit until a signal is output from an output terminal of the circuit is referred to as input/output time.

Figure 2A:
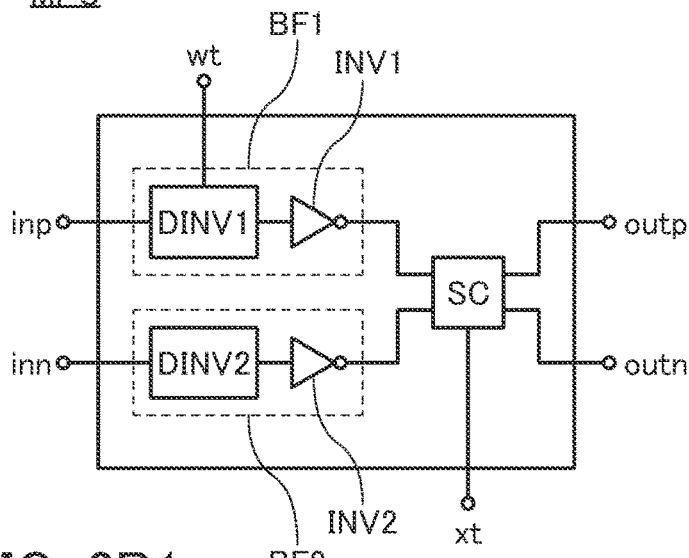
FIG. 2(A) A block diagram illustrating a configuration example of a circuit included in a semiconductor device, and (B1), (B2), (C1), (C2) circuit diagrams each illustrating a configuration example of a circuit included in the semiconductor device.
Figure 2A:
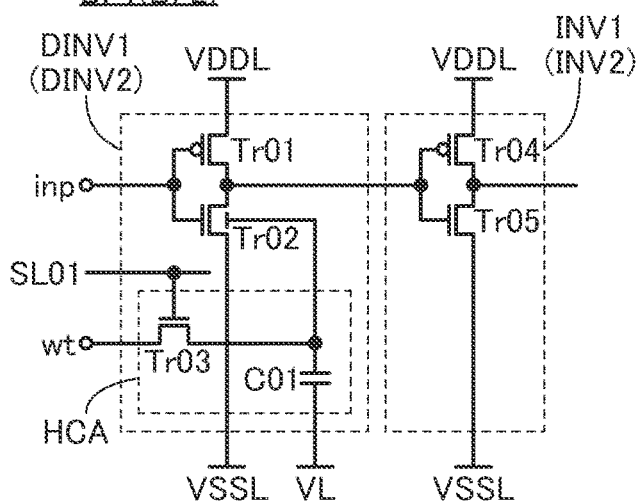
Figure 2A:
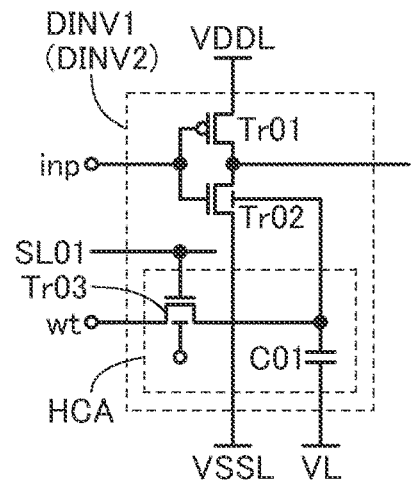
Figure 2A:
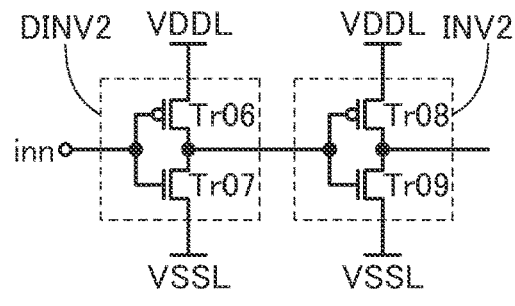
Figure 2A:
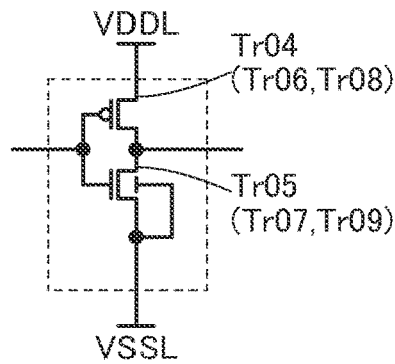

FIG. 2(A) illustrates a configuration example of the circuit MPC. The circuit MPC illustrated in FIG. 2(A) includes a circuit BF1, a circuit BF2, and a switching circuit SC.

An input terminal of the circuit BF1 is electrically connected to the terminal inp, and an output terminal of the circuit BF1 is electrically connected to one of two input terminals of the switching circuit SC. An input terminal of the circuit BF2 is electrically connected to the terminal inn, and an output terminal of the circuit BF2 is electrically connected to the other of the two input terminals of the switching circuit SC. One of two output terminals of the switching circuit SC is electrically connected to the terminal outp, and the other of the two output terminals of the switching circuit SC is electrically connected to the terminal outn.

[Circuit BF1]

The circuit BF1 has a function of correcting a signal input to the input terminal of the circuit BF1 and outputting the corrected signal from the output terminal of the circuit BF1. The circuit BF1 can be, for example, a circuit in which two inverter circuits are connected in series (a buffer circuit). The number of inverter circuits is not limited to two but is desirably two or more because the circuit can be configured more easily when the input and the output have the same logic value. Other than the inverter circuit, a NAND circuit, a NOR circuit, or the like can also be used. Furthermore, a logic circuit, a signal converter circuit, or a potential level converter circuit can sometimes be used as the circuit BF1, for example. The circuit BF1 in FIG. 2(A) includes an inverter circuit DINV1 and an inverter circuit INV1.

The inverter circuit DINV1 and the inverter circuit INV1 each have a function of outputting an inverted signal of an input signal. In particular, the inverter circuit DINV1 is electrically connected to the terminal wt, and the driving speed of the inverter circuit DINV1 can be determined in accordance with a signal input to the terminal wt. In other words, the input/output time of the inverter circuit DINV1 can be changed.

FIG. 2(B1) illustrates a specific configuration example of the circuit BF1. As an example, the inverter circuit DINV1 includes a transistor Tr01 to a transistor Tr03 and a capacitor C01, and the inverter circuit INV1 includes a transistor Tr04 and a transistor Tr05. For example, the transistor Tr01 and the transistor Tr04 are p-channel transistors, and the transistor Tr02, the transistor Tr03, and the transistor Tr05 are n-channel transistors. As an example, the transistor Tr02 is a transistor with a structure including a back gate. Similarly, as an example, the transistor Tr03 may be a transistor with a structure including a back gate. Moreover, the transistor Tr03 is preferably a transistor having a low off-state current, for example. Specifically, the transistor Tr03 is preferably an OS transistor. An OS transistor may also be used as the n-channel transistors other than the transistor Tr03.

In this specification and the like, for example, transistors with a variety of structures can be used as a transistor. Thus, there is no limitation on the type of transistors used. Examples of transistors include a transistor including single crystal silicon and a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a temperature lower than that of the case of using single crystal silicon, manufacturing costs can be reduced or a larger manufacturing apparatus can be used. Since a larger manufacturing apparatus can be used, TFTs can be manufactured over a large substrate. This enables a large number of display devices to be manufactured at a time, resulting in low cost manufacturing. Alternatively, a low manufacturing temperature allows the use of a low heat-resistance substrate. Thus, transistors can manufactured over a light-transmitting substrate. Transmission of light in a display element can be controlled by using the transistor over a light-transmitting substrate. Alternatively, some of the films included in the transistor can transmit light because the transistor is thin. Accordingly, the aperture ratio can be improved.

For example, a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O, or In—Sn—Zn—O) can be used. Alternatively, a thin film transistor including a thin film of such a compound semiconductor or oxide semiconductor can be used. Accordingly, manufacturing temperature can be lowered and, for example, such a transistor can be manufactured at room temperature. As a result, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, or a light-transmitting electrode. Since such components can be deposited or formed at the same time as the transistor, the cost can be reduced.

As another example, a transistor formed by an inkjet method or a printing method can be used. The transistor can be manufactured at room temperature, manufactured at a low vacuum, or manufactured over a large substrate. Accordingly, the transistor can be manufactured without using a mask (reticle), so that the layout of the transistor can be easily changed. Alternatively, since the transistor can be manufactured without using a resist, the material cost is reduced, and the number of steps can be reduced. Alternatively, since a film can be formed only where needed, a material is not wasted compared to a manufacturing method by which etching is performed after the film is formed over the entire surface; thus, the cost can be reduced.

As another example, a transistor containing an organic semiconductor or a carbon nanotube can be used. Thus, a transistor can be formed over a bendable substrate. A device using a transistor containing an organic semiconductor or a carbon nanotube can be highly resistant to impact.

Note that a transistor with any of a variety of other structures can also be used. For example, a MOS transistor, a junction transistor, a bipolar transistor, or the like can be used as the transistor. By using a MOS transistor as the transistor, the size of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, a reduction in power consumption, a reduction in size, high-speed operation, and the like can be achieved.

For example, it is possible to use a transistor having a structure where gate electrodes are positioned above and below a channel. With the structure where the gate electrodes are positioned above and below the channel, a circuit configuration is such that a plurality of transistors are connected in parallel. Thus, a channel formation region is increased, so that the amount of current can be increased. Alternatively, with the structure where the gate electrodes are positioned above and below the channel, a depletion layer can be easily formed, so that subthreshold swing can be improved.

For example, it is possible to use a transistor having a structure where a gate electrode is positioned above a channel formation region, a structure where a gate electrode is positioned below a channel formation region, a staggered structure, an inverted staggered structure, a structure where a channel formation region is divided into a plurality of regions, a structure where channel formation regions are connected in parallel, a structure where channel formation regions are connected in series, or the like. Alternatively, a transistor can have a variety of structures such as a planar type, a FIN-type, a TRI-GATE type, a top-gate type, a bottom-gate type, and a double-gate type (with gates above and below a channel).

As another example, it is possible to use a transistor having a structure where a source electrode or a drain electrode overlaps with a channel formation region (or part thereof). Employing the structure where the source electrode or the drain electrode overlaps with the channel formation region (or part thereof) can prevent unstable operation due to accumulation of electric charge in part of the channel formation region.

As another example, it is possible to use a transistor having a structure where an LDD region is provided. By providing the LDD region, it is possible to achieve a reduction in off-state current or an increase in withstand voltage (an improvement in reliability) of the transistor. Alternatively, by providing the LDD region, when the transistor operates in a saturation region, the drain current does not change much even if the drain-source voltage changes, and thus the voltage-current characteristics having a flat slope can be obtained.

In this specification and the like, a transistor can be formed using a variety of substrates, for example. The type of the substrate is not limited to a certain type. Examples of the substrate include a semiconductor substrate (e.g., a single crystal substrate or a silicon substrate), an SOI substrate, a glass substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate, and the transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred to even a substrate having low heat resistance or a flexible substrate. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate; thus, the transistor may be positioned over another substrate. Examples of the substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, fabricating a device with high durability, providing high heat resistance, reducing weight, or reducing thickness can be achieved.

Note that all the circuits that are necessary to achieve a predetermined function can be formed using one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that it is possible not to form all the circuits that are necessary to achieve a predetermined function on one substrate. That is, it is possible to form part of the circuits necessary to achieve the predetermined function on a given substrate and form the other part of the circuits necessary to achieve the predetermined function on another substrate. For example, part of the circuits necessary to achieve the predetermined function can be formed over a glass substrate, and the other part of the circuits necessary to achieve the predetermined function can be formed using a single crystal substrate (or an SOI substrate). The single crystal substrate where the other part of the circuits necessary to achieve the predetermined function (also referred to as an IC chip) can be connected to the glass substrate by COG (Chip On Glass), and the IC chip can be provided over the glass substrate. Alternatively, the IC chip can be connected to the glass substrate by TAB (Tape Automated Bonding), COF (Chip On Film), SMT (Surface Mount Technology), a printed circuit board, or the like. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed on a substrate (e.g., a single crystal substrate) different from a substrate where a pixel portion is formed, whereby an IC chip is formed. The use of this IC chip can prevent the increase in power consumption.

In the inverter circuit DINV1, a gate of the transistor Tr01 and a gate of the transistor Tr02 are electrically connected to the terminal inp, a first terminal of the transistor Tr01 is electrically connected to a wiring VDDL, and a second terminal of the transistor Tr01 is electrically connected to a first terminal of the transistor Tr02. A second terminal of the transistor Tr02 is electrically connected to a wiring VSSL, and the back gate of the transistor Tr02 is electrically connected to a first terminal of the transistor Tr03 and a first terminal of the capacitor C01. A second terminal of the transistor Tr03 is electrically connected to the terminal wt, and a gate of the transistor Tr03 is electrically connected to a wiring SL01. A second terminal of the capacitor C01 is electrically connected to a wiring VL. The second terminal of the transistor Tr01 and the first terminal of the transistor Tr02 are electrically connected to an input terminal of the inverter circuit INV1.

In the inverter circuit INV1, a gate of the transistor Tr04 and a gate of the transistor Tr05 are electrically connected to the input terminal of the inverter circuit INV1, a first terminal of the transistor Tr04 is electrically connected to the wiring VDDL, and a second terminal of the transistor Tr04 is electrically connected to a first terminal of the transistor Tr05. A second terminal of the transistor Tr05 is electrically connected to the wiring VSSL. The second terminal of the transistor Tr04 and the first terminal of the transistor Tr05 are electrically connected to an output terminal of the inverter circuit INV1.

The wiring VDDL functions as a voltage line for supplying a voltage VDD that is a high-level potential, and the wiring VSSL functions as a voltage line for supplying a voltage VSS that is a low-level potential. Note that the wiring VSSL may be supplied with a negative potential, a positive potential, or a potential of 0 V (GND). The wiring VL functions as a voltage line for supplying a constant voltage, and the constant voltage can be VDD, VSS, a ground potential, or the like.

In the inverter circuit DINV1, the transistor Tr03 and the capacitor C01 are included in a holding unit HCA. The holding unit HCA has a function of holding a potential corresponding to a signal input from the terminal wt. Note that the potential can be one of a low-level potential and a high-level potential representing a binary value or a potential representing an analog value.

The transistor Tr03 included in the holding unit HCA functions as a switching element, and applying a potential to the gate of the transistor Tr03 from the wiring SL01 can turn on or off the transistor Tr03.

The transistor Tr03 is turned on by supply of a high-level potential to the wiring SL01, whereby electrical continuity can be established between the terminal wt and the first terminal of the capacitor C01. At this time, the circuit MPC receives a signal from the terminal wt, and then can write a potential corresponding to the signal to the first terminal of the capacitor C01. After the potential is written to the first terminal of the capacitor C01, the transistor Tr03 is turned off by supply of a low-level potential to the wiring SL01, whereby the potential can be held in the holding unit HCA.

In order to hold the potential written to the first terminal of the capacitor C01 in the holding unit HCA for a long time, the transistor Tr03 is preferably an OS transistor. In addition, it is further preferable that a channel formation region of the transistor Tr03 be an oxide containing at least one of indium, an element M (examples of the element M include aluminum, gallium, yttrium, and tin), and zinc. It is further preferable that the transistor Tr03 have a structure of the transistor described particularly in Embodiment 5.

An OS transistor has a feature of an extremely low off-state current because a metal oxide functioning as its channel formation region has a wide band gap. Thus, with the use of the OS transistor as the transistor Tr03, leakage current from the first terminal of the capacitor C01 to the terminal wt in the off state of the transistor Tr03 can be extremely low. That is, the frequency of operation of refreshing the potential of the first terminal of the capacitor C01 can be decreased, thereby reducing the power consumed to hold the potential of the first terminal of the capacitor C01.

Since the transistor Tr02 has the back gate, the threshold voltage of the transistor Tr02 can be changed with the potential supplied to the back gate. In the circuit MPC, the back gate of the transistor Tr02 is connected to the first terminal of the capacitor C01; hence, the threshold voltage of the transistor Tr02 depends on the potential of the first terminal of the capacitor C01.

For example, when the potential of the first terminal of the capacitor C01 is a high-level potential, the threshold voltage of the transistor Tr02 shifts negatively; thus, the amount of current flowing between the source and the drain of the transistor Tr02 increases. This shortens the input/output time it takes after a signal is input to the input terminal of the inverter circuit DINV1 until a signal is output from the output terminal.

As another example, when the potential of the first terminal of the capacitor C01 is a low-level potential, the threshold voltage of the transistor Tr02 shifts positively; thus, the amount of current flowing between the source and the drain of the transistor Tr02 decreases. This lengthens the input/output time it takes after a signal is input to the input terminal of the inverter circuit DINV1 until a signal is output from the output terminal.

Specifically, when the transistor Tr02 operates with a potential applied to its gate in the range of −0.8 V to 2.5 V, a high-level potential of 1.5 V or higher and a low-level potential of lower than 1.5 V are supplied to the back gate of the transistor Tr02, for example.

The transistor Tr03 may also have a back gate. FIG. 2(B2) illustrates a circuit configuration in which the transistor Tr03 includes a back gate in the inverter circuit DINV1 in FIG. 2(B1). The back gate of the transistor Tr03 can be electrically connected to, for example, the gate of the transistor Tr03. When the gate and the back gate of the transistor Tr03 are electrically connected to each other, the amount of current flowing through the transistor Tr03 in the on state can be increased. For example, the back gate of the transistor Tr03 may be provided with a wiring for electrically connecting to an external circuit, and the threshold voltage of the transistor Tr03 may be increased by supply of a potential to the back gate of the transistor Tr03 from the external circuit. With such a configuration, the off-state current of the transistor Tr03 can be reduced owing to the external circuit.

[Circuit BF2]

In FIG. 2(A), the circuit BF2 includes an inverter circuit DINV2 and an inverter circuit INV2. Like the circuit BF1, the circuit BF2 functions as an amplifier circuit that amplifies a signal input to the input terminal of the circuit BF2 and outputs the signal from the output terminal of the circuit BF2. Thus, the circuit BF2 can have a configuration similar to that of the circuit BF1 illustrated in FIG. 2(B1). In that case, the first terminal of the capacitor C01 in the inverter circuit DINV2 preferably holds an intermediate potential between a high-level potential and a low-level potential. When the potential of the first terminal of the capacitor C01 in the inverter circuit DINV1 is set to a high-level potential or a low-level potential, the input/output time of the circuit BF1 can be made shorter or longer than the input/output time of the circuit BF2.

The circuit BF2 may have a circuit configuration illustrated in FIG. 2(C1). The inverter circuit DINV2 in FIG. 2(C1) includes a transistor Tr06 and a transistor Tr07, and the inverter circuit INV2 includes a transistor Tr08 and a transistor Tr09. The transistor Tr06 and the transistor Tr08 are p-channel transistors, and the transistor Tr07 and the transistor Tr09 are n-channel transistors.

In the inverter circuit DINV2, a gate of the transistor Tr06 and a gate of the transistor Tr07 are electrically connected to the terminal inn, a first terminal of the transistor Tr06 is electrically connected to the wiring VDDL, and a second terminal of the transistor Tr06 is electrically connected to a first terminal of the transistor Tr07. A second terminal of the transistor Tr07 is electrically connected to the wiring VSSL. The second terminal of the transistor Tr06 and the first terminal of the transistor Tr07 are electrically connected to an input terminal of the inverter circuit INV2.

In the inverter circuit INV2, a gate of the transistor Tr08 and a gate of the transistor Tr09 are electrically connected to the input terminal of the inverter circuit INV2, a first terminal of the transistor Tr08 is electrically connected to the wiring VDDL, and a second terminal of the transistor Tr08 is electrically connected to a first terminal of the transistor Tr09. A second terminal of the transistor Tr09 is electrically connected to the wiring VSSL. The second terminal of the transistor Tr08 and the first terminal of the transistor Tr09 are electrically connected to an output terminal of the inverter circuit INV2.

That is, the circuit configuration of the inverter circuit DINV2 can be the same as the circuit configuration of the inverter circuit INV2. Alternatively, the transistor Tr07 may be provided with a back gate, and the back gate may be connected to the wiring VSSL.

The inverter circuit INV1, the inverter circuit INV2, and the inverter circuit DINV2 described above may each have a configuration of an inverter circuit INV1A illustrated in FIG. 2(C2), for example. The inverter circuit INV1A has a configuration in which the transistor Tr05 (the transistor Tr07 or the transistor Tr09) has a back gate and the back gate is electrically connected to the second terminal of the transistor Tr05 (the transistor Tr07 or the transistor Tr09) in the circuit configuration of the inverter circuit INV1, the inverter circuit INV2, and the inverter circuit DINV2.

[Switching Circuit SC]

The switching circuit SC has a function of selecting one of the terminal outp and the terminal outn as the output destination of the signal input to the terminal inp or the terminal inn in the circuit MPC. The switching circuit SC is electrically connected to the terminal xt and can determine the output destination in accordance with the signal input to the terminal xt (signals $x_1^{(k-1)}$ to $x_m^{(k-1)}$ in FIG. 1(A)).

Figure 3A:
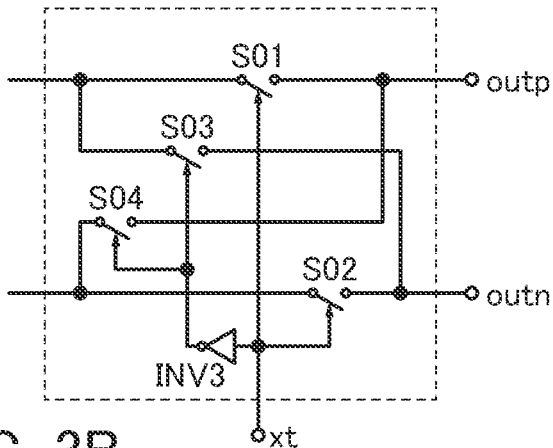
FIGS. 3(A), (B), (C), (D) Circuit diagrams illustrating configuration examples of a circuit included in the semiconductor device.

FIG. 3(A) illustrates a configuration example of the switching circuit SC. The switching circuit SC includes a switch S01 to a switch S04 and an inverter circuit INV3.

A first terminal of the switch S01 is electrically connected to the output terminal of the circuit BF1 and a first terminal of the switch S03, and a second terminal of the switch S01 is electrically connected to the terminal outp. A first terminal of the switch S02 is electrically connected to the output terminal of the circuit BF2 and a first terminal of the switch S04, and a second terminal of the switch S02 is electrically connected to the terminal outn. A second terminal of the switch S03 is electrically connected to the terminal outn, and a second terminal of the switch S04 is electrically connected to the terminal outp. The terminal xt is electrically connected to control terminals of the switch S01 and the switch S02 and an input terminal of the inverter circuit INV3, and an output terminal of the inverter circuit INV3 is electrically connected to control terminals of the switch S03 and the switch S04.

In this specification and the like, each of the switch S01 to the switch S04 is turned on when a high-level potential is applied to the control terminal, and is turned off when a low-level potential is applied to the control terminal.

Next, the operation of the switching circuit SC is described. For example, when a high-level potential is applied to the terminal xt, the switch S01 and the switch S02 are turned on and the switch S03 and the switch S04 are turned off; thus, the switching circuit SC operates such that electrical continuity is established between the output terminal of the circuit BF1 and the terminal outp and electrical continuity is established between the output terminal of the circuit BF2 and the terminal outn. As another example, when a low-level potential is applied to the terminal xt, the switch S03 and the switch S04 are turned on and the switch S01 and the switch S02 are turned off; thus, the switching circuit SC operates such that electrical continuity is established between the output terminal of the circuit BF1 and the terminal outn and electrical continuity is established between the output terminal of the circuit BF2 and the terminal outp.

Figure 3B:
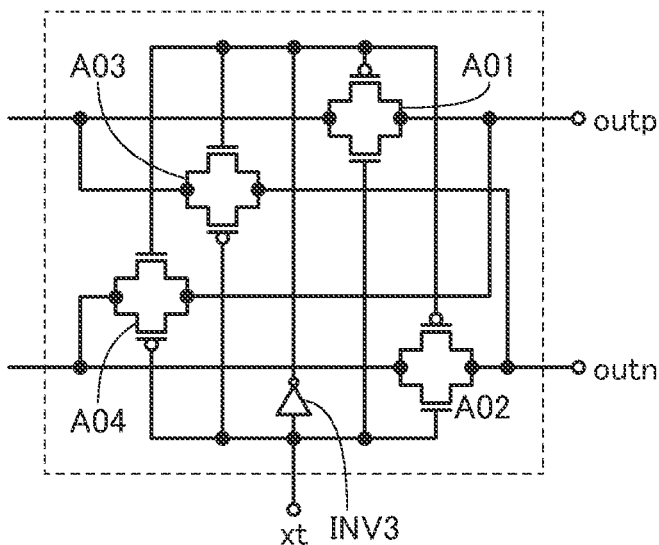

Next, a specific configuration example of the switching circuit SC is described. FIG. 3(B) illustrates a circuit configuration in which the switch S01 to the switch S04 included in the switching circuit SC in FIG. 3(A) are replaced with an analog switch A01 to an analog switch A04.

Figure 3C:
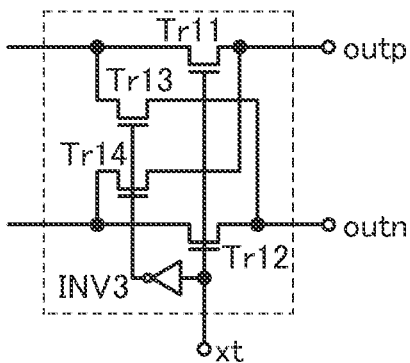

A specific configuration example of the switching circuit SC in FIG. 3(A), which is different from that in FIG. 3(B), is a circuit configuration illustrated in FIG. 3(C). The switching circuit SC in FIG. 3(C) includes a transistor Tr11 to a transistor Tr14 and the inverter circuit INV3. The transistor Tr11 to the transistor Tr14 are n-channel transistors. Note that the control terminals of the switch S01 to the switch S04 correspond to gates of the transistor Tr11 to the transistor Tr14.

A first terminal of the transistor Tr11 is electrically connected to the output terminal of the circuit BF1 and a first terminal of the transistor Tr13, and a second terminal of the transistor Tr11 is electrically connected to the terminal outp. A first terminal of the transistor Tr12 is electrically connected to the output terminal of the circuit BF2 and a first terminal of the transistor Tr14, and a second terminal of the transistor Tr12 is electrically connected to the terminal outn. A second terminal of the transistor Tr13 is electrically connected to the terminal outn, and a second terminal of the transistor Tr14 is electrically connected to the terminal outp. The terminal xt is electrically connected to the gates of the transistor Tr11 to the transistor Tr14. Note that the gates of the transistor Tr13 and the transistor Tr14 are electrically connected to the terminal xt through the inverter circuit INV3.

Figure 3D:
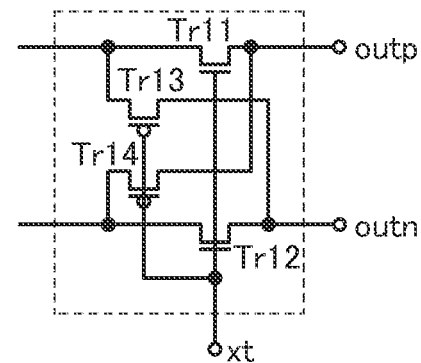

A specific configuration example of the switching circuit SC in FIG. 3(A), which is different from those in FIGS. 3(B) and 3(C), is a circuit configuration illustrated in FIG. 3(D). The switching circuit SC in FIG. 3(D) includes the transistor Tr11 to the transistor Tr14, as in FIG. 3(C). The transistor Tr11 and the transistor Tr12 are n-channel transistors, and the transistor Tr13 and the transistor Tr14 are p-channel transistors. Note that the control terminals of the switch S01 to the switch S04 correspond to the gates of the transistor Tr11 to the transistor Tr14. The switching circuit SC in FIG. 3(D) does not include the inverter circuit INV3 because the polarity of the transistor Tr11 and the transistor Tr12 is different from that of the transistor Tr13 and the transistor Tr14.

When the switching circuit SC has any of the configurations in FIGS. 3(A) to 3(D), each of the signals $x_1^{(k-1)}$ to $x_m^{(k-1)}$ input to the terminal xt can be a signal with a low-level potential or a high-level potential.

The switching circuit SC used in the circuit MPC can be selected from those illustrated in FIGS. 3(A) to 3(D) depending on the circumstances. Alternatively, the switching circuit SC used in the circuit MPC may have a circuit configuration different from those of the switching circuit SC illustrated in FIGS. 3(A) to 3(D).

«Circuit ACTF»

Figure 1C:

FIG. 1(C) illustrates terminals included in the circuit ACTF. The circuit ACTF includes a terminal inpa, a terminal inna, and a terminal outa.

The circuit ACTF has a function of generating a signal on the basis of the order of and/or a time lag between signals input to the terminal inpa and the terminal inna (signals Sp[m] and Sn[m] in FIG. 1(A)), and outputting the signal from the terminal outa. Note that the signal corresponds to $z_j^{(k)}$ in FIGS. 4(A) and 4(B).

For example, the circuit ACTF can be configured to output a low-level potential as a signal from the terminal outa when a signal is input to the terminal inpa after a signal is input to the terminal inna, and output a high-level potential as a signal from the terminal outa when a signal is input to the terminal inpa before a signal is input to the terminal inna. In other words, the circuit ACTF can be configured to output a low-level potential as a signal from the terminal outa when the transition of a potential input to the terminal inpa occurs after the transition of a potential input to the terminal inna, and output a high-level potential as a signal from the terminal outa when the transition of a potential input to the terminal inpa occurs before the transition of a potential input to the terminal inna. At that time, with the signal $z_j^{(k)}$ with a low-level potential corresponding to −1 and a high-level potential corresponding to 1, the circuit ACTF corresponds to a circuit that performs arithmetic operation of the step function.

For example, the circuit ACTF may be a circuit that outputs an analog value such as a sigmoid function or a linear ramp function. Alternatively, the circuit ACTF may have a function of outputting a digital value or an analog value in accordance with a difference in timing between signals input to the terminal inpa and the terminal inna.

That is, the circuit ACTF has a function of performing the arithmetic operation of the activation function of the neuron in the neural network 100.

In the following description of this embodiment, the circuit ACTF is described as a circuit that performs arithmetic operation of a step function.

In this case, a flip-flop circuit can be used as the circuit ACTF, which performs the arithmetic operation of the step function. In such a case, the circuit ACTF reads a signal input to the terminal inpa when the transition of a signal input to the terminal inna occurs, and outputs the signal to the terminal outa.

«Converter Circuit TRF»

The converter circuit TRF in the neural network 100 has a function of appropriately converting the signal $z_1^{(k-1)}$ to the signal $z_m^{(k-1)}$ output from the neuron $N_1^{(k-1)}$ to the neuron $N_m^{(k-1)}$ in the (k−1)-th layer and transmitting the converted signals to the circuit MPC[1] to the circuit MPC[m].

FIG. 1(A) illustrates a state where the signals $z_1^{(k-1)}$ to $z_m^{(k-1)}$ are converted into the signals $x_1^{(k-1)}$ to $x_m^{(k-1)}$, and the signals $x_1^{(k-1)}$ to $x_m^{(k-1)}$ are transmitted to the circuit MPC[1] to the circuit MPC[m].

Since the signals $z_1^{(k-1)}$ to $z_m^{(k-1)}$ each have a value of −1 or 1 as described above and the signals $x_1^{(k-1)}$ to $x_m^{(k-1)}$ can each be the signal with a low-level potential or a high-level as in the description of the switching circuit SC, the converter circuit TRF can be configured as a logic circuit.

Conversion of the signals $z_1^{(k-1)}$ to $z_m^{(k-1)}$ by the converter circuit TRF will be described later.

«Variation Examples of Circuit MPC, Circuit ACTF, Converter Circuit TRF, and the Like»

Figure 5A:
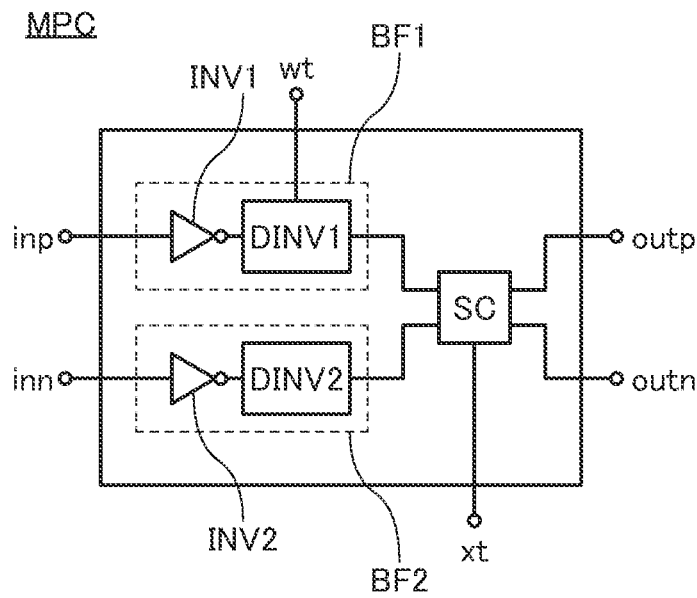
FIGS. 5(A), (B) Block diagrams illustrating configuration examples of a circuit included in a semiconductor device.
Figure 5B:
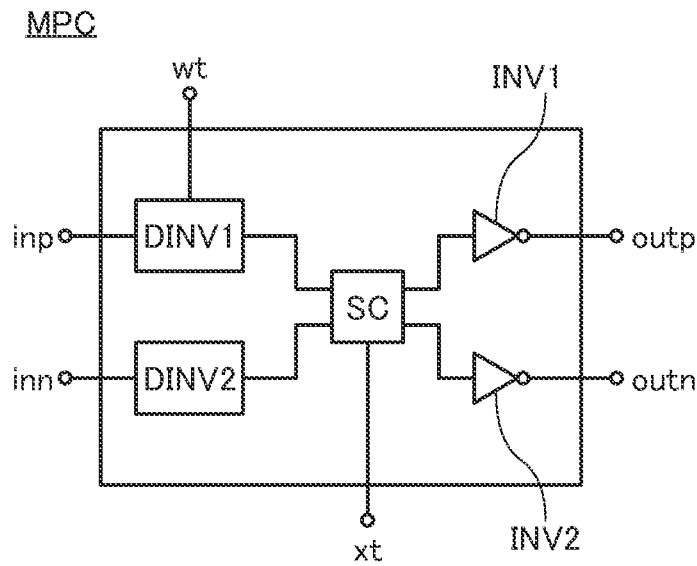

The circuit MPC included in the arithmetic circuit 110 in FIG. 1 is not limited to having the above-described configuration of the circuit MPC, and the circuit configuration of the circuit MPC may be changed depending on the circumstances. For example, as a semiconductor device of one embodiment of the present invention, the circuit MPC can have any of configurations in FIG. 5(A) and FIG. 5(B). The circuit MPC illustrated in FIG. 5(A) has a configuration in which the order of electrical connection between the inverter circuit DINV1 and the inverter circuit INV1 of the circuit BF1 in FIG. 2(A) is changed and the order of electrical connection between the inverter circuit DINV2 and the inverter circuit INV2 of the circuit BF2 in FIG. 2(A) is changed. The circuit MPC illustrated in FIG. 5(B) has a configuration in which the order of electrical connection between the inverter circuit INV1 of the circuit BF1 and the switching circuit SC in FIG. 2(A) is changed and the order of electrical connection between the inverter circuit INV2 and the switching circuit SC in FIG. 2(A) is changed.

The transistors included in the circuit MPC, the circuit ACTF, the converter circuit TRF, and the like are preferably OS transistors. The description of the holding unit HCA has mentioned that an OS transistor is preferably used as the transistor Tr03; OS transistors are also preferably used as the other transistors. Specifically, in the case where OS transistors are used as the other transistors, the OS transistors preferably have a structure described particularly in Embodiment 5. However, one embodiment of the present invention is not limited thereto.

Alternatively, the transistors included in the circuit MPC, the circuit ACTF, the converter circuit TRF, and the like may be a transistor containing silicon in a channel formation region (hereinafter referred to as a Si transistor) instead of the OS transistor. As silicon, hydrogenated amorphous silicon, microcrystalline silicon, or polycrystalline silicon can be used, for example. As transistors other than the OS transistor and the Si transistor, it is possible to use, for example, a transistor containing Ge in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

Note that for the metal oxides in the semiconductor layers of OS transistors, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability. For that reason, in the arithmetic circuit 110, OS transistors may be used as the n-channel transistors included in the circuit MPC, the circuit ACTF, the converter circuit TRF, and the like and Si transistors may be used as the p-channel transistors.

<Operation Method>

An example of an operation method of the arithmetic circuit 110 is described here.

FIG. 6(A) illustrates a configuration example of the circuit MPC[i] described in this operation example. The circuit MPC[i] employs the circuit BF1 illustrated in FIG. 2(B1) as the circuit BF1 and the circuit BF2, and employs the switching circuit SC illustrated in FIG. 3(A) as the switching circuit SC.

Note that "m" is added to the end of the reference numerals of the circuit components of the inverter circuit DINV2 in the circuit BF2 illustrated in FIG. 6(A) in order to distinguish them from the circuit components of the inverter circuit DINV1 in the circuit BF1. Accordingly, in the inverter circuit DINV2, a holding unit HCAm corresponds to the holding unit HCA; a transistor Tr01m corresponds to the transistor Tr01 in the inverter circuit DINV1; a transistor Tr02m corresponds to the transistor Tr02 in the inverter circuit DINV1; a transistor Tr03m corresponds to the transistor Tr03 in the inverter circuit DINV1; a capacitor C01m corresponds to the capacitor C01 in the inverter circuit DINV1; and a wiring SL01m corresponds to the wiring SL01 in the inverter circuit DINV1. A terminal wtm functions as an input terminal for writing a potential to a first terminal of the capacitor C01m.

Figure 6:
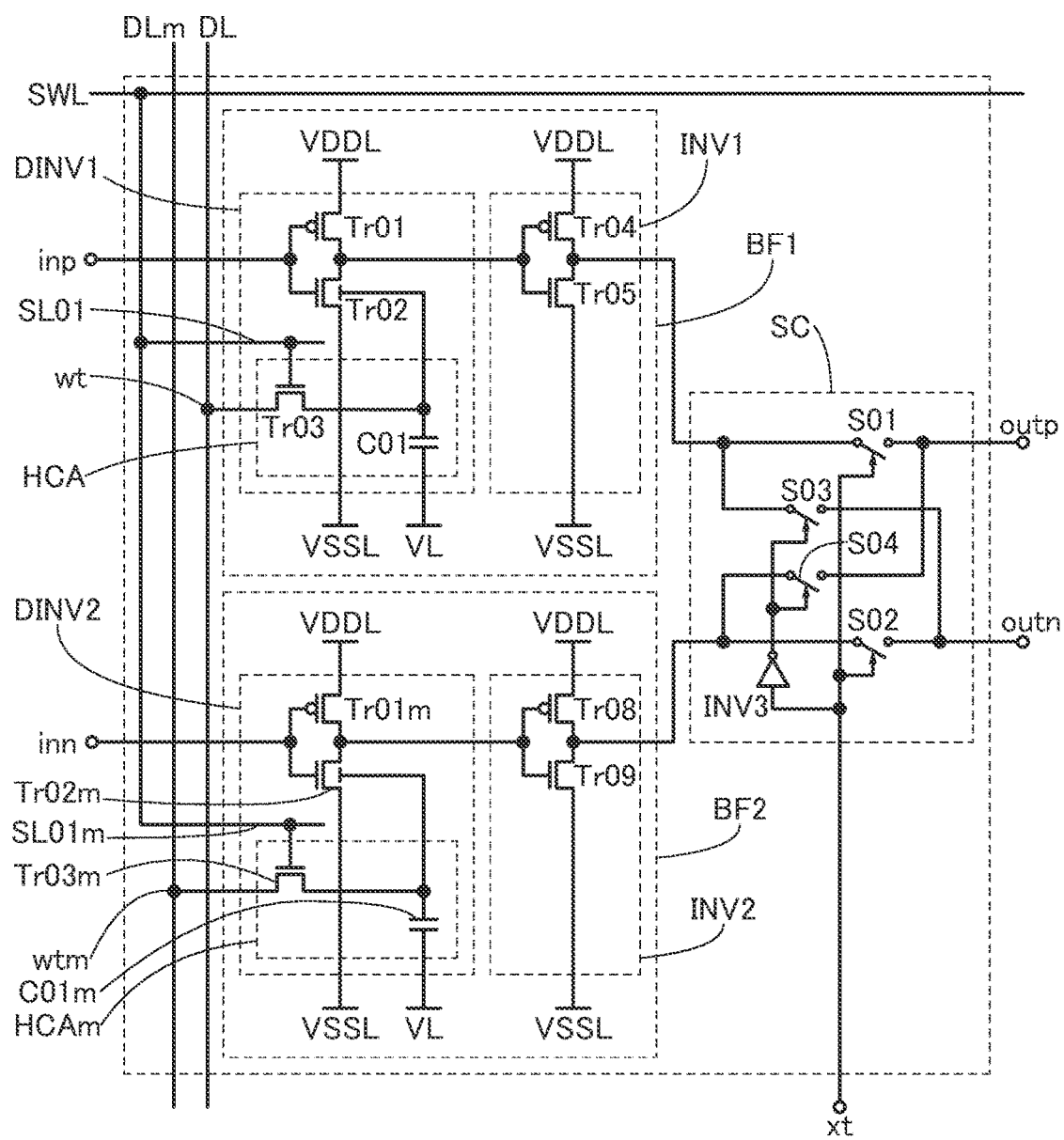
FIG. 6 A circuit diagram illustrating a configuration example of a circuit included in a semiconductor device.

In the circuit MPC illustrated in FIG. 6, the terminal wt in the holding unit HCA of the circuit BF1 is electrically connected to a wiring DL, and the terminal wtm in the holding unit HCAm of the circuit BF2 is electrically connected to a wiring DLm. In addition, in the circuit MPC illustrated in FIG. 6, the wiring SL01 in the circuit BF1 and the wiring SL01m in the circuit BF2 are electrically connected to a wiring SWL.

In this specification and the like, unless otherwise specified, the transistor Tr01 to the transistor Tr05, the transistor Tr01m to the transistor Tr03m, the transistor Tr08, the transistor Tr09, and the transistor Tr11 to the transistor Tr14 in the on state may operate in a linear region in the end. In other words, the gate voltage, the source voltage, and the drain voltage of each of the above transistors may be appropriately biased to voltages in the range where the transistor operates in the linear region.

In this specification and the like, a "low-level potential" and a "high-level potential" do not represent specified potentials, and specific potentials may vary depending on wirings. For example, a low-level potential and a high-level potential corresponding to signals input to or output from the circuit MPC may be different from a low-level potential and a high-level potential applied to the wiring SL01.

《Initial Operation》

In the initial operation, a potential corresponding to the signal $x_i^{(k-1)}$ is input to the terminal xt. Thus, the transistor Tr11 to the transistor Tr14 are turned on or off in response to the potential corresponding to the signal $x_i^{(k-1)}$.

A potential corresponding to the weight coefficient $w_i^{(k-1)}{}_j^{(k)}$ is input to the wiring DL, and an intermediate potential is input to the wiring DLm. After that, a high-level potential is applied to the wiring SWL to turn on the transistor Tr03 and the transistor Tr03m. With this operation, the potential corresponding to the weight coefficient $w_i^{(k-1)}{}_j^{(k)}$ is written to the first terminal of the capacitor C01 and the intermediate potential is written to the first terminal of the capacitor C01m. Thus, the threshold voltage of the transistor Tr02 changes in response to the weight coefficient $w_i^{(k-1)}{}_j^{(k)}$, and the threshold voltage of the transistor Tr02m changes in response to the intermediate potential. Lastly, a low-level potential is applied to the wiring SWL to turn off the transistor Tr03 and the transistor Tr03m, so that the potentials of the first terminal of the capacitor C01 and the first terminal of the capacitor C01m can be held.

《Arithmetic Operation》

After the initial operation, a signal Sp[i-1] and a signal Sn[i-1] are input to the terminal inp and the terminal inn, respectively, of the circuit MPC[i] (here, i is an integer greater than or equal to 1 and less than or equal to m), whereby arithmetic operation starts in the circuit MPC[i]. In particular, when i is 1, signals Sp[0] and Sn[0] are input to the terminal inp and the terminal inn, respectively, of the circuit MPC[1] with little time lag (substantially at the same time). When i is greater than or equal to 2, the signals Sp[i-1] and Sn[i-1] are output from the circuit MPC[i-1]; thus, a time lag therebetween occurs sometimes. In the description of the arithmetic operation, for convenience, the signals Sp[i−1] and Sn[i−1] are input to the terminal inp and the terminal inn of the circuit MPC[i] with little time lag (substantially at the same time).
[Condition 1]

Figure 7A:
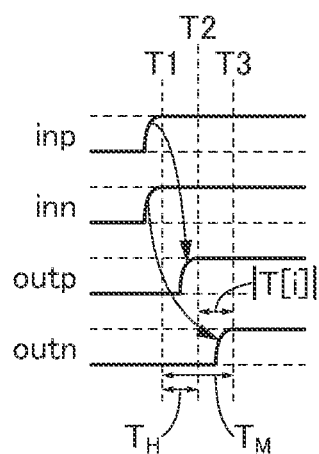
FIGS. 7(A), (B), (C), (D) Timing charts illustrating operation examples of a circuit included in a semiconductor device.

Here, the case where the potential corresponding to the weight coefficient $w_i^{(k-1)}{}_j^{(k)}$ is a high-level potential and the potential corresponding to the signal $x_i^{(k-1)}$ is a high-level potential is considered. FIG. 7(A) is a timing chart showing changes in the potentials of the terminal inp, the terminal inn, the terminal outp, and the terminal outn in this case. First, high-level potentials are applied as the signals Sp[i−1] and Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is applied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is applied as the signal Sn[i−1] to the input terminal of the circuit BF2 in the circuit MPC[i]; thus, the high-level potential is output from the output terminal of the circuit BF2 in the circuit MPC[i]. Note that a high-level potential is applied to the back gate of the transistor Tr02 in the circuit BF1, and an intermediate potential is applied to the back gate of the transistor Tr02m in the circuit BF2; accordingly, the circuit BF1 operates faster than the circuit BF2. Thus, when signals are input to the terminal inp and the terminal inn at the same time, the circuit BF1 outputs an output signal before the circuit BF2.

Since a high-level potential is applied to the terminal xt in the switching circuit SC, electrical continuity is established between the output terminal of the circuit BF1 and the terminal outp and electrical continuity is established between the output terminal of the circuit BF2 and the terminal outn. That is, the output signal of the circuit BF1 is output from the terminal outp, and the output signal of the circuit BF2 is output from the terminal outn.

The output signal of the circuit BF1 is output before the output signal of the circuit BF2; hence, as in FIG. 7(A), the potential of the terminal outp becomes a high-level potential at Time T2, and then, the potential of the terminal outn becomes a high-level potential at Time T3. That is, Sp[i] is output as the output signal from the terminal outp at Time T2, and Sn[i] is output as the output signal from the terminal outn at Time T3. Note that in FIG. 7(A), the input/output time from the input of the signal Sp[i−1] to the terminal inp to the output of the signal Sp[i] from the terminal outp is denoted by $T_H$, and the input/output time from the input of the signal Sn[i−1] to the terminal inn to the output of the signal Sn[i] from the terminal outn is denoted by $T_M$.
[Condition 2]

Figure 7B:
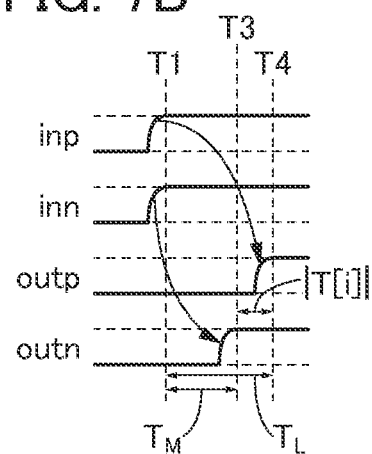

The case where the potential corresponding to the weight coefficient $w_i^{(k-1)}{}_j^{(k)}$ is a low-level potential and the potential corresponding to the signal $x_i^{(k-1)}$ is a high-level potential is considered. FIG. 7(B) is a timing chart showing changes in the potentials of the terminal inp, the terminal inn, the terminal outp, and the terminal outn in this case. As in the case of FIG. 7(A), first, high-level potentials are applied as the signals Sp[i−1] and Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is applied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is applied as the signal Sn[i−1] to the input terminal of the circuit BF2 in the circuit MPC[i]; thus, the high-level potential is output from the output terminal of the circuit BF2 in the circuit MPC[i]. Note that a low-level potential is applied to the back gate of the transistor Tr02 in the circuit BF1, and an intermediate potential is applied to the back gate of the transistor Tr02m in the circuit BF2; accordingly, the circuit BF1 operates slower than the circuit BF2. Consequently, when signals are input to the terminal inp and the terminal inn at the same time, the circuit BF1 outputs an output signal after the circuit BF2.

Since a high-level potential is applied to the terminal xt in the switching circuit SC, electrical continuity is established between the output terminal of the circuit BF1 and the terminal outp and electrical continuity is established between the output terminal of the circuit BF2 and the terminal outn, as in the case of FIG. 7(A). That is, the output signal of the circuit BF1 is output from the terminal outp, and the output signal of the circuit BF2 is output from the terminal outn.

The output signal of the circuit BF1 is output after the output signal of the circuit BF2; thus, as in FIG. 7(B), the potential of the terminal outn becomes a high-level potential at Time T3, and then, the potential of the terminal outp becomes a high-level potential at Time T4. That is, Sn[i] is output as the output signal from the terminal outn at Time T3, and Sp[i] is output as the output signal from the terminal outp at Time T4. Note that in FIG. 7(B), the input/output time from the input of the signal Sp[i−1] to the terminal inp to the output of the signal Sp[i] from the terminal outp is denoted by $T_L$, and the input/output time from the input of the signal Sn[i−1] to the terminal inn to the output of the signal Sn[i] from the terminal outn is denoted by $T_M$.
[Condition 3]

Figure 7C:
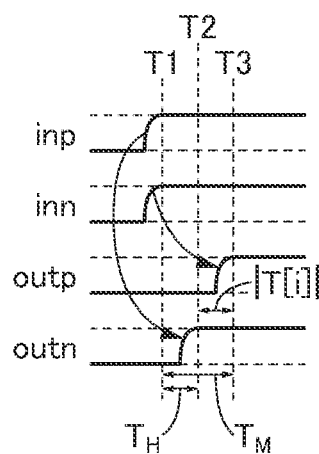

The case where the potential corresponding to the weight coefficient $w_i^{(k-1)}{}_j^{(k)}$ is a high-level potential and the potential corresponding to the signal $x_i^{(k-1)}$ is a low-level potential is considered. FIG. 7(C) is a timing chart showing changes in the potentials of the terminal inp, the terminal inn, the terminal outp, and the terminal outn in this case. As in the case of FIG. 7(A), first, high-level potentials are applied as the signals Sp[i−1] and Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is applied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is applied as the signal Sn[i−1] to the input terminal of the circuit BF2 in the circuit MPC[i]; thus, the high-level potential is output from the output terminal of the circuit BF2 in the circuit MPC[i]. Note that a high-level potential is applied to the back gate of the transistor Tr02 in the circuit BF1, and an intermediate potential is applied to the back gate of the transistor Tr02m in the circuit BF2; accordingly, the circuit BF1 operates faster than the circuit BF2. Thus, when signals are input to the terminal inp and the terminal inn at the same time, the circuit BF1 outputs an output signal before the circuit BF2.

Since a low-level potential is applied to the terminal xt in the switching circuit SC, electrical continuity is established between the output terminal of the circuit BF1 and the terminal outn and electrical continuity is established between the output terminal of the circuit BF2 and the terminal outp. That is, the output signal of the circuit BF1 is output from the terminal outn, and the output signal of the circuit BF2 is output from the terminal outp.

The output signal of the circuit BF1 is output before the output signal of the circuit BF2; thus, as in FIG. 7(C), the potential of the terminal outn becomes a high-level potential at Time T2, and then, the potential of the terminal outp becomes a high-level potential at Time T3. That is, Sn[i] is output as the output signal from the terminal outn at Time T2, and Sp[i] is output as the output signal from the terminal outp at Time T3. Note that in FIG. 7(C), the input/output time from the input of the signal Sp[i−1] to the terminal inp to the output of the signal Sn[i] from the terminal outn is denoted by $T_H$, and the input/output time from the input of the signal Sn[i−1] to the terminal inn to the output of the signal Sp[i] from the terminal outp is denoted by $T_M$.

[Condition 4]

Figure 7D:
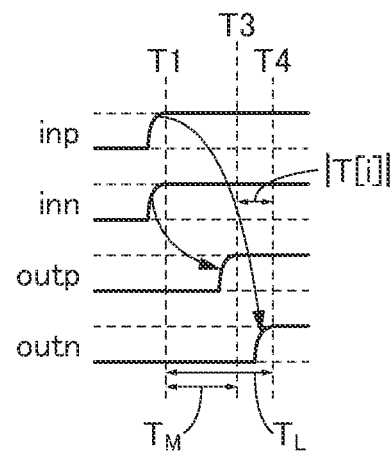

The case where the potential corresponding to the weight coefficient $w_i^{(k-1)}{}_j^{(k)}$ is a low-level potential and the potential corresponding to the signal $x_i^{(k-1)}$ is a low-level potential is considered. FIG. 7(D) is a timing chart showing changes in the potentials of the terminal inp, the terminal inn, the terminal outp, and the terminal outn in this case. As in the case of FIG. 7(A), first, high-level potentials are applied as the signals Sp[i−1] and Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is applied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is applied as the signal Sn[i−1] to the input terminal of the circuit BF2 in the circuit MPC[i]; thus, the high-level potential is output from the output terminal of the circuit BF2 in the circuit MPC[i]. Note that a low-level potential is applied to the back gate of the transistor Tr02 in the circuit BF1, and an intermediate potential is applied to the back gate of the transistor Tr02m in the circuit BF2; accordingly, the circuit BF1 operates slower than the circuit BF2. Consequently, when signals are input to the terminal inp and the terminal inn at the same time, the circuit BF1 outputs an output signal after the circuit BF2.

Since a low-level potential is applied to the terminal xt in the switching circuit SC, electrical continuity is established between the output terminal of the circuit BF1 and the terminal outn and electrical continuity is established between the output terminal of the circuit BF2 and the terminal outp. That is, the output signal of the circuit BF1 is output from the terminal outn, and the output signal of the circuit BF2 is output from the terminal outp.

The output signal of the circuit BF1 is output after the output signal of the circuit BF2; thus, as in FIG. 7(D), the potential of the terminal outp becomes a high-level potential at Time T3, and then, the potential of the terminal outn becomes a high-level potential at Time T4. That is, Sp[i] is output as the output signal from the terminal outp at Time T3, and Sn[i] is output as the output signal from the terminal outn at Time T4. Note that in FIG. 7(D), the input/output time from the input of the signal Sp[i−1] to the terminal inp to the output of the signal Sn[i] from the terminal outn is denoted by $T_L$, and the input/output time from the input of the signal Sn[i−1] to the terminal inn to the output of the signal Sp[i] from the terminal outp is denoted by $T_M$.

In the condition 1 to the condition 4 described above, a time lag between the output of the signal Sp[i] from the terminal outp and the output of the signal Sn[i] from the terminal outn, which is used as the reference, is denoted by T[i] (|T[i]| in FIGS. 7(A) to 7(D)). As in the description of the condition 1 to the condition 4, T[i] is determined by the potential corresponding to the weight coefficient $w_i^{(k-1)}{}_j^{(k)}$ and the potential corresponding to the signal $x_i^{(k-1)}$.

For example, when the potential corresponding to the signal $x_i^{(k-1)}$ is a high-level potential, T[i] becomes smaller as the weight coefficient $w_i^{(k-1)}{}_j^{(k)}$ is larger (as the potential corresponding to the weight coefficient $w_i^{(k-1)}{}_j^{(k)}$ is higher), and T[i] has a negative value with reference to the time when the signal Sn[i] is output from the terminal outn. Meanwhile, T[i] becomes larger as the weight coefficient $w_i^{(k-1)}{}_j^{(k)}$ is smaller (as the potential corresponding to the weight coefficient $w_i^{(k-1)}{}_j^{(k)}$ is lower), and T[i] has a positive value with reference to the time when the signal Sn[i] is output from the terminal outn.

For example, when the potential corresponding to the signal $x_i^{(k-1)}$ is a high-level potential, a difference in the input/output time between the circuit BF1 and the circuit BF2 is output as it is; when the potential corresponding to the signal $x_i^{(k-1)}$ is a low-level potential, a difference in the input/output time between the circuit BF1 and the circuit BF2 in the circuit MPC[i] is multiplied by −1 and then is output. Specifically, when a time lag between the output of the signal Sp[i] from the terminal outp and the output of the signal Sn[i] from the terminal outn, which is used as the reference, under the condition 1 (in the timing chart in FIG. 7(A)) is T[i], a time lag between the output of the signal Sp[i] from the terminal outp and the output of the signal Sn[i] from the terminal outn, which is used as the reference, under the condition 3 (in the timing chart in FIG. 7(C)) is −T[i].

In an actual situation, a delay occurs between the input and the output of a signal in the switching circuit SC; accordingly, the time lag T[i] between the output of the signal Sp[i] from the terminal outp and the output of the signal Sn[i] from the terminal outn as the reference includes the time of the delay. In this embodiment, the description is made without regard to the delay.

As described above, when the signals Sp[i−1] and Sn[i−1] are input to the circuit MPC[i], the circuit MPC[i] provides two signals Sp[i] and Sn[i], which are output from the circuit MPC[i], with the time lag T[i] based on the potential corresponding to the weight coefficient $w_i^{(k-1)}{}_j^{(k)}$ and the potential corresponding to the signal $x_i^{(k-1)}$.

«Arithmetic Operation in the Case Where a Plurality of Circuits MPC Are Connected»

Here, the operation of the arithmetic circuit 110 in the case where them circuits MPC are connected as in FIG. 1(A) is described. In order that the circuit MPC[i] provides the two signals Sp[i] and Sn[i], which are output from the circuit MPC[i], with the time lag T[i] based on the weight coefficient $w_i^{(k-1)}{}_j^{(k)}$ and the signal $x_i^{(k-1)}$, the signals Sp[0] and Sn[0] are concurrently supplied to the circuit MPC[1]; thus, the time lags occurring in each of the circuit MPC[1] to the circuit MPC[m] are accumulated.

When the time lag between the two signals Sp[i−1] and Sn[i−1] output from the circuit MPC[i−1] is T[i−1] and the time lag between the two signals Sp[i] and Sn[i] output from the circuit MPC[i] is T[i], the relation between T[i] and T[i−1] can be expressed by the following formula.

[Formula 4]

$$T[i] = \{T[i-1] + g(w_i^{(k-1)}{}_j^{(k)})\} \cdot x_i^{(k-1)} \tag{1.4}$$

Note that $g(w_i^{(k-1)}{}_j^{(k)})$ is a function for outputting the time lag between the signals output from the circuit BF1 and the circuit BF2 in the circuit MPC[i], using the weight coefficient as a variable. When the delay time in the switching circuit SC is taken into consideration, the term representing the delay time is added to Formula (1.4).

In Formula (1.4), $g(w_i^{(k-1)}{}_j^{(k)})$, the time lag based on the weight coefficient $w_i^{(k-1)}{}_j^{(k)}$ held in the circuit MPC[i], is added to the time lag T[i−1] between the two signals Sp[i−1] and Sn[i−1] output from the circuit MPC[i−1], and the sum is multiplied by the value of the signal $x_i^{(k-1)}$ as the effect of the switching circuit SC.

Note that T[1] is expressed by the following formula.
[Formula 5]

$$T[1] = g(w_1^{(k-1)}{}_j^{(k)}) \cdot x_1^{(k-1)} \qquad (1.5)$$

Here, the recurrence relations of Formula (1.4) and Formula (1.5) are solved to find T[m], resulting in Formula (1.6). Note that Π in Formula (1.6) is a polynomial operator representing the infinite product.

[Formula 6]

$$T[m] = \sum_{i=1}^{m} g(w_i^{(k-1)(k)}{}_j) \cdot \left( \prod_{h=i}^{m} x_h^{(k-1)} \right) \qquad (1.6)$$

Here, replacement of $\Pi x_i^{(k-1)}$ by $z_i^{(k-1)}$ is considered.

[Formula 7]

$$\prod_{h=i}^{m} x_h^{(k-1)} = x_i^{(k-1)} \times \ldots \times x_m^{(k-1)} = z_i^{(k-1)} \qquad (1.7)$$

By replacing $\Pi x_i^{(k-1)}$ with $z_i^{(k-1)}$, T[m] can be expressed by the product-sum of the function $g(w_i^{(k-1)}{}_j^{(k)})$ based on the weight coefficient and the signal $z_i^{(k-1)}$ according to Formula (1.6) and Formula (1.7). That is, Formula (1.2) can be calculated with the arithmetic circuit 110.

Next, the description is made on the relation between $x_i^{(k-1)}$ and $z_i^{(k-1)}$ for replacing $\Pi x_i^{(k-1)}$ with $z_i^{(k-1)}$ and the converter circuit TRF that converts the signals $z_1^{(k-1)}$ to $z_m^{(k-1)}$ into the signals $x_1^{(k-1)}$ to $s_m^{(k-1)}$.

First, $z_{i+1}^{(k-1)}$ is considered. According to Formula (1.7), $z_{i+1}^{(k-1)}$ is expressed by the following formula (note that here, i is an integer greater than or equal to 1 and less than or equal to m−1).
[Formula 8]

$$x_{i+1}^{(k-1)} \times \cdots \times x_m^{(k-1)} = z_{i+1}^{(k-1)} \qquad (1.8)$$

Next, the sides of Formula (1.7) are divided by the sides of Formula (1.8), so that the following formula is obtained.

[Formula 9]

$$x_i^{(k-1)} = \frac{z_i^{(k-1)}}{z_{i+1}^{(k-1)}} \qquad (1.9)$$

When i=m, $x_m^{(k-1)}$ is expressed by the following formula according to Formula (1.7).
[Formula 10]

$$x_m^{(k-1)} = z_m^{(k-1)} \qquad (1.10)$$

When the relations of Formula (1.9) and Formula (1.10) are satisfied, $\Pi x_i^{(k-1)}$ can be replaced with $z_i^{(k-1)}$ in Formula (1.6).

Next, the description is made on the converter circuit TRF that converts the signals $z_1^{(k-1)}$ to $z_m^{(k-1)}$ into the signals $x_1^{(k-1)}$ to $x_m^{(k-1)}$ so that the relations of Formula (1.9) and Formula (1.10) are satisfied.

In Formula (1.9), $z_i^{(k-1)}$ and $z_{i+1}^{(k-1)}$ are signals output from the neuron $N_i^{(k-1)}$ and the neuron $N_{i+1}^{(k-1)}$, respectively, in the (k−1)-th layer. In the arithmetic circuit 110, the activation function of the neuron is the step function with an output of −1 or 1; thus, the signal $x_i^{(k-1)}$ also has a value of −1 or 1. Consequently, $x_i^{(k-1)}$ can be expressed by exclusive NOR of $z_i^{(k-1)}$ and $x_{i+1}^{(k-1)}$.

Figure 8A:
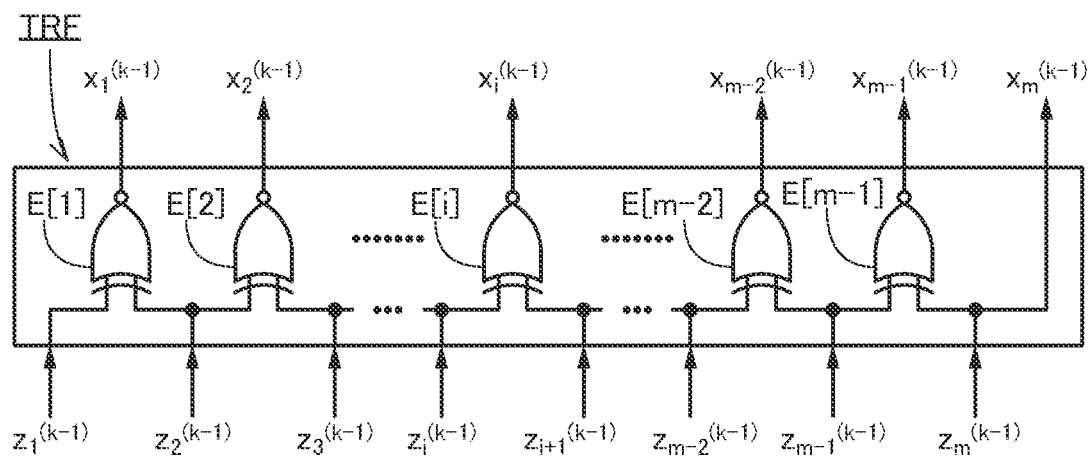
FIGS. 8(A), (B) Circuit diagrams illustrating configuration examples of a circuit included in a semiconductor device.
Figure 8B:
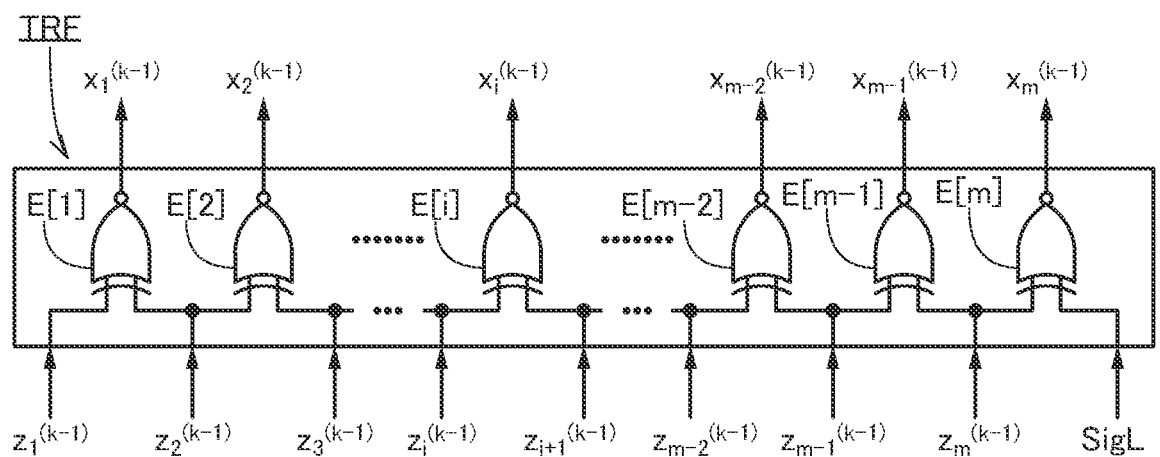

FIGS. 8(A) and 8(B) each illustrate a configuration example of the converter circuit TRF that converts the signals $z_1^{(k-1)}$ to $z_m^{(k-1)}$ into the signals $x_1^{(k-1)}$ to $x_m^{(k-1)}$.

The converter circuit TRF illustrated in FIG. 8(A) includes a coincidence circuit (exclusive NOR circuit) E[1] to a coincidence circuit E[m−1]. Note that FIG. 8(A) illustrates only the coincidence circuit E[1], the coincidence circuit E[2], the coincidence circuit E[i], the coincidence circuit E[m−2], and the coincidence circuit E[m−1], and does not show the other coincidence circuits.

Here, the coincidence circuit E[i] (here, i is an integer greater than or equal to 1 and less than or equal to m−1) is described. The signal $z_i^{(k-1)}$ is input to a first terminal of the coincidence circuit E[i], and the signal $z_{i+1}^{(k-1)}$ is input to a second terminal of the coincidence circuit E[i]. The signal $x_i^{(k-1)}$ is output from an output terminal of the coincidence circuit E[i].

When the signal $z_m^{(k-1)}$ is input, the converter circuit TRF illustrated in FIG. 8(A) outputs the signal $z_m^{(k-1)}$ as it is as the signal $x_m^{(k-1)}$.

With the converter circuit TRF configured as illustrated in FIG. 8(A), the signals $z_1^{(k-1)}$ to $z_m^{(k-1)}$ can be converted into the signals $x_1^{(k-1)}$ to $x_m^{(k-1)}$ so that the relations of Formula (1.9) and Formula (1.10) are satisfied.

Note that the converter circuit TRF included in the arithmetic circuit 110 is not limited to having the circuit configuration illustrated in FIG. 8(A), and the configuration of the converter circuit TRF illustrated in FIG. 8(A) may be changed depending on the circumstances.

For example, the converter circuit TRF illustrated in FIG. 8(B) may be used as the converter circuit TRF included in the arithmetic circuit 110. The converter circuit TRF in FIG. 8(B) has a configuration in which a coincidence circuit E[m] is added to the converter circuit TRF in FIG. 8(A).

Specifically, the signal $z_m^{(k-1)}$ is input to a first terminal of the coincidence circuit E[m], and a signal SigL corresponding to a low-level potential is input to a second terminal of the coincidence circuit E[m]. The signal $x_m^{(k-1)}$ is output from an output terminal of the coincidence circuit E[m]. The converter circuit TRF configured as in FIG. 8(B) can perform operation similar to that of the converter circuit in FIG. 8(A).

Note that this embodiment can be combined with other embodiments in this specification as appropriate.

Embodiment 2

In this embodiment, another configuration example of the arithmetic circuit 110 shown in Embodiment 1 will be described.
<Configuration Example of Arithmetic Circuit 110>

In the arithmetic circuit 110 illustrated in FIG. 1(A), the circuits MPC can be arranged in a matrix, for example. FIG.

9 illustrates a configuration example of such an arithmetic circuit.

An arithmetic circuit 120 includes an array portion ALP where the circuits MPC are arranged in a matrix, a circuit AFP including a plurality of circuits ACTF, a circuit TSG, a circuit WLD, a circuit SWLD, and the converter circuit TRF.

Figure 9:
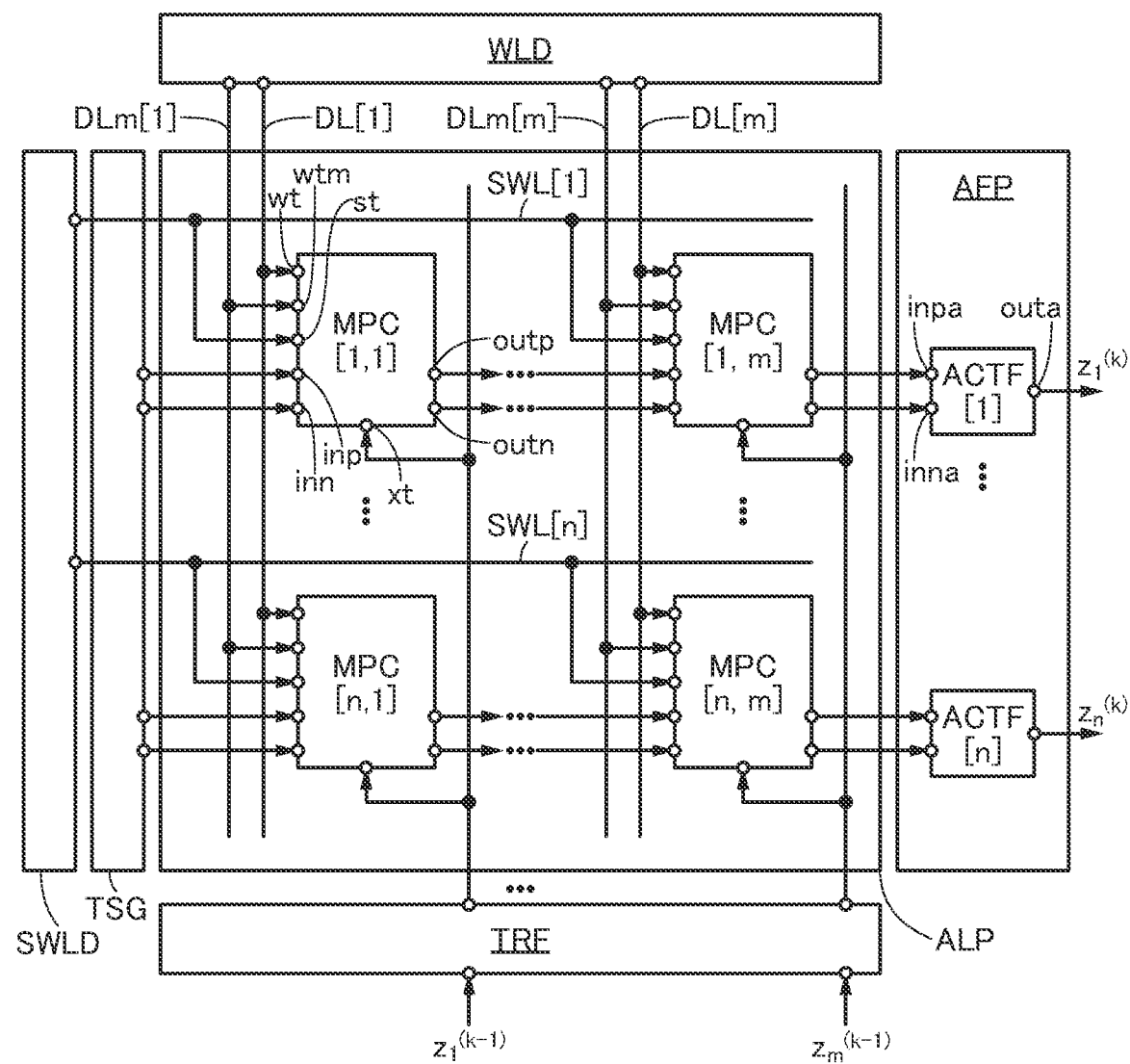
FIG. 9 A block diagram illustrating a structure example of a semiconductor device.

The array portion ALP includes n×m circuits MPC, and the circuits MPC are arranged in a matrix of n rows and m columns in the array portion ALP. Note that in FIG. 9, the circuit MPC in the j-th row and the i-th column (here, j is an integer greater than or equal to 1 and less than or equal to n, and i is an integer greater than or equal to 1 and less than or equal to m) is denoted as a circuit MPC[j,i]. Note that FIG. 9 illustrates only the circuit MPC[1,1], the circuit MPC[1,m], the circuit MPC[n,1], and the circuit MPC[n,m] and does not show the other circuits MPC.

The circuit AFP includes n circuits ACTF, and the circuits ACTF are arranged in one column in the circuit AFP. In FIG. 9, the circuit ACTF in the j-th row is denoted as a circuit ACTF[j]. Note that FIG. 9 illustrates only the circuit ACTF[1] and the circuit ACTF[n] and does not show the other circuits ACTF.

When the j-th row in the array portion ALP and the circuit AFP is focused, in the circuit MPC[j,1] to the circuit MPC[j,m], the terminal outp and the terminal inp are electrically connected to each other and the terminal outn and the terminal inn are electrically connected to each other in the adjacent circuits MPC. The terminal outp and the terminal outn of the circuit MPC[j,m] are electrically connected to the terminal inpa and the terminal inna, respectively, of the circuit ACTF[j]. The terminals xt of the circuit MPC[j,1] to the circuit MPC[j,m] are electrically connected to the converter circuit TRF.

In other words, with a focus on the circuits MPC and the circuit ACTF in one row of the array unit ALP of the arithmetic circuit 120, the circuits MPC and the circuit ACTF in the row can be regarded as the arithmetic circuit 110 illustrated in FIG. 1.

The circuit MPC included in the array portion ALP includes a terminal st in addition to the terminal wt, the terminal wtm, the terminal xt, the terminal inp, the terminal inn, the terminal outp, and the terminal outn described in Embodiment 1. The terminal st is a terminal electrically connected to the wiring SL01 described in Embodiment 1.

The terminals st of the circuit MPC[j,1] to the circuit MPC[j,m] are electrically connected to a wiring SWL[j]. The wiring SWL[j] corresponds to the wiring SWL in Embodiment 1, and FIG. 9 illustrates a wiring SWL[1] and a wiring SWL[n]. The terminals wt of the circuit MPC[1,i] to the circuit MPC[n,i] are electrically connected to a wiring DL[i]. The wiring DL[i] corresponds to the wiring DL in Embodiment 1, and FIG. 9 illustrates a wiring DL[1] and a wiring DL[m]. The terminals wtm of the circuit MPC[1,i] to the circuit MPC[n,i] are electrically connected to a wiring DLm[i]. The wiring DLm[i] corresponds to the wiring DLm in Embodiment 1, and FIG. 9 illustrates a wiring DLm[1] and a wiring DLm[m].

The circuit TSG is a circuit that generates signals to be input to the terminal inp and the terminal inn of each of the circuit MPC[1,1] to the circuit MPC[n,1].

The circuit WLD has a function of supplying potentials corresponding to weight coefficients to the wiring DL[1] to the wiring DL[m] and a function of supplying an intermediate potential to the wiring DLm[1] to the wiring DLm[m].

The circuit SWLD is a circuit for selecting a holding unit for holding the potentials corresponding to the weight coefficients. Specifically, the circuit SWLD has a function of supplying potentials to the gates of the transistors Tr03 and the transistors Tr03m in the holding units HCA and HCAm of the circuit MPC[j,1] to the circuit MPC[j,m] through the wiring SWL[j].

To maintain potentials in the holding unit HCA and the holding unit HCAm of the circuit MPC[j,i], for example, the circuit WLD applies the potentials to be held to the wiring DL[i] and the wiring DLm[i], and the circuit SWLD applies a high-level potential to the wiring SWL[j] to turn on the transistor Tr03 and the transistor Tr03m in the holding unit HCA and the holding unit HCAm, respectively, of the circuit MPC[j,i]; thus, the potentials of the wiring DL[i] and the wiring DLm[i] can be written to the first terminals of the capacitor C01 and the capacitor C01m, respectively. After the potentials are written to the first terminals of the capacitor C01 and the capacitor C01m, the circuit SWLD applies a low-level potential to the wiring SWL[j] to turn off the transistor Tr03 and the transistor Tr03m in the holding unit HCA and the holding unit HCAm, respectively, of the circuit MPC[j,i], so that the potentials written to the holding unit HCA and the holding unit HCAm can be held.

For the converter circuit TRF, refer to the description of the converter circuit TRF in Embodiment 1. Note that FIG. 9 illustrates a state where the signal $z_1^{(k-1)}$ and the signal $z_m^{(k-1)}$ are input to the converter circuit TRF. The output signals $x_1^{(k-1)}$ to $x_m^{(k-1)}$ that have been converted from the signals $z_1^{(k-1)}$ to $z_m^{(k-1)}$ input to the converter circuit TRF are transmitted to the circuits MPC included in the array portion ALP. In particular, the signal $x_i^{(k-1)}$ is transmitted to the terminals xt of the circuit MPC[1,i] to the circuit MPC[n,i].

With the arithmetic circuit 120 illustrated in FIG. 9, a plurality of arithmetic operations can be performed concurrently. Although Embodiment 1 describes the arithmetic circuit 110 in FIG. 1 as a circuit for obtaining the signal $z_j^{(k)}$ output from the neuron $N_j^{(k)}$ in FIG. 4(B), the use of the arithmetic circuit 120 in FIG. 9 makes it possible to concurrently obtain the signal $z_1^{(k)}$ to the signal $z_n^{(k)}$ output from the neuron $N_1^{(k)}$ to the neuron $N_n^{(k)}$.

Specifically, all the signals $z_1^{(k-1)}$ to $z_m^{(k-1)}$ output from the neuron $N_1^{(k-1)}$ to the neuron $N_m^{(k-1)}$ in the (k−1)-th layer are input to each of the neuron $N_1^{(k)}$ to the neuron $N_n^{(k)}$ in the k-th layer. This corresponds to the transmission of the signals $x_1^{(k-1)}$ to $x_m^{(k-1)}$ output from the converter circuit TRF, to the circuits MPC included in the array portion ALP. Then, the potential corresponding to the weight coefficient between the neuron $N_i^{(k-1)}$ in the (k−1)-th layer and the neuron $N_j^{(k)}$ in the k-th layer is held in the holding unit HCA of the circuit MPC[j,i], whereby the signal $z_j^{(k)}$ output from the neuron $N_j^{(k)}$ in the k-th layer can be output from the circuit ACTF[j]. Note that FIG. 9 illustrates a state where the signal $z_1^{(k)}$ is output from the circuit ACTF[1] and the signal $z_n^{(k)}$ is output from the circuit ACTF[n].

Note that the semiconductor device of one embodiment of the present invention is not limited to the arithmetic circuit 120 illustrated in FIG. 9. The arithmetic circuit 120 illustrated in FIG. 9 has a configuration where the circuits MPC[i] in FIG. 6 are arranged in a matrix; alternatively, an arithmetic circuit can be configured by arranging the circuits MPC[i] in FIG. 10 in a matrix. The circuit MPC[i] in FIG. 10 differs from the circuit MPC[i] in FIG. 6 in that the terminal wt in the holding unit HCA of the circuit BF1 and the terminal wtm in the holding unit HCAm of the circuit BF2 are electrically connected to the wiring DL, the wiring SL01 in the circuit BF1 is electrically connected to the wiring SWL, and the wiring SL01m in the circuit BF2 is electrically connected to a wiring SWLm.

Figure 10:
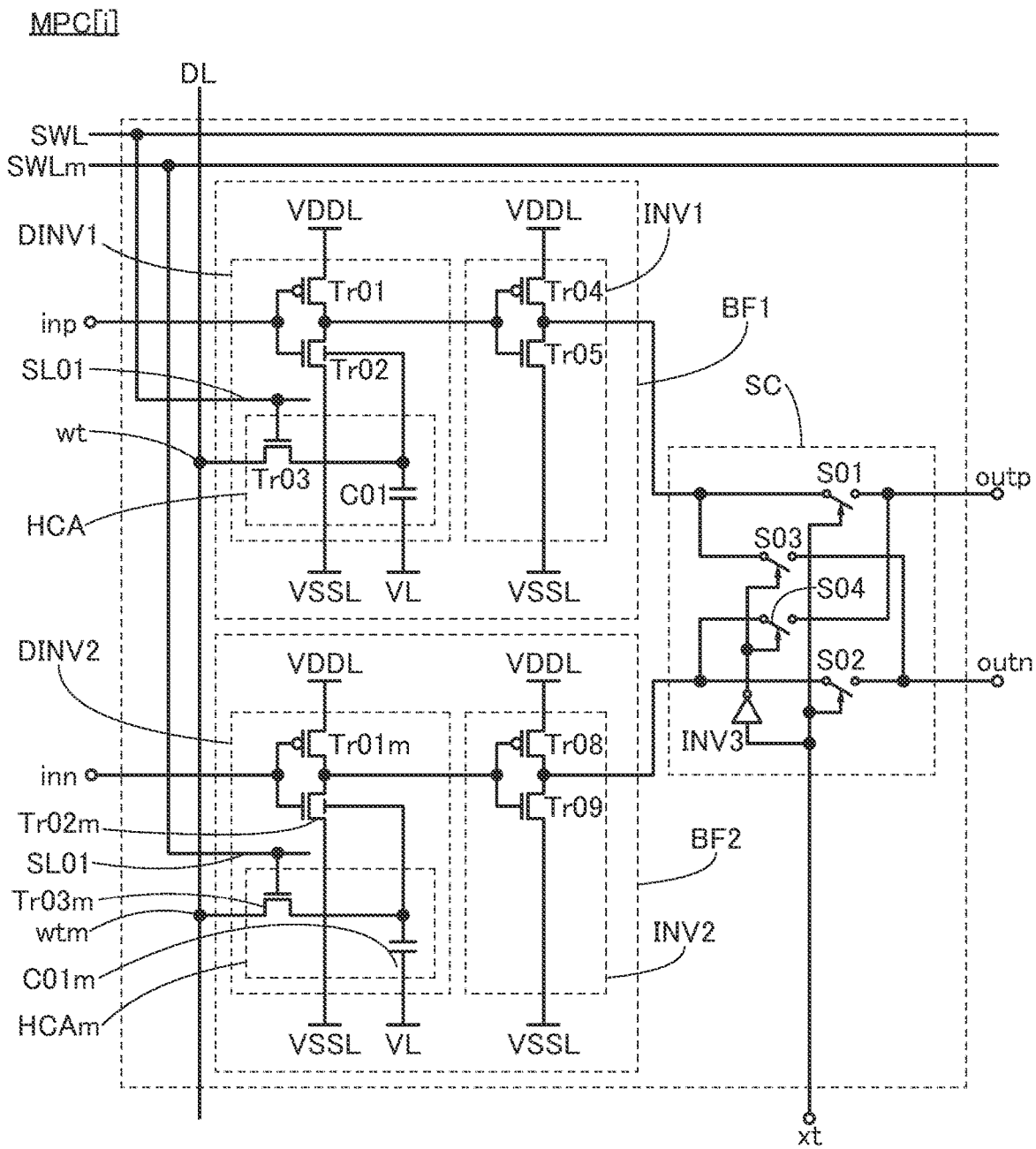
FIG. 10 A circuit diagram illustrating a configuration example of a circuit included in a semiconductor device.
Figure 11:
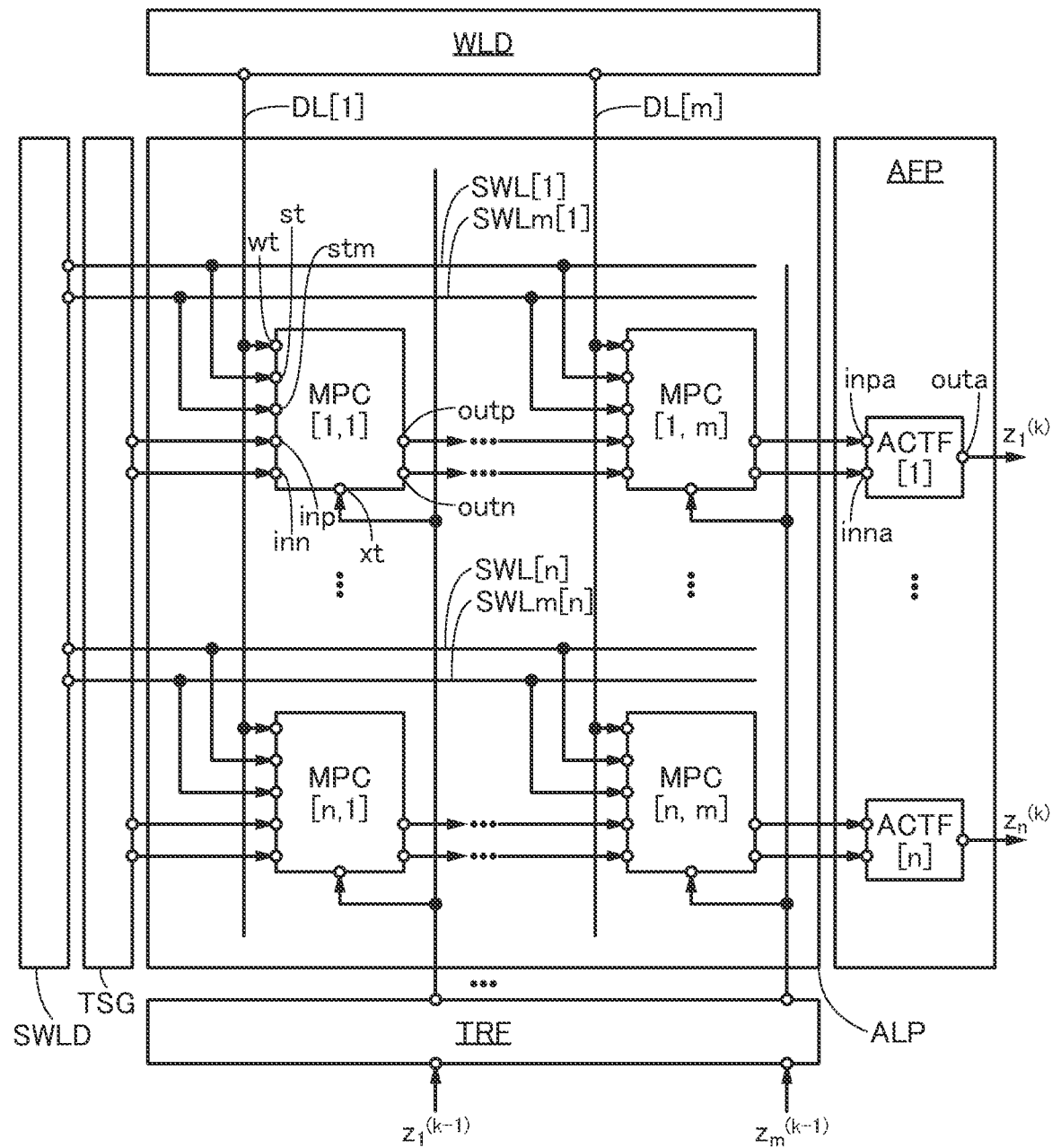
FIG. 11 A block diagram illustrating a structure example of a semiconductor device.

FIG. 11 illustrates an example of an arithmetic circuit in which the circuits MPC[i] in FIG. 10 are arranged in an n×m matrix as in the arithmetic circuit 120 in FIG. 9. An arithmetic circuit 130 illustrated in FIG. 11 is different from the arithmetic circuit 120 in FIG. 9 in some terminals of the circuit MPC and wirings connected to those terminals.

The circuit MPC in the array portion ALP includes the terminal st and a terminal stm in addition to the terminal wt, the terminal wtm, the terminal xt, the terminal inp, the terminal inn, the terminal outp, and the terminal outn illustrated in FIG. 10. The terminal st is a terminal electrically connected to the wiring SL01 in the circuit BF1, and the terminal stm is a terminal electrically connected to the wiring SL01m in the circuit BF2. Since the terminal wt and the terminal wtm are electrically connected to each other in FIG. 10, the terminal wtm is not illustrated in FIG. 11 and the terminal wtm and the terminal wt are regarded as one terminal in the following description.

The terminals st of the circuit MPC[j,1] to the circuit MPC[j,m] are electrically connected to the wiring SWL[j]. The wiring SWL[j] corresponds to the wiring SWL in FIG. 10, and FIG. 11 illustrates the wiring SWL[1] and the wiring SWL[n]. The terminals stm of the circuit MPC[j,1] to the circuit MPC[j,m] are electrically connected to a wiring SWLm[j]. The wiring SWLm[j] corresponds to the wiring SWLm in FIG. 10, and FIG. 11 illustrates a wiring SWLm[1] and a wiring SWLm[n]. The terminals wt of the circuit MPC[1,i] to the circuit MPC[n,i] are electrically connected to the wiring DL[i]. The wiring DL[i] corresponds to the wiring DL in FIG. 10, and FIG. 11 illustrates the wiring DL[1] and the wiring DL[m].

In other words, in the arithmetic circuit 120, the potentials to be held in the two holding units HCA in the circuit MPC are input from different wirings, and the on state and off state of the transistor Tr03 and the transistor Tr03m are switched with one wiring; whereas in the arithmetic circuit 130, the potentials to be held in the two holding units HCA in the circuit MPC are input from one wiring, and the on state and off state of the transistor Tr03 and the transistor Tr03m are switched with different wirings.

Note that this embodiment can be combined with other embodiments in this specification as appropriate.

Embodiment 3

In this embodiment, other configuration examples of the inverter circuit DINV1 and the inverter circuit DINV2 will be described.

Note that although FIGS. 12(A1), 12(A2), 12(B), 12(C), and 12(D) and FIGS. 13(A), 13(B), 13(C), 13(D), 13(E), and 13(F) used for describing this embodiment illustrate the inverter circuit DINV1, the inverter circuit DINV2 can be a circuit similar to the inverter circuit DINV1. Since a circuit similar to the inverter circuit DINV1 can be used as the inverter circuit DINV2 as described above, the circuit BF2 can employ a circuit configuration similar to that of the circuit BF1.

CONFIGURATION EXAMPLE 1

The inverter circuit DINV1 illustrated in FIG. 12(A1) is a circuit obtained by changing the configuration of the inverter circuit DINV1 in the circuit BF1 illustrated in FIG. 2(B1).

The inverter circuit DINV1 illustrated in FIG. 12(A1) has a configuration in which the transistor Tr04 is added to the inverter circuit DINV1 in FIG. 2(B1). Note that the transistor Tr04 is a transistor including a back gate. Unlike in the inverter circuit DINV1 in FIG. 2(B1), the transistor Tr02 does not have a back gate and thus is not electrically connected to the first terminal of the capacitor C01.

The first terminal of the transistor Tr04 is electrically connected to the second terminal of the transistor Tr02, the second terminal of the transistor Tr04 is electrically connected to the wiring VSSL, the gate of the transistor Tr04 is electrically connected to the terminal inp, and the back gate of the transistor Tr04 is electrically connected to the first terminal of the capacitor C01 and the first terminal of the transistor Tr03.

In other words, the inverter circuit DINV1 in FIG. 12(A1) has a configuration similar to that of the inverter circuit INV1 including the transistor Tr01 and the transistor Tr02 illustrated in FIG. 2(B1), and is configured so that a low-level potential is input through the transistor Tr04. The driving speed of the inverter circuit DINV1 in FIG. 12(A1) can be determined in accordance with a potential supplied to the back gate of the transistor Tr04. The potential of the back gate of the transistor Tr04 can be held by the transistor Tr03 and the capacitor C01, as in the inverter circuit DINV1 in FIG. 2(B1).

Note that one embodiment of the present invention is not limited to the inverter circuit DINV1 illustrated in FIG. 12(A1), and the circuit configuration may be changed depending on circumstances. For example, the inverter circuit DINV1 illustrated in FIG. 12(A2) has a configuration in which the connection of the transistor Tr04 in the inverter circuit DINV1 in FIG. 12(A1) is changed. Specifically, the first terminal of the transistor Tr04 is electrically connected to the wiring VDDL, and the second terminal of the transistor Tr04 is electrically connected to the first terminal of the transistor Tr01. In the inverter circuit DINV1 in FIG. 12(A2), as in the inverter circuit DINV1 in FIG. 12(A1), the potential of the back gate of the transistor Tr04 can be held by the transistor Tr03 and the capacitor C01, and the driving speed of the inverter circuit DINV1 can be determined in accordance with the potential of the back gate of the transistor Tr04.

CONFIGURATION EXAMPLE 2

The inverter circuit DINV1 illustrated in FIG. 12(B) has a configuration in which the holding unit HCA of the inverter circuit DINV1 illustrated in FIG. 2(B1) is changed to a holding unit HCB.

The holding unit HCB includes an inverter circuit SINV1 and an inverter circuit SINV2. An input terminal of the inverter circuit SINV1 is electrically connected to the terminal wt, an output terminal of the inverter circuit SINV2, and the back gate of the transistor Tr02; and an output terminal of the inverter circuit SINV1 is electrically connected to an input terminal of the inverter circuit SINV2.

High power supply potential input terminals of the inverter circuit SINV1 and the inverter circuit SINV2 are electrically connected to a wiring VSS1L, and low power supply potential input terminals of the inverter circuit SINV1 and the inverter circuit SINV2 are electrically connected to a wiring VSS2L.

The wiring VSS1L functions as a voltage line for supplying a voltage VSS1. The wiring VSS2L functions as a voltage line for supplying a potential VSS2 that is lower than the voltage VSS1. Note that the voltage VSS1 can have a value less than or equal to that of the voltage VSS, for example.

The holding unit HCB has an inverter loop formed of the inverter circuit SINV1 and the inverter circuit SINV2, as illustrated in FIG. 12(B); hence, the potential of the back gate of the transistor Tr02 can be held as one of VSS1 and VSS2 in accordance with a potential based on a signal input to the terminal wt.

That is, the holding unit HCB of the inverter circuit DINV1 illustrated in FIG. 12(B) can hold binary data as a weight coefficient. Therefore, in the case where the circuit BF1 illustrated in FIG. 12(B) is used as the circuit BF1 included in the circuit MPC, a weight coefficient input to the terminal wt is preferably binary data.

Accordingly, a potential supplied to the back gate of the transistor Tr02 is one of VSS1 and VSS2, leading to two driving speeds of the inverter circuit DINV1 in FIG. 12(B). Specifically, when the potential supplied to the back gate of the transistor Tr02 is VSS1, the driving speed of the inverter circuit DINV1 becomes higher than when the potential supplied to the back gate of the transistor Tr02 is VSS2.

CONFIGURATION EXAMPLE 3

The inverter circuit DINV1 illustrated in FIG. 12(C) is a circuit obtained by changing the configuration of the inverter circuit DINV1 in the circuit BF1 illustrated in FIG. 2(B1). Specifically, the inverter circuit DINV1 illustrated in FIG. 12(C) includes, as the transistor Tr01, a transistor Tr01p including a back gate. As the transistor Tr01p, a p-channel transistor with an SOI (Silicon On Insulator) structure can be used, for example. Moreover, the transistor Tr02 does not necessarily have a back gate.

The back gate of the transistor Tr01p is electrically connected to the first terminal of the capacitor C01 and the first terminal of the transistor Tr03. With such a structure, the inverter circuit DINV1 in FIG. 12(C) can change the input/output time, like the inverter circuit DINV1 in FIG. 2(B1).

CONFIGURATION EXAMPLE 4

The inverter circuit DINV1 illustrated in FIG. 12(D) is a circuit obtained by changing the configuration of the inverter circuit DINV1 in the circuit BF1 illustrated in FIG. 2(B1). Specifically, the inverter circuit DINV1 illustrated in FIG. 12(D) does not include the transistor Tr01 and includes a load element LE, the transistor Tr02, the transistor Tr03, and the capacitor C01.

A first terminal of the load element LE is electrically connected to the wiring VDDL, and a second terminal of the load element LE is electrically connected to the first terminal of the transistor Tr02 and the input terminal of the inverter circuit INV1. For the other connection structures, the description of the connection structures of the inverter circuit DINV1 in FIG. 2(B1) is referred to.

As the load element LE, a resistor can be used, for example. In the inverter circuit DINV1 illustrated in FIG. 13(A), a resistor R01 is used as the load element LE.

As the load element LE, a diode can be used, for example. In the inverter circuit DINV1 illustrated in FIG. 13(B), a diode D01 is used as the load element LE.

As the load element, an n-channel transistor, which is the same as the transistor Tr02, can be used, for example. In the inverter circuit DINV1 illustrated in FIG. 13(C), a transistor Tr15 that has a gate and a first terminal electrically connected to each other (that is diode-connected) is used as the load element LE.

Figure 13A:
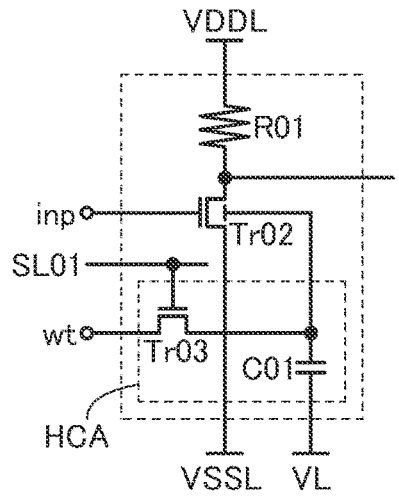
FIGS. 13(A), (B), (C), (D), (E), (F) Circuit diagrams illustrating configuration examples of a circuit included in a semiconductor device.
Figure 13B:
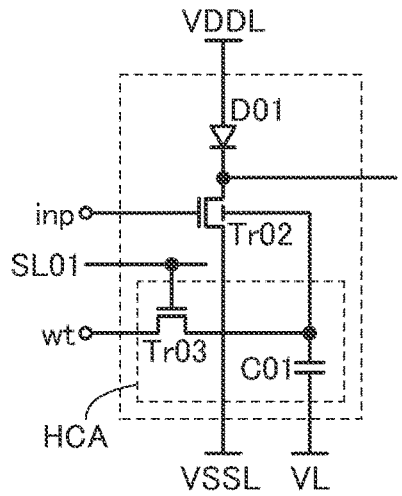
Figure 13C:
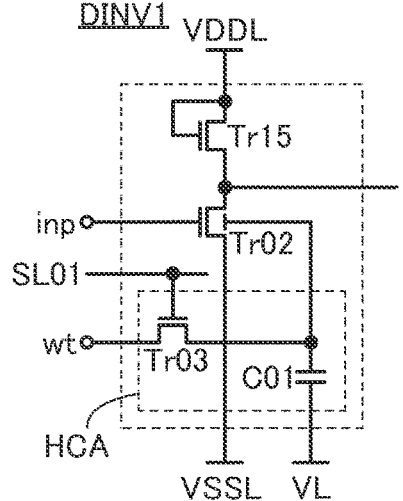
Figure 13D:
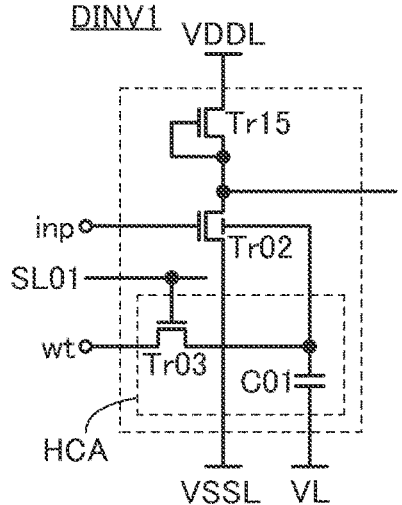
Figure 13E:
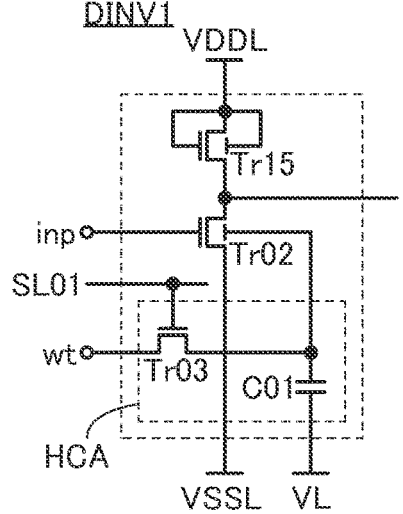
Figure 13F:
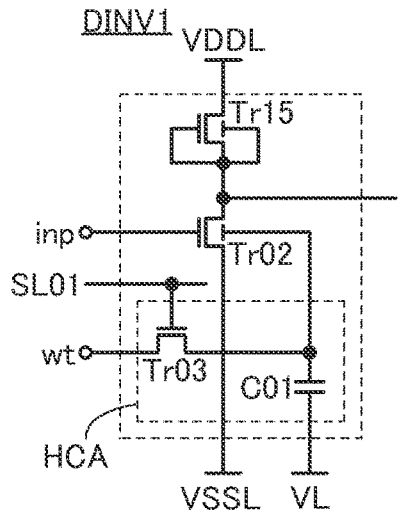

In the inverter circuit DINV1 illustrated in FIG. 13(D), the transistor Tr15 that has a gate and a second terminal electrically connected to each other is used as the load element LE.

In FIGS. 13(C) and 13(D), the transistor Tr15 used as the load element LE may be a transistor including a back gate. Furthermore, the use of a transistor having a gate and a back gate electrically connected to each other can increase the on-state current of the transistor. In each of FIGS. 13(E) and 13(F), the transistor Tr05 illustrated in FIG. 13(C) or 13(D) is provided with a back gate, and the gate and the back gate of the transistor Tr15 are electrically connected to each other.

CONFIGURATION EXAMPLE 5

Figure 14A:
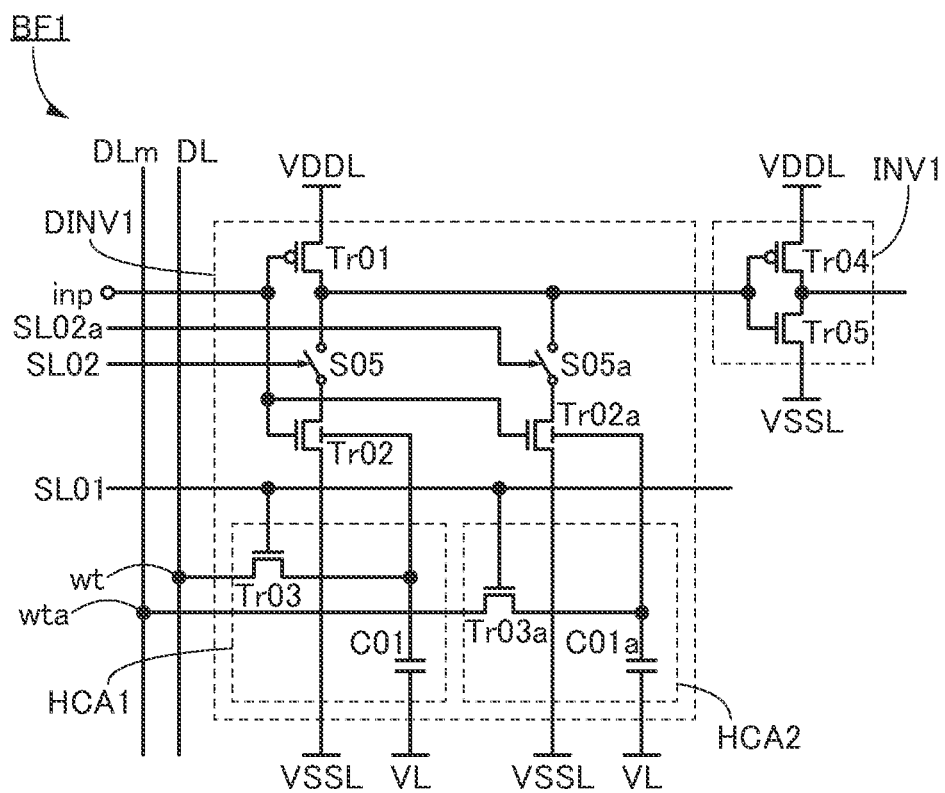
FIGS. 14(A), (B) Circuit diagrams illustrating configuration examples of a circuit included in a semiconductor device.

The circuit BF1 illustrated in FIG. 14(A) is a circuit obtained by changing the configuration of the inverter circuit DINV1 in the circuit BF1 illustrated in FIG. 2(B1). Specifically, the inverter circuit DINV1 illustrated in FIG. 14(A) has a circuit configuration in which a holding unit HCA1 and a holding unit HCA2 are included as the holding unit HCA of the circuit BF1 in FIG. 2(B1).

The circuit BF1 in FIG. 14(A) includes a transistor Tr02a, a switch S05, and a switch S05a in addition to the circuit components included in the circuit BF1 in FIG. 2(B1). Specifically, the transistor Tr02a is a transistor including a back gate. The holding unit HCA1 and the holding unit HCA2 have a circuit configuration similar to that of the holding unit HCA of the circuit BF1 in FIG. 2(B1). Note that in FIG. 14(A), the transistor Tr03 and the capacitor C01 are shown in the holding unit HCA1, whereas a transistor Tr03a and a capacitor C01a are shown in the holding unit HCA2 to distinguish them from the circuit components of the holding unit HCA1.

The switch S05 is electrically connected between the second terminal of the transistor Tr01 and the first terminal of the transistor Tr02 in the circuit BF1 in FIG. 2(B1). Specifically, the second terminal of the transistor Tr01 is electrically connected to a first terminal of the switch S05 and the input terminal of the inverter circuit INV1, and the first terminal of the transistor Tr02 is electrically connected to a second terminal of the switch S05. A control terminal of the switch S05 is electrically connected to a wiring SL02.

A first terminal of the switch S05a is electrically connected to the second terminal of the transistor Tr01 and the input terminal of the inverter circuit INV1, a second terminal of the switch S05a is electrically connected to a first terminal of the transistor Tr02a, and a control terminal of the switch S05a is electrically connected to a wiring SL02a. A second terminal of the transistor Tr02a is electrically connected to the wiring VSSL, and a gate of the transistor Tr02a is electrically connected to the terminal inp, the gate of the transistor Tr01, and the gate of the transistor Tr02. The back gate of the transistor Tr02a is electrically connected to a first terminal of the transistor Tr03a and a first terminal of the capacitor C01a included in the holding unit HCA2. A second terminal of the transistor Tr03a is electrically connected to a terminal wta, a gate of the transistor Tr03a is electrically connected to the wiring SL01, and a second terminal of the capacitor C01a is electrically connected to the wiring VL.

As described above, the gate of the transistor Tr03a is electrically connected to the wiring SL01, like the gate of the transistor Tr03. Thus, switching of the transistor Tr03 and the transistor Tr03a is controlled by the wiring SL01. In this case, switching of the transistor Tr03 and the transistor Tr03a is concurrently controlled; hence, the terminal wt and the terminal wta to which potentials to be held in the holding unit HCA1 and the holding unit HCA2 are input need to be connected to different wirings. Accordingly, in the circuit BF1 in FIG. 14(A), the terminal wt is electrically connected to the wiring DL, and the terminal wta is electrically connected to the wiring DLm.

The switch S05 can be turned on or off by application of a potential from the wiring SL02 to the control terminal of the switch S05. Similarly, the switch S05a can be turned on or off by application of a potential from the wiring SL02a to the gate of the switch S05a.

The transistor Tr03a functions as a switching element like the transistor Tr03, and the transistor Tr03a can be turned on or off by application of a potential from the wiring SL01a to the gate of the transistor Tr03a.

A potential corresponding to a weight coefficient is input to the terminal wta, as in the case with the terminal wt. That is, like the holding unit HCA, the holding unit HCA1 and the holding unit HCA2 can each hold a potential corresponding to a correspondent weight coefficient. That is, the circuit BF1 in FIG. 14(A) can hold potentials corresponding to two weight coefficients.

When the circuit BF1 in FIG. 14(A) is used as the circuits BF1 included in all the circuits MPC in the arithmetic circuit 110, the weight coefficients can be switched to perform arithmetic operation. For example, in the circuits BF1 included in the circuit MPC[1] to the circuit MPC[m] of the arithmetic circuit 110, potentials corresponding to weight coefficients $w_1^{(k-1)(k)}_j$ to $w_m^{(k-1)(k)}_j$ are held in the holding units HCA1, potentials corresponding to weight coefficients $w_1^{(k-1)(k)}_h$ to $w_m^{(k-1)(k)}_h$ (h is an integer greater than or equal to 1 and less than or equal to n, and not j) are held in the holding units HCA2, and the signals $x_1^{(k-1)}$ to $x_m^{(k-1)}$ corresponding to the signals $z_1^{(k-1)}$ to $z_m^{(k-1)}$ are input to the terminals xt. At this time, a high-level potential is applied to the wiring SL02 to turn on the switch S05 and a low-level potential is applied to the wiring SL02a to turn off the switch S05a, so that the arithmetic circuit 110 can perform the product-sum operation of the weight coefficients $w_1^{(k-1)(k)}_j$ to $w_m^{(k-1)(k)}_j$ and the signals $z_1^{(k-1)}$ to $z_m^{(k-1)}$ and the arithmetic operation of the activation function. In addition, a low-level potential is applied to the wiring SL02 to turn off the switch S05 and a high-level potential is applied to the wiring SL02a to turn on the switch S05a, so that the arithmetic circuit 110 can perform the product-sum operation of the weight coefficients $w_1^{(k-1)(k)}_h$ to $w_m^{(k-1)(k)}_h$ and the signals $z_1^{(k-1)}$ to $z_m^{(k-1)}$ and the arithmetic operation of the activation function.

When the circuit BF1 in FIG. 14(A) is used as the circuits BF1 included in all the circuits MPC in the arithmetic circuit 110, the weight coefficients can be switched and thus arithmetic operation for each weight coefficient can be performed. Although the holding unit HCA1 and the holding unit HCA2 are shown as the holding unit HCA in the circuit BF1 in FIG. 14(A), the inverter circuit DINV1 may include three or more holding units. In the case where the weight coefficient used in the neural network is one bit (binary), for example, a high-level potential is held in the holding unit HCA1 and a low-level potential is held in the holding unit HCA2 so that the arithmetic operation can be performed while the weight coefficients are switched depending on the conditions.

Figure 14B:
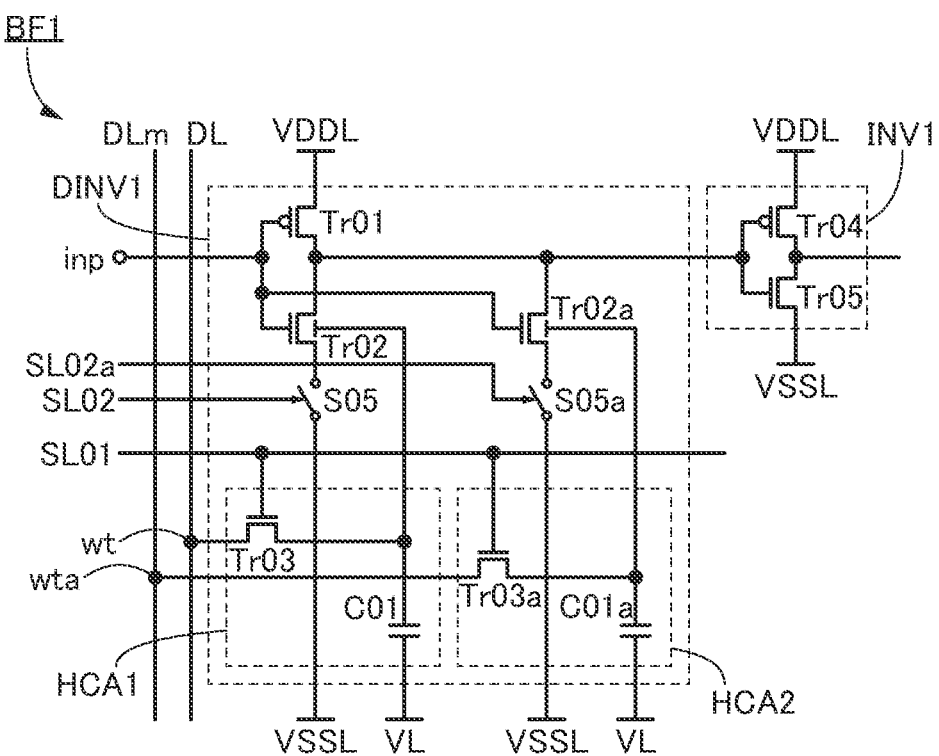

The locations where the switch S05 and the switch S05a for switching weight coefficients are provided are not limited to those in the configuration of the circuit BF1 in FIG. 14(A). For example, as in the circuit BF1 illustrated in FIG. 14(B), the locations where the switch S05 and the switch S05a are provided can be different from the positions in FIG. 14(A). In the circuit BF1 in FIG. 14(B), the switch S05 is provided between the second terminal of the transistor Tr02 and the wiring VSSL, and the switch S05a is provided between the second terminal of the transistor Tr02a and the wiring VSSL. Such a structure enables the circuit BF1 in FIG. 14(B) to operate similarly to the circuit BF1 in FIG. 14(A).

Note that the circuits included in the semiconductor device according to one embodiment of the present invention are not limited to having the circuit configuration illustrated in any of FIGS. 12(A1), 12(A2), 12(B), 12(C), and 12(D), FIGS. 13(A) to 13(F), and FIGS. 14(A) and 14(B), and depending on circumstances, may have a configuration in which the circuit illustrated in any of FIGS. 12(A1), 12(A2), 12(B), 12(C), and 12(D), FIGS. 13(A) to 13(F), and FIGS. 14(A) and 14(B) is changed. Moreover, the circuits included in the semiconductor device according to one embodiment of the present invention may have a configuration in which the circuits illustrated in FIGS. 12(A1), 12(A2), 12(B), 12(C), and 12(D), FIGS. 13(A) to 13(F), and FIGS. 14(A) and 14(B) are combined.

Note that this embodiment can be combined with other embodiments in this specification as appropriate.

Embodiment 4

This embodiment will describe configuration examples of the inverter circuit DINV1 (the inverter circuit DINV2) capable of correcting the threshold voltage of the transistor Tr01 and/or the transistor Tr02 in the circuit MPC described in the foregoing embodiment.

Figure 15A:
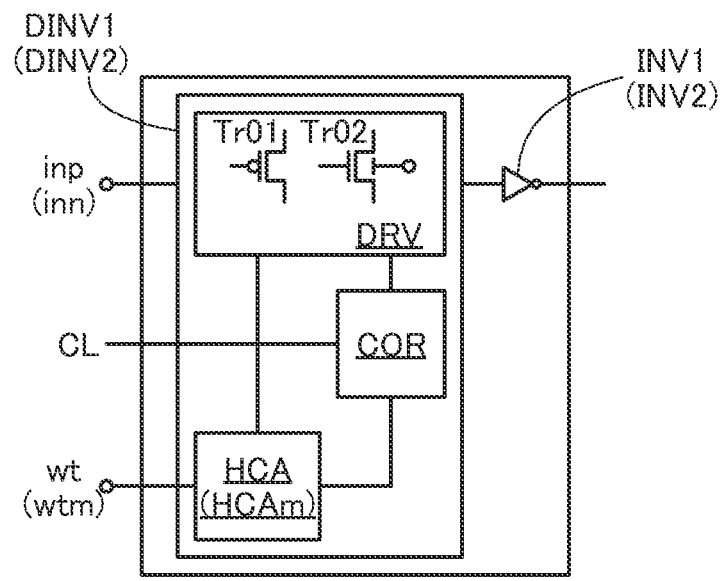
FIGS. 15(A), (B) Block diagrams illustrating configuration examples of a circuit included in a semiconductor device.

FIG. 15(A) is a block diagram illustrating an example of a circuit that can be used as the circuit BF1 (the circuit BF2) included in the circuit MPC described in the foregoing embodiment. A circuit BF1(BF2) in FIG. 15(A) includes the inverter circuit DINV1 (the inverter circuit DINV2) including a driver unit DRV, a correction unit COR, and the holding unit HCA (the holding unit HCAm), and the inverter circuit INV1 (the inverter circuit INV2).

The driver unit DRV includes the transistor Tr01 and the transistor Tr02. As has been described in the foregoing embodiment, the transistor Tr01 is a p-channel transistor, and the transistor Tr02 is an n-channel transistor including a back gate.

The correction unit COR has a function of correcting the threshold voltage of the transistor Tr01 and/or the transistor Tr02. Because of this, the correction unit COR is electrically connected to the driver unit DRV. Moreover, the correction unit COR is electrically connected to a wiring CL, and the wiring CL has a function of supplying a necessary signal to the correction unit COR to operate the correction unit COR. Note that the wiring CL is sometimes shown not as one wiring but as a plurality of wirings.

The holding unit HCA (the holding unit HCAm) has a function of holding the potential of the back gate of the transistor Tr02, as described in the foregoing embodiment. Because of this, the holding unit HCA (the holding unit HCAm) is electrically connected to the driver unit DRV. Note that the correction unit COR may be electrically connected to a wiring that electrically connects the holding unit HCA (the holding unit HCAm) and the driver unit DRV.

In other words, the holding unit HCA (the holding unit HCAm) may be electrically connected to the correction unit COR.

Note that the description in the foregoing embodiment is referred to for the details of the holding unit HCA (the holding unit HCAm).

Figure 15B:
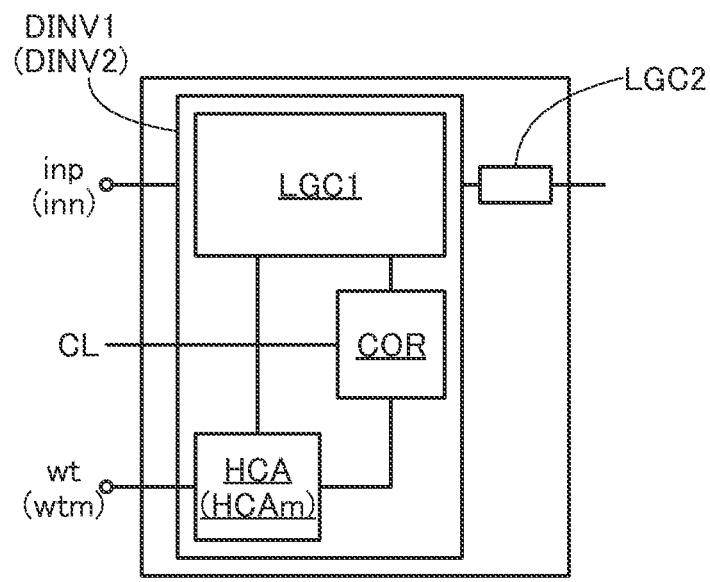

The inverter circuit DINV1 (the inverter circuit DINV2) (to be exact, the driver unit DRV having a function of an inverter circuit) and/or the inverter circuit INV1 (the inverter circuit INV2) illustrated in FIG. 15(A) can be replaced with, for example, a NAND circuit, a NOR circuit, an XOR circuit, or a circuit in which these are combined (hereinafter a NAND circuit, a NOR circuit, an XOR circuit, and a circuit in which these are combined are collectively referred to as logic circuits). FIG. 15(B) is a block diagram illustrating an example of a circuit that can be used as the circuit BF1 (the circuit BF2) included in the circuit MPC described in the foregoing embodiment and is different from that in FIG. 15(A); the driver unit DRV is replaced with a logic circuit LGC1, and the inverter circuit INV1 (the inverter circuit INV2) is replaced with a logic circuit LGC2. Each of the logic circuit LGC1 and the logic circuit LGC2 has a function of generating and outputting an inverted signal of a signal input thereto and can be the above-described inverter circuit, for example.

For example, when a NAND circuit is used as the logic circuit LGC1 and/or the logic circuit LGC2, the NAND circuit can function as an inverter circuit by input of a high-level potential to one of two input terminals of the NAND circuit as a fixed potential. As another example, when a NOR circuit is used as the logic circuit LGC1 and/or the logic circuit LGC2, the NOR circuit can function as an inverter circuit by input of a low-level potential to one of two input terminals of the NOR circuit as a fixed potential. As another example, when an XOR circuit is used as the logic circuit LGC1 and/or the logic circuit LGC2, the XOR circuit can function as an inverter circuit by input of a high-level potential to one of two input terminals of the XOR circuit as a fixed potential.

As described above, an inverter circuit described in this specification and the like can be replaced with a logic circuit such as a NAND circuit, a NOR circuit, an XOR circuit, or a circuit in which these are combined. Therefore, in this specification and the like, the term "inverter circuit" can be referred to as a logic circuit in a broad sense.

Specific configuration examples of the circuit BF1 (the circuit BF2) illustrated in FIGS. 15(A) and 15(B) will be described below. Note that the circuit BF2 can have the same configuration as the circuit BF1; hence, in the diagrams used in the following description, BF1(BF2) is used as the reference numeral for representing the circuit BF1. For a component that is included in the circuit BF2 and has a different reference numeral from a component included in the circuit BF1, its reference numeral is shown in parentheses around the reference numeral representing the component in the circuit BF1.

Note that in the following description, the circuit BF1 will be described unless otherwise specified. Accordingly, when the circuit BF2 is taken into consideration, the description can be made with reference to the reference numerals in parentheses shown in diagrams, by replacing below-mentioned reference numerals of the components of the circuit BF1 with the reference numerals in the parentheses.

CONFIGURATION EXAMPLE 1

Figure 16A:
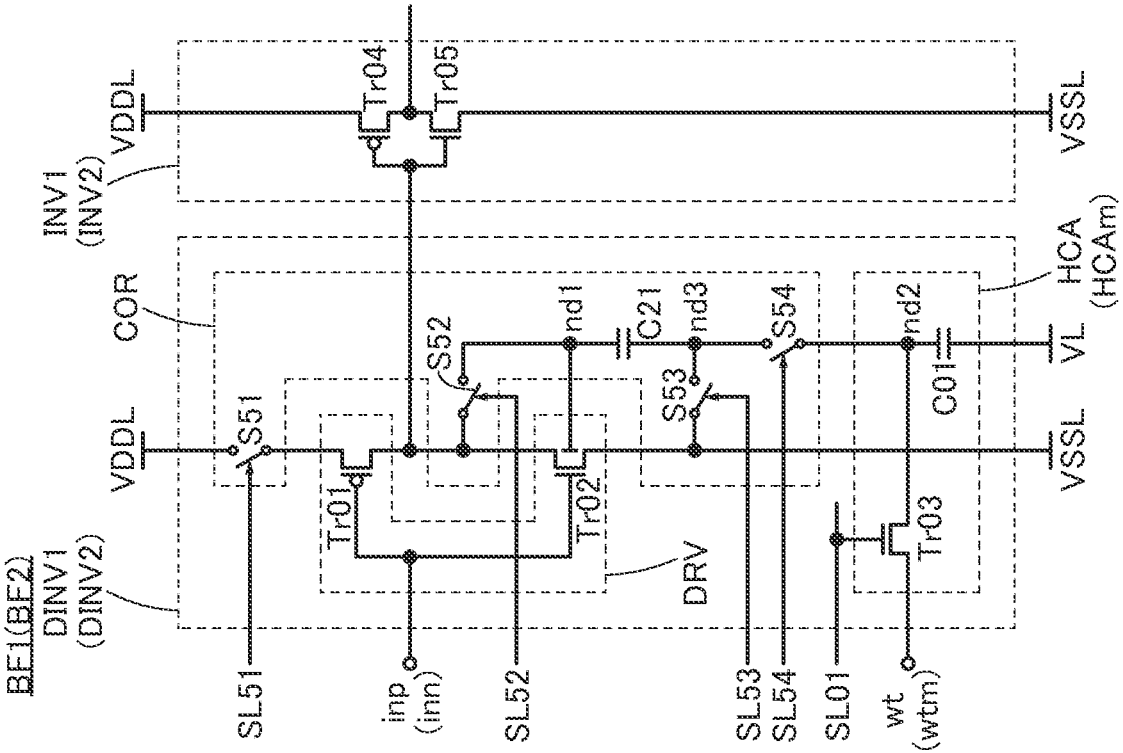
FIGS. 16(A), (B) Circuit diagrams illustrating configuration examples of a circuit included in a semiconductor device.

FIG. 16(A) illustrates a configuration example of the circuit BF1 in FIG. 15(A). The circuit BF1 illustrated in FIG. 16(A) has a function of correcting the threshold voltage of the transistor Tr02.

In the circuit BF1 in FIG. 16(A), the correction unit COR includes a switch S51 to a switch S54 and a capacitor C21.

The second terminal of the transistor Tr01 in the driver unit DRV is electrically connected to a first terminal of the switch S51 and the input terminal of the inverter circuit INV1, and a second terminal of the switch S51 is electrically connected to the first terminal of the transistor Tr02 in the driver unit DRV and a first terminal of the switch S52. A second terminal of the switch S52 is electrically connected to the back gate of the transistor Tr02 and a first terminal of the capacitor C21, and the second terminal of the transistor Tr02 is electrically connected to a first terminal of the switch S53 and the wiring VSSL. A second terminal of the capacitor C21 is electrically connected to a second terminal of the switch S53 and a first terminal of the switch S54. A second terminal of the switch S54 is electrically connected to the first terminal of the transistor Tr03 in the holding unit HCA and the first terminal of the capacitor C01 in the holding unit HCA. The terminal inp of the circuit MPC is electrically connected to the gates of the transistor Tr01 and the transistor Tr02.

The description of the circuit BF1 in the foregoing embodiment (particularly FIG. 2(B1) and the like) is referred to for the connection structures other than the above.

A wiring SL51 to a wiring SL54 are electrically connected to control terminals of the switch S51 to the switch S54, respectively. In other words, by applying a predetermined voltage to each of the wiring SL51 to the wiring SL54, the switch S51 to the switch S54 can be turned on or off. Note that in this specification and the like, each of the switch S51 to the switch S54 is turned on when a high-level potential is applied to the control terminal, and is turned off when a low-level potential is applied to the control terminal. The wiring SL51 to the wiring SL54 correspond to the wiring CL in FIG. 15(A).

As the switch S51 to the switch S54, an electrical switch such as an analog switch or a transistor can be used, for example. As another example, a mechanical switch may be used as the switch S51 to the switch S54. In particular, when a transistor is used as the switch S52, the transistor is preferably an OS transistor. The potential of the first terminal of the capacitor C21 and the potential of the back gate of the transistor Tr02 are preferably held for a long time; therefore, the switch S52 is preferably an OS transistor with a low off-state current. An OS transistor may also be used as the switches other than the switch S52.

A point where the second terminal of the switch S52, the back gate of the transistor Tr02, and the first terminal of the capacitor C21 are electrically connected to each other is referred to as a node nd1. A point where the second terminal of the capacitor C21, the second terminal of the switch S53, and the first terminal of the switch S54 are electrically connected to each other is referred to as a node nd3. A point where the first terminal of the transistor Tr03, the first terminal of the capacitor C01, and the second terminal of the switch S54 are electrically connected to each other is referred to as a node nd2.

Note that the circuit BF1 included in the semiconductor device of one embodiment of the present invention is not limited to the circuit BF1 in FIG. 16(A), and can have a modified configuration of the circuit BF1 in FIG. 16(A) depending on circumstances. For example, the switch S51 is provided between the second terminal of the transistor Tr01 and the first terminal of the transistor Tr02 in the circuit BF1 in FIG. 16(A); alternatively, the switch S51 may be provided between the wiring VDDL and the first terminal of the transistor Tr01 as in the circuit BF1 illustrated in FIG. 16(B). Note that the reference numeral of the wiring CL is omitted in FIG. 16(B).

Figure 16B:
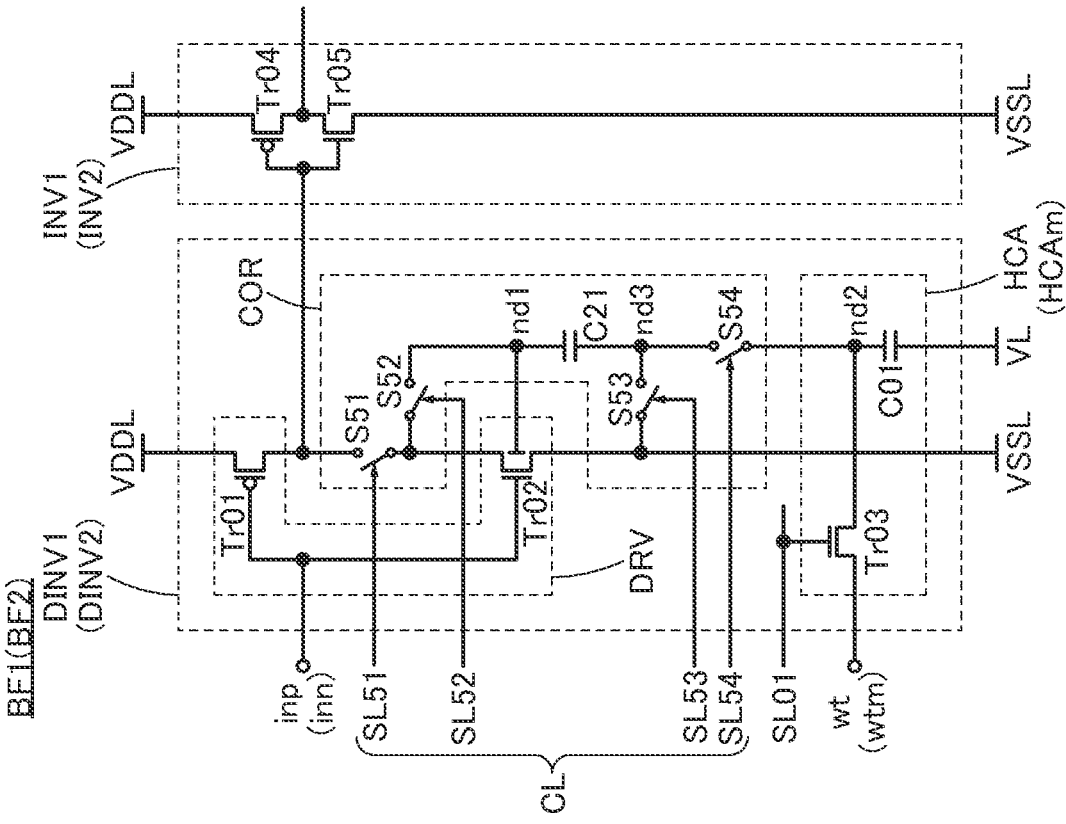

Next, an example of operation for correcting the threshold voltage of the transistor Tr02 in the circuit BF1 in FIGS. 16(A) and 16(B) is described.

Figure 17:
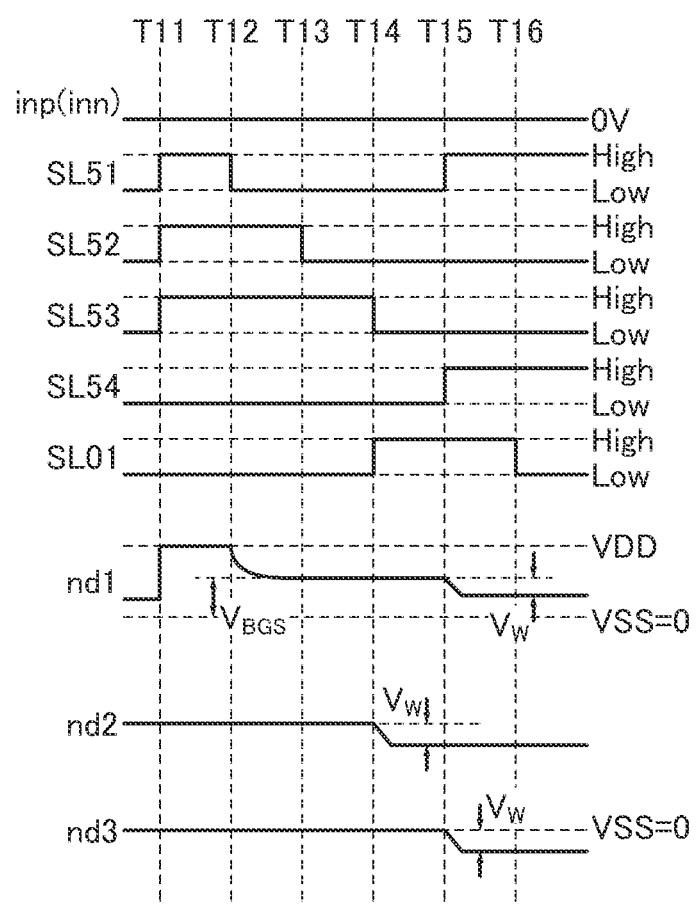
FIG. 17 A timing chart illustrating an operation example of a circuit included in a semiconductor device.

FIG. 17 is a timing chart illustrating an example of the operation of the circuit BF1 in FIGS. 16(A) and 16(B) for correcting the threshold voltage of the transistor Tr02, and shows changes in the potentials of the terminal inp, the wiring SL51 to the wiring SL54, the wiring SL01, and the node nd1 to the node nd3 in a period from Time T11 to Time T16 and the time around the period.

Note that in this operation example, the voltage VSS supplied from the wiring VSSL is described as 0 V as an example.

In the period from Time T11 to Time T12, the circuit BF1 is initialized in the operation of correcting the threshold voltage of the transistor Tr02. Specifically, the voltage VSS is supplied to the terminal inp, a high-level potential is supplied to the wiring SL51 to the wiring SL53, and a low-level potential is supplied to the wiring SL54 and the wiring SL01.

Thus, the switch S51 to the switch S53 are turned on, and the switch S54 and the transistor Tr03 are turned off.

To the gate of the transistor Tr01, 0 V is input as VSS; hence, the transistor Tr01 is turned on.

Since the switch S51 and the switch S52 are on, electrical continuity is established between the wiring VDDL and the first terminal of the capacitor C21. Thus, the potential of the node nd1 becomes VDD. In addition, since the switch S53 is on, electrical continuity is established between the second terminal of the capacitor C21 and the wiring VSSL. Thus, the potential of the node nd3 becomes VSS (=0 V). In other words, the voltage between the first terminal and the second terminal of the capacitor C21 becomes VDD.

Note that at this time, 0 V is input as VSS to the gate of the transistor Tr02, 0 V is input as VSS to the second terminal of the transistor Tr02, and VDD is input to the first terminal of the transistor Tr02; accordingly, the first terminal of the transistor Tr02 functions as a drain and the second terminal of the transistor Tr02 functions as a source.

At this time, a gate-source voltage $V_{GS}$ of the transistor Tr02 becomes 0 V. Since VDD is input to the back gate of the transistor Tr02 and the threshold voltage of the transistor Tr02 is shifted negatively, the transistor Tr02 is on.

In the period from Time T12 to Time T13, the potential of the wiring SL51 is changed to the low-level potential, so that the switch S51 is turned off. Thus, positive charge accumulated in the first terminal of the capacitor C21 flows to the wiring VSSL through the first terminal and the second terminal of the transistor Tr02 until the transistor Tr02 is turned off. In other words, negative charge flows to the first terminal of the capacitor C21 from the wiring VSSL through the first terminal and the second terminal of the transistor Tr02 until the transistor Tr02 is turned off.

Through this process, the potential of the node nd1 decreases from VDD, and the threshold voltage of the transistor Tr02 shifts positively. Eventually, the transistor Tr02 is turned off when the threshold voltage of the transistor Tr02 reaches the voltage $V_{GS}$ (=0 V) of the transistor Tr02; hence, the potential of the node nd1 at this time is held in the first terminal of the capacitor C21. Note that the voltage between the back gate and the source of the transistor Tr02 at this time, that is, the voltage between the first terminal and the second terminal of the capacitor C21 is represented by $V_{BGS}$.

In the period from Time T13 to Time T14, the potential of the wiring SL52 is changed to the low-level potential, so that the switch S52 is turned off. Thus, the node nd1 becomes an electrically floating state, and the potential of the node nd1 is held by the capacitor C21.

By this operation, the voltage between the back gate and the source of the transistor Tr02 (between the first terminal and the second terminal of the capacitor C21) is set to the voltage $V_{BGS}$ with which the threshold voltage of the transistor Tr02 becomes 0 V.

In the period from Time T14 to Time 15, the potential of the wiring SL53 is changed to the low-level potential, so that the switch S53 is turned off. Thus, electrical continuity between the second terminal of the capacitor C21 and the wiring VSSL is broken.

Moreover, in the period from Time T14 to Time 15, the high-level potential is supplied to the wiring SL01, whereby the transistor Tr03 is turned on. Note that a potential $V_W$ corresponding to a weight coefficient is assumed to be input to the terminal wt at this time. Accordingly, the potential $V_W$ input from the terminal wt is held in the node nd2 by the capacitor C01. Note that in this operation example, the potential $V_W$ is regarded as a potential lower than 0 V as an example.

In the period from Time T15 to Time T16, the potential of the wiring SL54 is changed to the high-level potential, so that the switch S54 is turned on. Thus, electrical continuity is established between the terminal wt and the second terminal of the capacitor C21, and the potential $V_W$ input from the terminal is applied to the second terminal of the capacitor C21 (the node nd3).

Since the node nd1 is in an electrically floating state at this time, when the potential of the node nd3 changes, the potential of the node nd1 also changes owing to capacitive coupling of the capacitor C21. The amount of change in the potential of the node nd1 depends on a capacitive coupling coefficient, and the capacitive coupling coefficient depends on gate capacitance of the transistor Tr02, parasitic capacitance of a wiring around the node nd1, and the like. In this operation example, the amount of change in the potential of the node nd1 and the amount of change in the potential of the node nd3 are described as the same value to avoid complexity of description. This corresponds to the case where the capacitive coupling coefficient is 1.

Since the capacitive coupling coefficient is 1, when the potential of the node nd3 increases from VSS (=0 V) to $V_W$, the potential of the node nd1 becomes $V_{BGS}+V_W$. Note that since $V_W$ is a negative potential in this operation example, the potential of the node nd1 becomes a potential lower than $V_{BGS}$ by $V_W$.

After Time T16, the potential of the wiring SL01 is changed to the low-level potential, so that the transistor Tr03 is turned off. Thus, the potentials of the node nd2 and the node nd3 are held by the capacitor C01 and the capacitor C21. In other words, $V_{BGS}+V_W$, which is the potential of the node nd1, is also held.

By performing the operation from Time T11 to Time T16 and after Time T16 shown in the timing chart in FIG. 17, the circuit BF1 in FIGS. 16(A) and 16(B) can input a potential corresponding to a weight coefficient to the back gate of the transistor Tr02 while correcting the threshold voltage of the transistor Tr02 to almost 0. Accordingly, variations in threshold voltages of the transistors Tr02 that would occur when a plurality of circuits BF1 are manufactured can be reduced, so that a potential corresponding to a weight coefficient can be more precisely input to the back gate of each transistor Tr02.

CONFIGURATION EXAMPLE 2

Figure 18:
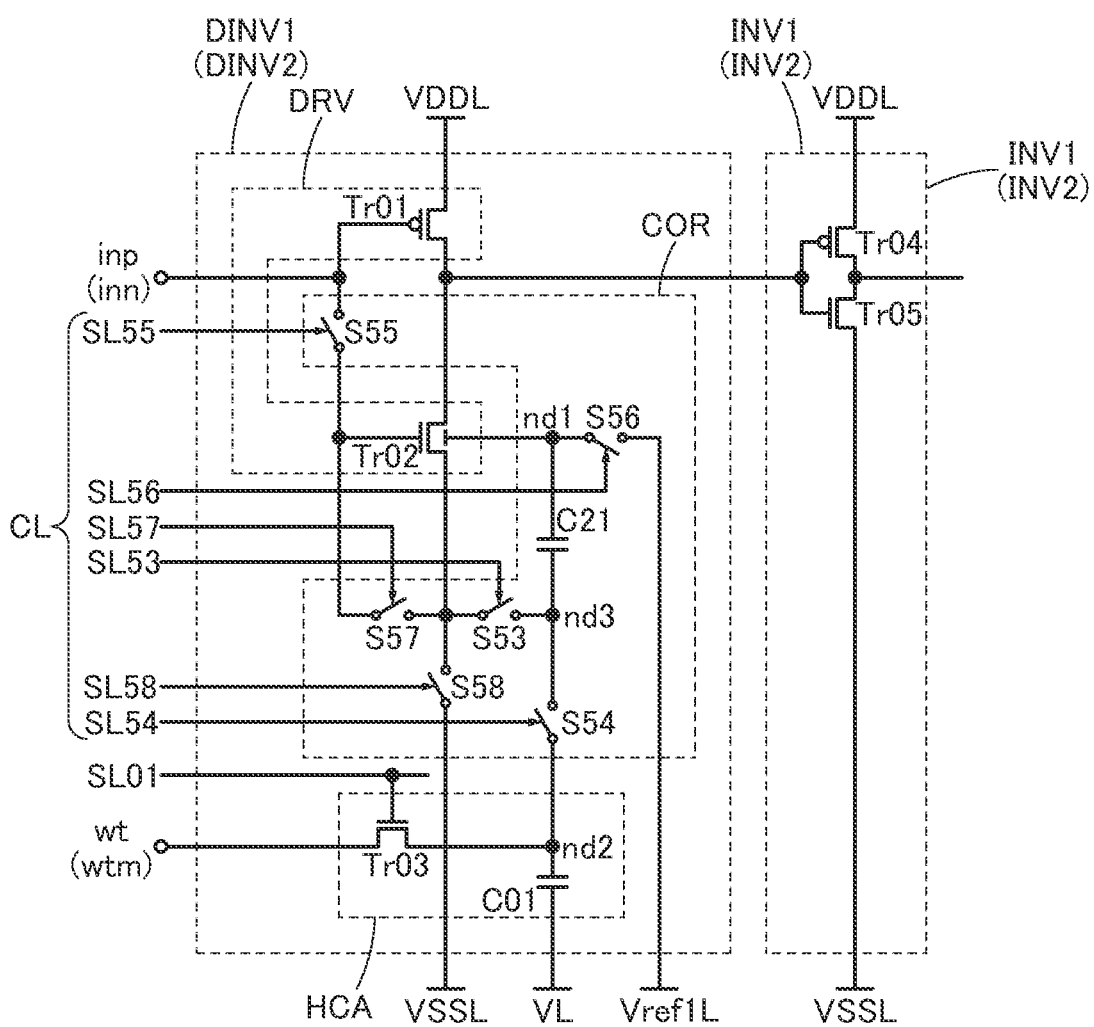
FIG. 18 A circuit diagram illustrating a configuration example of a circuit included in a semiconductor device.

FIG. 18 illustrates a configuration example different from Configuration example 1 of the circuit BF1 having a function of correcting the threshold voltage of the transistor Tr02.

In the circuit BF1 in FIG. 18, the correction unit COR includes the switch S53 to a switch S58 and the capacitor C21.

The second terminal of the transistor Tr01 in the driver unit DRV is electrically connected to the input terminal of the inverter circuit INV1 and the first terminal of the transistor Tr02 in the driver unit DRV, and the gate of the transistor Tr01 is electrically connected to a first terminal of the switch S55. A second terminal of the switch S55 is electrically connected to the gate of the transistor Tr02 and a first terminal of the switch S57. A second terminal of the switch S57 is electrically connected to the second terminal of the transistor Tr02, the first terminal of the switch S53, and a first terminal of the switch S58, and a second terminal of the switch S58 is electrically connected to the wiring VSSL. The back gate of the transistor Tr02 is electrically connected to a first terminal of the switch S56 and the first terminal of the capacitor C21, and a second terminal of the switch S56 is electrically connected to a wiring Vref1L. The second terminal of the capacitor C21 is electrically connected to the second terminal of the switch S53 and the first terminal of the switch S54, and the second terminal of the switch S54 is electrically connected to the first terminal of the transistor Tr03 in the holding unit HCA and the first terminal of the capacitor C01 in the holding unit HCA. The terminal inp of the circuit MPC is electrically connected to the gate of the transistor Tr01 and the first terminal of the switch S55.

The description of the circuit BF1 in the foregoing embodiment (particularly FIG. 2(B1) and the like) is referred to for the connection structures other than the above.

The wiring SL53 to a wiring SL58 are electrically connected to control terminals of the switch S53 to the switch S58, respectively. In other words, by applying a predetermined voltage to each of the wiring SL53 to the wiring SL58, the switch S53 to the switch S58 can be turned on or off. Note that in this specification and the like, each of the switch S53 to the switch S58 is turned on when a high-level potential is applied to the control terminal, and is turned off when a low-level potential is applied to the control terminal. The wiring SL53 to the wiring SL58 correspond to the wiring CL in FIG. 15(A).

As the switch S53 to the switch S58, an analog switch, a transistor, or the like can be used, for example, as in the case of the switch S51 to the switch S54 described in Configuration example 1. As another example, a mechanical switch may be used as the switch S53 to the switch S58. In particular, when a transistor is used as the switch S56, the transistor is preferably an OS transistor. The potential of the first terminal of the capacitor C21 and the potential of the back gate of the transistor Tr02 are preferably held for a long time; therefore, the switch S56 is preferably an OS transistor with a low off-state current. An OS transistor may also be used as the switches other than the switch S56.

The wiring Vref1L is a wiring for supplying a predetermined constant voltage $V_{ref1}$. The constant voltage is preferably, for example, a voltage that makes the threshold voltage of the transistor Tr02 shifted in the negative direction by being input to the back gate of the transistor Tr02.

In this configuration example, a point where the first terminal of the switch S56, the back gate of the transistor Tr02, and the first terminal of the capacitor C21 are electrically connected to each other is referred to as the node nd1. As in Configuration example 1, a point where the second terminal of the capacitor C21, the second terminal of the switch S53, and the first terminal of the switch S54 are electrically connected to each other is referred to as the node nd3. Moreover, a point where the first terminal of the transistor Tr03, the first terminal of the capacitor C01, and the second terminal of the switch S54 are electrically connected to each other is referred to as the node nd2.

Next, an example of operation for correcting the threshold voltage of the transistor Tr02 in the circuit BF1 in FIG. 18 is described.

Figure 19:
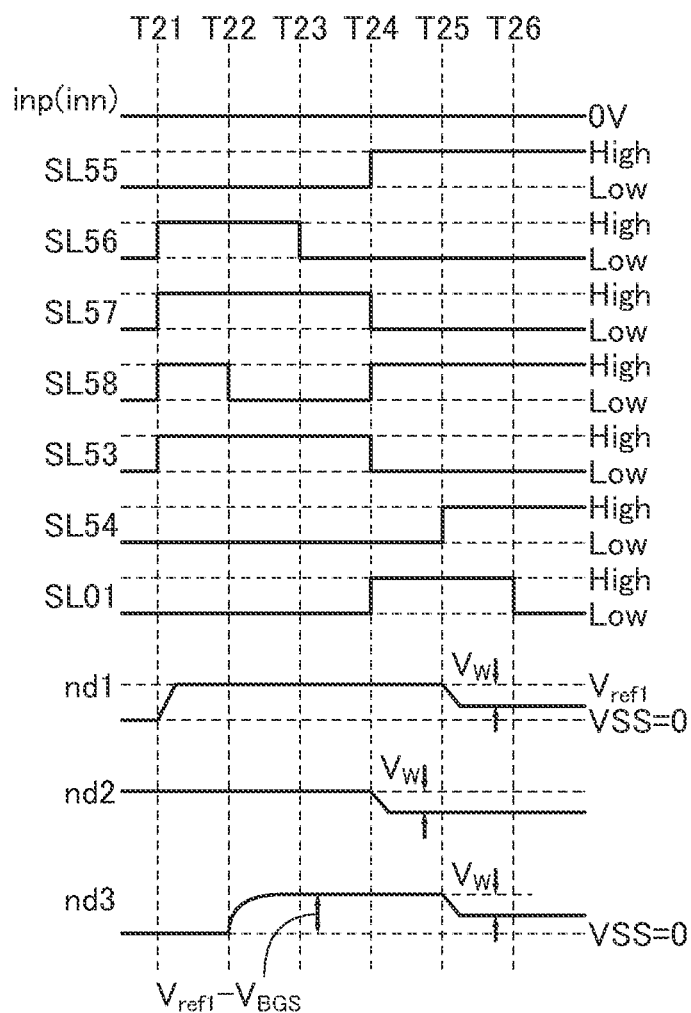
FIG. 19 A timing chart illustrating an operation example of a circuit included in a semiconductor device.

FIG. 19 is a timing chart illustrating an example of the operation of the circuit BF1 in FIG. 18 for correcting the threshold voltage of the transistor Tr02, and shows changes in the potentials of the terminal inp, the wiring SL53 to the wiring SL58, the wiring SL01, and the node nd1 to the node nd3 in a period from Time T21 to Time T26 and the time around the period.

Note that in this operation example, the voltage VSS supplied from the wiring VSSL is described as 0 V as an example.

In the period from Time T21 to Time T22, the circuit BF1 is initialized in the operation of correcting the threshold voltage of the transistor Tr02. Specifically, the voltage VSS is supplied to the terminal inp; a high-level potential is supplied to the wiring SL53 and the wiring SL56 to the wiring SL58; and a low-level potential is supplied to the wiring SL54, the wiring SL55, and the wiring SL01.

Thus, the switch S53 and the switch S56 to the switch S58 are turned on, and the switch S54, the switch S55, and the transistor Tr03 are turned off.

To the gate of the transistor Tr01, 0 V is input as VSS; hence, the transistor Tr01 is turned on.

Since the switch S56 is on, electrical continuity is established between the wiring Vref1L and the first terminal of the capacitor C21. Thus, the potential of the node nd1 becomes $V_{ref1}$. In addition, since the switch S53 and the switch S58 are on, electrical continuity is established between the second terminal of the capacitor C21 and the wiring VSSL. Thus, the potential of the node nd3 becomes VSS (=0 V). In other words, the voltage between the first terminal and the second terminal of the capacitor C21 (between the back gate and the source of the transistor Tr02) becomes $V_{ref1}$.

In addition, since the switch S57 and the switch S58 are on, electrical continuity is established between the wiring VSSL and the gate of the transistor Tr02. Thus, 0 V is input as VSS to the gate and the second terminal of the transistor Tr02. Since VDD is applied to the first terminal of the transistor Tr02, the first terminal of the transistor Tr02 functions as a drain and the second terminal of the transistor Tr02 functions as a source.

At this time, the gate-source voltage $V_{GS}$ of the transistor Tr02 becomes 0 V. Since $V_{ref1}$ is input to the back gate of the transistor Tr02 and the threshold voltage of the transistor Tr02 is shifted negatively, the transistor Tr02 is on.

In the period from Time T22 to Time T23, the potential of the wiring SL58 is changed to the low-level potential, so that the switch S58 is turned off. Thus, negative charge accumulated in the second terminal of the capacitor C21 flows to the wiring VDDL through the first terminal and the second terminal of the transistor Tr02 until the transistor Tr02 is turned off. In other words, positive charge flows to the second terminal of the capacitor C21 from the wiring VDDL through the first terminal and the second terminal of the transistor Tr02 until the transistor Tr02 is turned off.

Through this process, the potential of the node nd3 increases from VSS. Thus, the voltage between the back gate and the source of the transistor Tr02 decreases from $V_{ref1}$, and the threshold voltage of the transistor Tr02 shifts positively. Eventually, the transistor Tr02 is turned off when the threshold voltage of the transistor Tr02 reaches the voltage $V_{GS}$ (=0 V) of the transistor Tr02; hence, the potential of the node nd3 at this time is held in the second terminal of the capacitor C21. Note that the voltage between the back gate and the source of the transistor Tr02 at this time, that is, the voltage between the first terminal and the second terminal of the capacitor C21 is denoted as $V_{BGS}$. The potential of the node nd3 at this time becomes $V_{ref1}-V_{BGS}$.

In the period from Time T23 to Time T24, the potential of the wiring SL56 is changed to the low-level potential, so that the switch S56 is turned off. Thus, the node nd1 becomes an electrically floating state, and the potential $V_{ref1}$ of the node nd1 is held by the first terminal of the capacitor C21.

By this operation, the voltage between the back gate and the source of the transistor Tr02 (between the first terminal and the second terminal of the capacitor C21) is set to the voltage $V_{BGS}$ with which the threshold voltage of the transistor Tr02 becomes 0 V.

In the period from Time T24 to Time 25, the potentials of the wiring SL53 and the wiring SL57 are changed to the low-level potential, so that the switch S53 and the switch S57 are turned off. In addition, the potentials of the wiring SL55 and the wiring SL58 are changed to the high-level potential, so that the switch S55 and the switch S58 are turned on. Thus, electrical continuity is established between the terminal inp and the gate of the transistor Tr01 and between the terminal inp and the gate of the transistor Tr02. Moreover, electrical continuity is established between the second terminal of the transistor Tr02 and the wiring VSSL.

Moreover, in the period from Time T24 to Time 25, the high-level potential is supplied to the wiring SL01, whereby the transistor Tr03 is turned on. Note that the potential $V_W$ corresponding to a weight coefficient is assumed to be input to the terminal wt at this time. Accordingly, the potential $V_W$ input from the terminal wt is held in the node nd2 by the capacitor C01. Note that in this operation example, the potential $V_W$ is regarded as a potential lower than 0 V as an example.

In the period from Time T25 to Time T26, the potential of the wiring SL54 is changed to the high-level potential, so that the switch S54 is turned on. Thus, electrical continuity is established between the terminal wt and the second terminal of the capacitor C21, and the potential $V_W$ input from the terminal is applied to the second terminal of the capacitor C21 (the node nd3).

Since the node nd1 is in an electrically floating state at this time, when the potential of the node nd3 changes, the potential of the node nd1 also changes owing to capacitive coupling of the capacitor C21. In this operation example, the capacitive coupling coefficient of the capacitor C21 is considered as 1 as in Configuration example 1. Therefore, the amount of change in the potential of the node nd1 is described as the same as the amount of change in the potential of the node nd3.

Since the capacitive coupling coefficient is 1, when the potential of the node nd3 increases from $V_{ref1}-V_{BGS}$ to $V_{ref1}-V_{BGS}+V_W$, the potential of the node nd1 becomes $V_{BGS}+V_W$. Note that since $V_W$ is a negative potential in this operation example, the potential of the node nd1 becomes a potential lower than VBGS by $V_W$.

After Time T26, the potential of the wiring SL01 is changed to the low-level potential, so that the transistor Tr03 is turned off. Thus, the potentials of the node nd2 and the node nd3 are held by the capacitor C01 and the capacitor C21. In other words, $V_{BGS}+V_W$, which is the potential of the node nd1, is also held.

By performing the operation from Time T21 to Time T26 and after Time T26 shown in the timing chart in FIG. 19, the circuit BF1 in FIG. 18 can input a potential corresponding to a weight coefficient to the back gate of the transistor Tr02 while correcting the threshold voltage of the transistor Tr02 to almost 0, as in Configuration example 1. Accordingly, variations in threshold voltages of the transistors Tr02 that would occur when a plurality of circuits BF1 are manufactured can be reduced, so that a potential corresponding to a weight coefficient can be more precisely input to the back gate of each transistor Tr02.

CONFIGURATION EXAMPLE 3

Figure 20A:
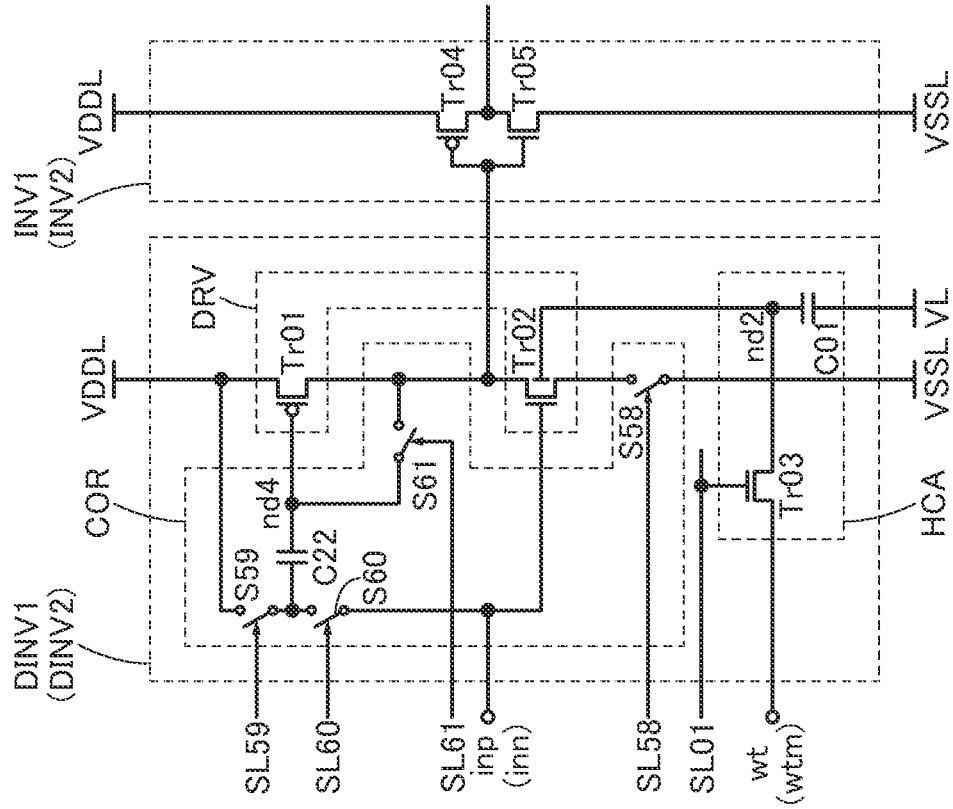
FIGS. 20(A), (B) Circuit diagrams illustrating configuration examples of a circuit included in a semiconductor device.

FIG. 20(A) illustrates a configuration example of the circuit BF1 in FIG. 15(A). The circuit BF1 illustrated in FIG. 20(A) has a function of correcting the threshold voltage of the transistor Tr01.

In the circuit BF1 in FIG. 20(A), the correction unit COR includes the switch S58 to a switch S61 and a capacitor C22.

The first terminal of the transistor Tr01 in the driver unit DRV is electrically connected to a first terminal of the switch S59 and the wiring VDDL, and a second terminal of the switch S59 is electrically connected to a first terminal of the capacitor C22 and a first terminal of the switch S60. A second terminal of the capacitor C22 is electrically connected to the gate of the transistor Tr01 and a first terminal of the switch S61, and the second terminal of the transistor Tr01 is electrically connected to a second terminal of the switch S61 and the first terminal of the switch S58. The second terminal of the switch S58 is electrically connected to the first terminal of the transistor Tr02 in the driver unit DRV and the input terminal of the inverter circuit INV1, and a second terminal of the switch S60 is electrically connected to the terminal inp and the gate of the transistor Tr02.

The description of the circuit BF1 in the foregoing embodiment (particularly FIG. 2(B1) and the like) is referred to for the connection structures other than the above.

The wiring SL58 to a wiring SL61 are electrically connected to control terminals of the switch S58 to the switch S61, respectively. In other words, by applying a predetermined voltage to each of the wiring SL58 to a wiring SL61, the switch S58 to the switch S61 can be turned on or off. Note that in this specification and the like, each of the switch S58 to the switch S61 is turned on when a high-level potential is applied to the control terminal, and is turned off when a low-level potential is applied to the control terminal. The wiring SL58 to a wiring SL61 correspond to the wiring CL in FIG. 15(A).

As the switch S58 to the switch S61, an analog switch, a transistor, or the like can be used, for example. As another example, a mechanical switch may be used as the switch S58 to the switch S61. In particular, when a transistor is used as the switch S61, the transistor is preferably an OS transistor. The potential of the second terminal of the capacitor C22 and the potential of the gate of the transistor Tr01 are preferably held for a long time; therefore, the switch S61 is preferably an OS transistor with a low off-state current. An OS transistor may also be used as the switches other than the switch S61.

A point where the gate of the transistor Tr01, the second terminal of the capacitor C22, and the first terminal of the switch S61 are electrically connected to each other is referred to as a node nd4. A point where the first terminal of the transistor Tr03, the first terminal of the capacitor C01, and the back gate of the transistor Tr02 are electrically connected to each other is referred to as the node nd2.

Note that the circuit BF1 included in the semiconductor device of one embodiment of the present invention is not limited to the circuit BF1 in FIG. 20(A), and can have a modified configuration of the circuit BF1 in FIG. 20(A) depending on circumstances. For example, the switch S58, which is provided between the second terminal of the transistor Tr01 and the first terminal of the transistor Tr02 in the circuit BF1 in FIG. 20(A), may alternatively be provided between the wiring VSSL and the second terminal of the transistor Tr02 as in the circuit BF1 illustrated in FIG. 20(B). Note that the reference numeral of the wiring CL is omitted in FIG. 20(B).

Figure 20B:
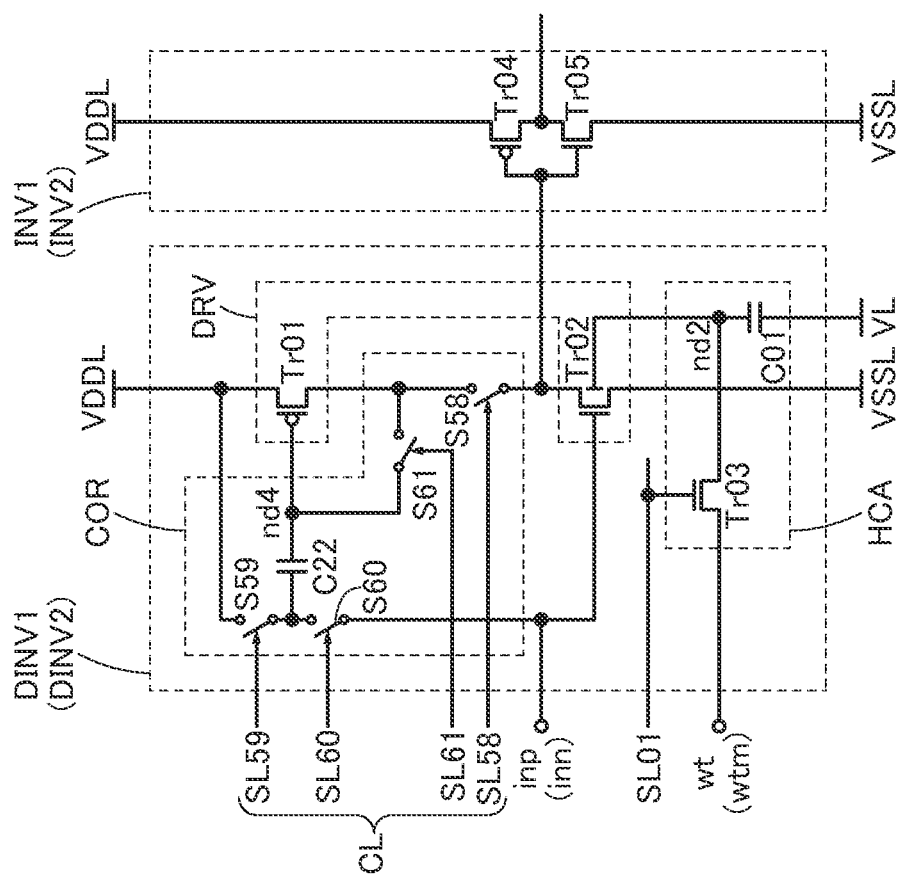

Next, an example of operation for correcting the threshold voltage of the transistor Tr01 in the circuit BF1 in FIGS. 20(A) and 20(B) is described.

Figure 21:
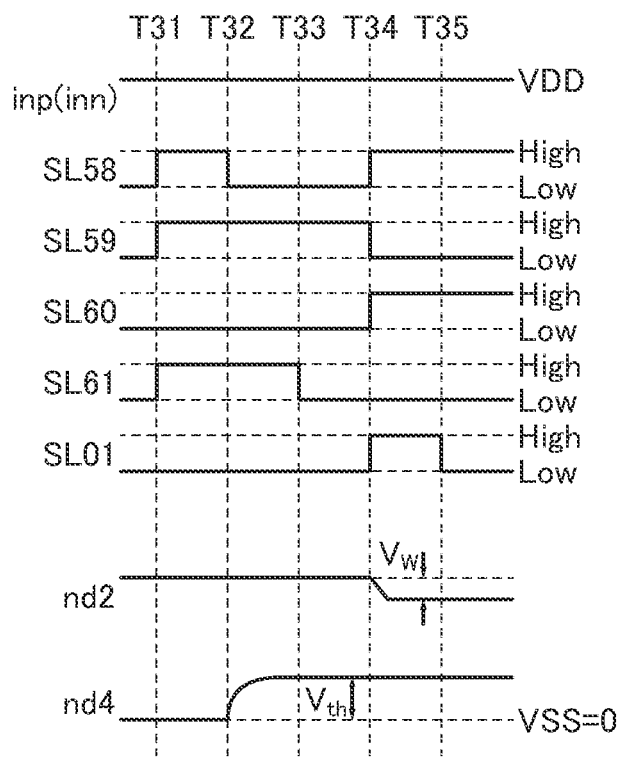
FIG. 21 A timing chart illustrating an operation example of a circuit included in a semiconductor device.

FIG. 21 is a timing chart illustrating an example of the operation of the circuit BF1 in FIGS. 20(A) and 20(B) for correcting the threshold voltage of the transistor Tr01, and shows changes in the potentials of the terminal inp, the wiring SL58 to the wiring SL61, the wiring SL01, the node nd2, and the node nd4 in a period from Time T31 to Time T35 and the time around the period.

Note that in this operation example, the voltage VSS supplied from the wiring VSSL is described as 0 V as an example.

In the period from Time T31 to Time T32, the circuit BF1 is initialized in the operation of correcting the threshold voltage of the transistor Tr01. Specifically, the voltage VDD is supplied to the terminal inp; a high-level potential is supplied to the wiring SL58, the wiring SL59, and the wiring SL61; and a low-level potential is supplied to the wiring SL60 and the wiring SL01.

Thus, the switch S58, the switch S59, and the switch S61 are turned on, and the switch S60 and the transistor Tr03 are turned off.

VDD is input to the gate of the transistor Tr02; hence, the transistor Tr02 is turned on.

Since the switch S58, the switch S61, and the transistor Tr02 are on, electrical continuity is established between the wiring VSSL and the gate of the transistor Tr01, between the wiring VSSL and the second terminal of the transistor Tr01, and between the wiring VSSL and the second terminal of the capacitor C22. Thus, the potential of the node nd4 becomes VSS (=0 V). In addition, since the switch S59 is on, electrical continuity is established between the first terminal of the capacitor C22 and the wiring VDDL. Hence, the voltage between the first terminal and the second terminal of the capacitor C22 becomes VDD.

Note that at this time, 0 V is input as VSS to the gate of the transistor Tr01, 0 V is input as VSS to the second terminal of the transistor Tr01, and VDD is input to the first terminal of the transistor Tr02; accordingly, the first terminal of the transistor Tr01 functions as a source and the second terminal of the transistor Tr01 functions as a drain.

At this time, since the gate-source voltage $V_{GS}$ of the transistor Tr01 becomes −VDD, the transistor Tr01 is on.

In the period from Time T32 to Time T33, the potential of the wiring SL58 is changed to the low-level potential, so that the switch S58 is turned off. Thus, negative charge accumulated in the second terminal of the capacitor C22 flows to the wiring VDDL through the first terminal and the second terminal of the transistor Tr01 until the transistor Tr01 is turned off. In other words, positive charge flows to the second terminal of the capacitor C22 from the wiring VDDL through the first terminal and the second terminal of the transistor Tr02 until the transistor Tr01 is turned off.

Through this process, the potential of the node nd4 increases from VSS, and the voltage $V_{GS}$ of the transistor Tr01 increases. Eventually, the transistor Tr01 is turned off when the voltage $V_{GS}$ of the transistor Tr01 reaches the threshold voltage of the transistor Tr01; hence, the potential of the node nd4 at this time is held in the second terminal of the capacitor C22. Given that the threshold voltage of the transistor Tr01 is $V_{th}$, the potential of the node nd4 at this time becomes VDD+$V_{th}$. Accordingly, the voltage between the first terminal and the second terminal of the capacitor C22 becomes $V_{th}$.

In the period from Time T33 to Time T34, the potential of the wiring SL61 is changed to the low-level potential, so that the switch S61 is turned off. Thus, the node nd4 becomes an electrically floating state, and the potential of the node nd4 is held by the capacitor C22.

By this operation, the voltage between the gate and the source of the transistor Tr01 (between the first terminal and the second terminal of the capacitor C22) is set to the threshold voltage $V_{th}$ of the transistor Tr01.

In the period from Time T34 to Time 35, the potentials of the wiring SL58 and the wiring SL60 are changed to the high-level potential, so that the switch S58 and the switch S60 are turned on. In addition, the potential of the wiring SL59 is changed to the low-level potential, so that the switch S59 is turned off. Thus, electrical continuity is established between the gate of the transistor Tr02 and the first terminal of the capacitor C22. Moreover, in the case of FIG. 20(A), electrical continuity is established between the second terminal of the transistor Tr01 and the first terminal of the transistor Tr02; in the case of FIG. 20(B), electrical continuity is established between the second terminal of the transistor Tr02 and the wiring VSSL.

Moreover, in the period from Time T34 to Time 35, the high-level potential is supplied to the wiring SL01, whereby the transistor Tr03 is turned on. Note that the potential $V_W$ corresponding to a weight coefficient is assumed to be input to the terminal wt at this time. Accordingly, the potential $V_W$ input from the terminal wt is held in the node nd2 by the capacitor C01. Then, the potential $V_W$ is input to the back gate of the transistor Tr02. Note that in this operation example, the potential $V_W$ is regarded as a potential lower than 0 V as an example.

After Time T35, the potential of the wiring SL01 is changed to the low-level potential, so that the transistor Tr03 is turned off. Thus, the potential $V_W$ of the node nd2 is held by the capacitor C01.

By performing the operation from Time T31 to Time T35 and after Time T35 shown in the timing chart in FIG. 21, the circuit BF1 in FIGS. 20(A) and 20(B) can correct the threshold voltage of the transistor Tr01 to almost 0. Accordingly, variations in threshold voltages of the transistors Tr01 that would occur when a plurality of circuits BF1 are manufactured can be reduced.

CONFIGURATION EXAMPLE 4

Figure 22:
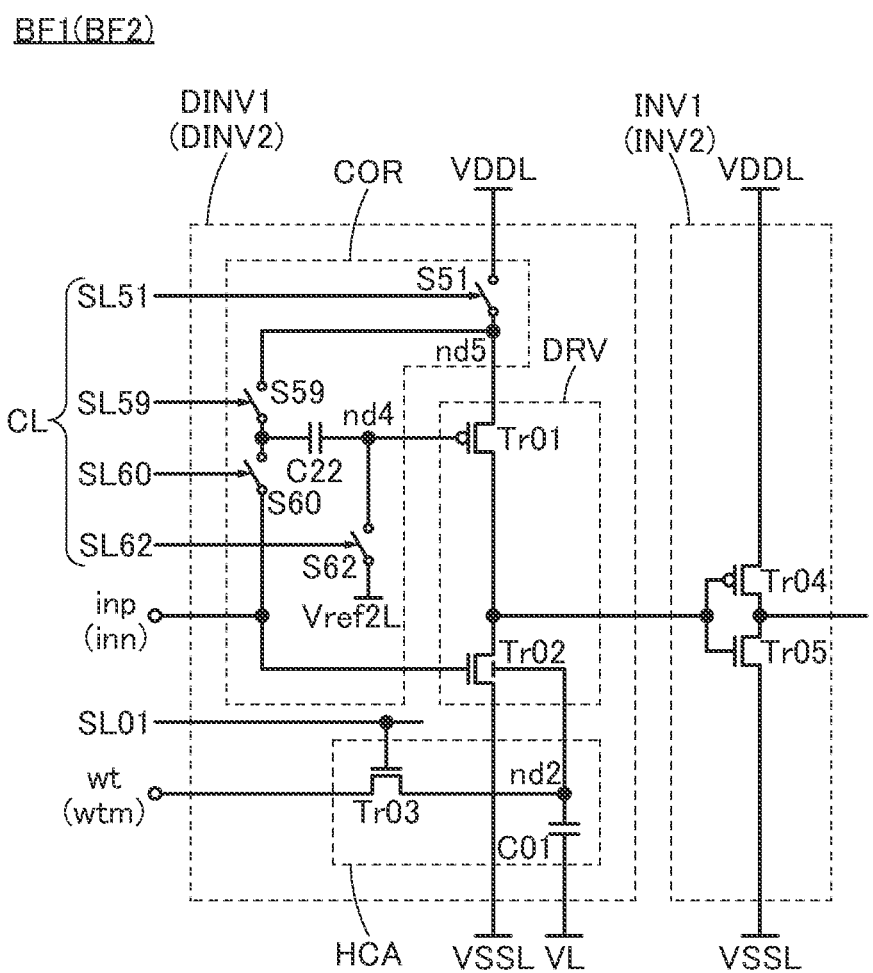
FIG. 22 A circuit diagram illustrating a configuration example of a circuit included in a semiconductor device.

FIG. 22 illustrates a configuration example different from Configuration example 3 of the circuit BF1 having a function of correcting the threshold voltage of the transistor Tr01.

In the circuit BF1 in FIG. 22, the correction unit COR includes the switch S51, the switch S59, the switch S60, a switch S62, and the capacitor C22.

The first terminal of the switch S51 is electrically connected to the wiring VDDL, and the second terminal of the switch S51 is electrically connected to the first terminal of the transistor Tr01 in the driver unit DRV and the first terminal of the switch S59. The second terminal of the switch S59 is electrically connected to the first terminal of the capacitor C22 and the first terminal of the switch S60, the second terminal of the capacitor C22 is electrically connected to the gate of the transistor Tr01 and a first terminal of the switch S62, and a second terminal of the switch S62 is electrically connected to a wiring Vref2L. The second terminal of the transistor Tr01 is electrically connected to the first terminal of the transistor Tr02 in the driver unit DRV and the input terminal of the inverter circuit INV1, and the second terminal of the switch S60 is electrically connected to the gate of the transistor Tr02 and the terminal inp.

The description of the circuit BF1 in the foregoing embodiment (particularly FIG. 2(B1) and the like) is referred to for the connection structures other than the above.

The wiring SL51, the wiring SL59, the wiring SL60, and a wiring SL62 are electrically connected to control terminals of the switch S51, the switch S59, the switch S60, and the switch S62, respectively. In other words, by applying a predetermined voltage to each of wiring SL51, the wiring SL59, the wiring SL60, and the wiring SL62, the switch S51, the switch S59, the switch S60, and the switch S62 can be turned on or off. Note that in this specification and the like, the switch S51, the switch S59, the switch S60, and the switch S62 are turned on when a high-level potential is applied to the control terminal, and are turned off when a low-level potential is applied to the control terminal. The wiring SL51, the wiring SL59, the wiring SL60, and the wiring SL62 correspond to the wiring CL in FIG. 15(A).

As the switch S51, the switch S59, the switch S60, and the switch S62, an analog switch, a transistor, or the like can be used, for example. As another example, a mechanical switch may be used as the switch S51, the switch S59, the switch S60, and the switch S62. In particular, when a transistor is used as the switch S62, the transistor is preferably an OS transistor. The potential of the second terminal of the capacitor C22 and the potential of the gate of the transistor Tr01 are preferably held for a long time; therefore, the switch S62 is preferably an OS transistor with a low off-state current. An OS transistor may also be used as the switches other than the switch S62.

The wiring Vref2L is a wiring for supplying a predetermined constant voltage $V_{ref2}$. The constant voltage is preferably a potential lower than VDD, for example, and is further preferably a potential such that $V_{ref2}$–VDD is lower than the threshold voltage of the transistor Tr01. Moreover, $V_{ref2}$ may be a ground potential.

A point where the gate of the transistor Tr01, the second terminal of the capacitor C22, and the first terminal of the switch S62 are electrically connected to each other is referred to as the node nd4; and a point where the second terminal of the switch S51, the first terminal of the switch S59, and the first terminal of the transistor Tr01 are electrically connected to each other is referred to as a node nd5. As in Configuration example 3, a point where the first terminal of the transistor Tr03, the first terminal of the capacitor C01, and the back gate of the transistor Tr02 are electrically connected to each other is referred to as the node nd2.

Next, an example of operation for correcting the threshold voltage of the transistor Tr01 in the circuit BF1 in FIG. 22 is described.

Figure 23:
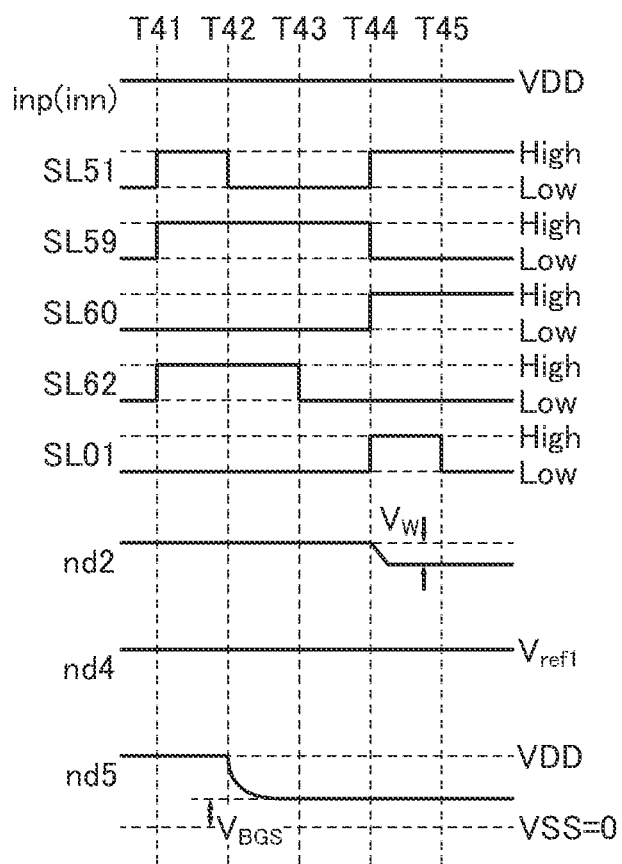
FIG. 23 A timing chart illustrating an operation example of a circuit included in a semiconductor device.

FIG. 23 is a timing chart illustrating an example of the operation of the circuit BF1 in FIG. 22 for correcting the threshold voltage of the transistor Tr01, and shows changes in the potentials of the terminal inp, the wiring SL51, the wiring SL59, the wiring SL60, the wiring SL62, the wiring SL01, the node nd2, and the node nd4 in a period from Time T41 to Time T45 and the time around the period.

Note that in this operation example, the voltage VSS supplied from the wiring VSSL is described as 0 V as an example.

In the period from Time T41 to Time T42, the circuit BF1 is initialized in the operation of correcting the threshold voltage of the transistor Tr01. Specifically, the voltage VDD is supplied to the terminal inp; a high-level potential is supplied to the wiring SL51, the wiring SL59, and the wiring SL62; and a low-level potential is supplied to the wiring SL60 and the wiring SL01.

Thus, the switch S51, the switch S59, and the switch S62 are turned on, and the switch S60 and the transistor Tr03 are turned off.

VDD is input to the gate of the transistor Tr02; hence, the transistor Tr02 is turned on.

Since the switch S62 is on, electrical continuity is established between the wiring Vref2L and the second terminal of the capacitor C22 and between the wiring Vref2L and the gate of the transistor Tr01. Thus, the potential of the node nd4 becomes $V_{ref2}$. In addition, since the switch S51 and the switch S59 are on, electrical continuity is established between the wiring VDDL and the first terminal of the capacitor C22. Hence, the voltage between the first terminal and the second terminal of the capacitor C22 becomes VDD–$V_{ref2}$. Furthermore, since the transistor Tr02 is on, electrical continuity is established between the wiring VSSL and the second terminal of the transistor Tr01.

In summary of the above description, $V_{ref2}$ is input to the gate of the transistor Tr01, 0 V is input as VSS to the second terminal of the transistor Tr01, and VDD is input to the first terminal of the transistor Tr02; accordingly, the first terminal of the transistor Tr01 functions as a source and the second terminal of the transistor Tr01 functions as a drain.

At this time, since the gate-source voltage $V_{GS}$ of the transistor Tr01 becomes $V_{ref2}$–VDD, the transistor Tr01 is on.

In the period from Time T42 to Time T43, the potential of the wiring SL51 is changed to the low-level potential, so that the switch S51 is turned off. Thus, positive charge accumulated in the first terminal of the capacitor C22 flows to the wiring VSSL through the first terminal and the second terminal of the transistor Tr01 until the transistor Tr01 is turned off. In other words, negative charge flows to the first terminal of the capacitor C22 from the wiring VSSL through the first terminal and the second terminal of the transistor Tr02 and the first terminal and the second terminal of the transistor Tr01 until the transistor Tr01 is turned off.

Through this process, the potential of the node nd5 increases from VDD, and the voltage $V_{GS}$ of the transistor Tr01 increases. Eventually, the transistor Tr01 is turned off when the voltage $V_{GS}$ of the transistor Tr01 reaches the threshold voltage of the transistor Tr01; hence, the potential of the node nd5 at this time is held in the first terminal of the capacitor C22. Given that the threshold voltage of the transistor Tr01 is $V_{th}$, the potential of the node nd5 at this time becomes $V_{ref2}-V_{th}$. Accordingly, the voltage between the first terminal and the second terminal of the capacitor C22 becomes $V_{th}$.

In the period from Time T43 to Time T44, the potential of the wiring SL62 is changed to the low-level potential, so that the switch S62 is turned off. Thus, the node nd4 becomes an electrically floating state, and the potential of the node nd4 is held by the second terminal of the capacitor C22.

By this operation, the voltage between the gate and the source of the transistor Tr01 (between the first terminal and the second terminal of the capacitor C22) is set to the threshold voltage $V_{th}$ of the transistor Tr01.

In the period from Time T44 to Time 45, the potentials of the wiring SL51 and the wiring SL60 are changed to the high-level potential, so that the switch S51 and the switch S60 are turned on. In addition, the potential of the wiring SL59 is changed to the low-level potential, so that the switch S59 is turned off. Thus, electrical continuity is established between the terminal inp and the first terminal of the capacitor C22. Moreover, electrical continuity is established between the first terminal of the transistor Tr01 and the wiring VDDL.

Moreover, in the period from Time T44 to Time 45, the high-level potential is supplied to the wiring SL01, whereby the transistor Tr03 is turned on. Note that the potential $V_W$ corresponding to a weight coefficient is assumed to be input to the terminal wt at this time. Accordingly, the potential $V_W$ input from the terminal wt is held in the node nd2 by the capacitor C01. Then, the potential $V_W$ is input to the back gate of the transistor Tr02. Note that in this operation example, the potential $V_W$ is regarded as a potential lower than 0 V as an example.

After Time T45, the potential of the wiring SL01 is changed to the low-level potential, so that the transistor Tr03 is turned off. Thus, the potential $V_W$ of the node nd2 is held by the capacitor C01.

By performing the operation from Time T41 to Time T45 and after Time T45 shown in the timing chart in FIG. 23, the circuit BF1 in FIG. 22 can correct the threshold voltage of the transistor Tr01 to almost 0. Accordingly, variations in threshold voltages of the transistors Tr01 that would occur when a plurality of circuits BF1 are manufactured can be reduced.

CONFIGURATION EXAMPLE 5

Configuration example 1 and Configuration example 2 describe the circuit BF1 having a function of correcting the threshold voltage of the transistor Tr02, and Configuration example 3 and Configuration example 4 describe the circuit BF1 having a function of correcting the threshold voltage of the transistor Tr01; combining Configuration example 1 to Configuration example 4 can configure the circuit BF1 having a function of correcting the threshold voltages of the transistor Tr01 and the transistor Tr02.

Figure 24:
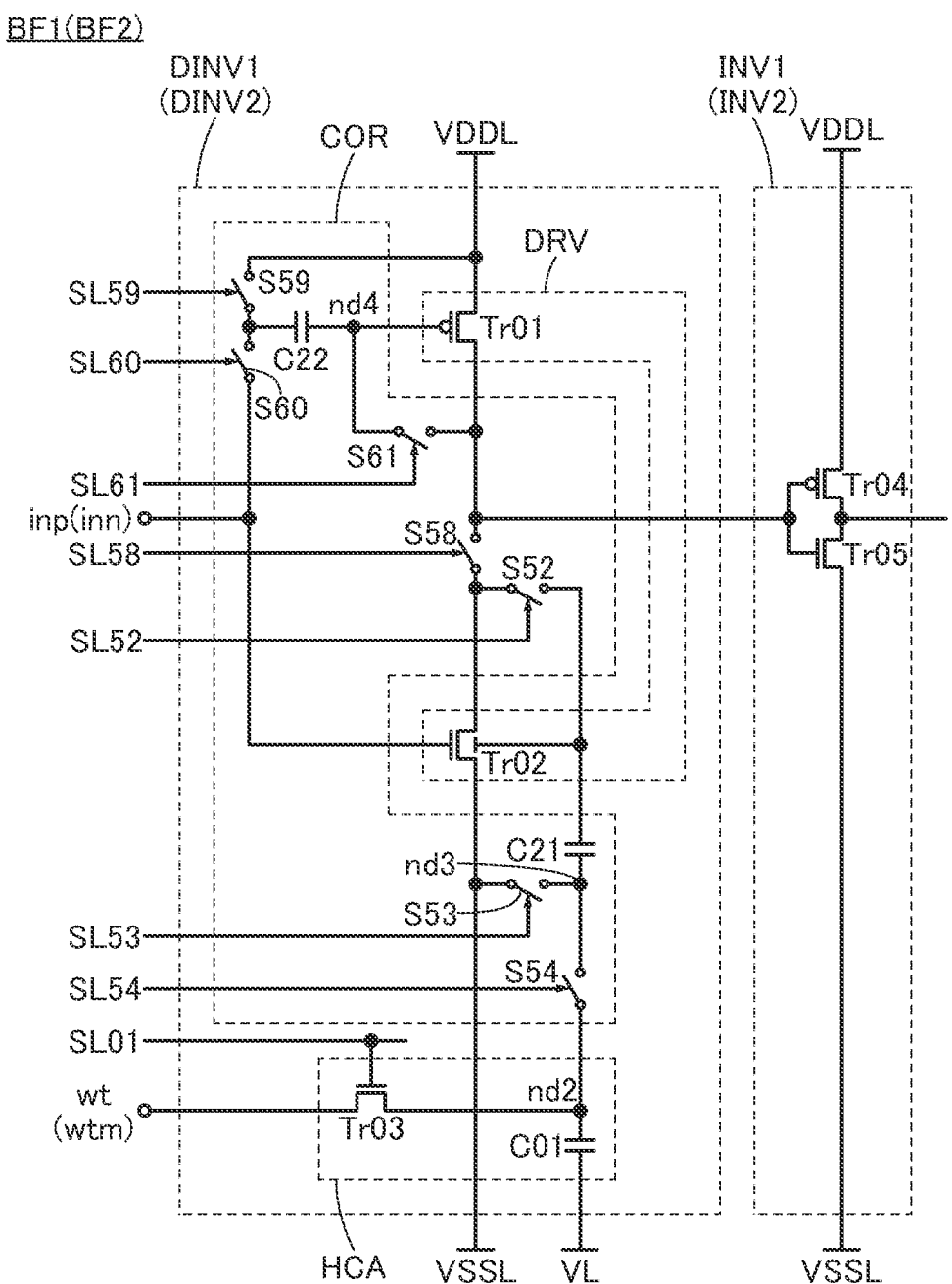
FIG. 24 A circuit diagram illustrating a configuration example of a circuit included in a semiconductor device.

As an example, FIG. 24 illustrates an example of a configuration in which the circuit BF1 in FIG. 16(A) described in Configuration example 1 and the circuit BF1 in FIG. 20(A) described in Configuration example 3 are combined. Note that the switch S58 of the circuit BF1 illustrated in FIG. 24 can also function as a substitute for the switch S51 in the correction unit COR of the circuit BF1 in FIG. 16(A). That is, the circuit BF1 in FIG. 24 is configured such that the switch S51 included in the circuit BF1 in FIG. 16(A) and the switch S58 included in the circuit BF1 in FIG. 20(A) are the same switch. When the circuit BF1 in FIG. 24 is used in the circuit MPC in the foregoing embodiment, the threshold voltages of the transistor Tr01 and the transistor Tr02 included in the circuit BF1 can be corrected. In this case, the wiring SL52 to the wiring SL54 and the wiring SL58 to the wiring SL61 correspond to the wiring CL in FIG. 15(A) (the reference numeral of the wiring CL is not shown in FIG. 24).

Figure 25:
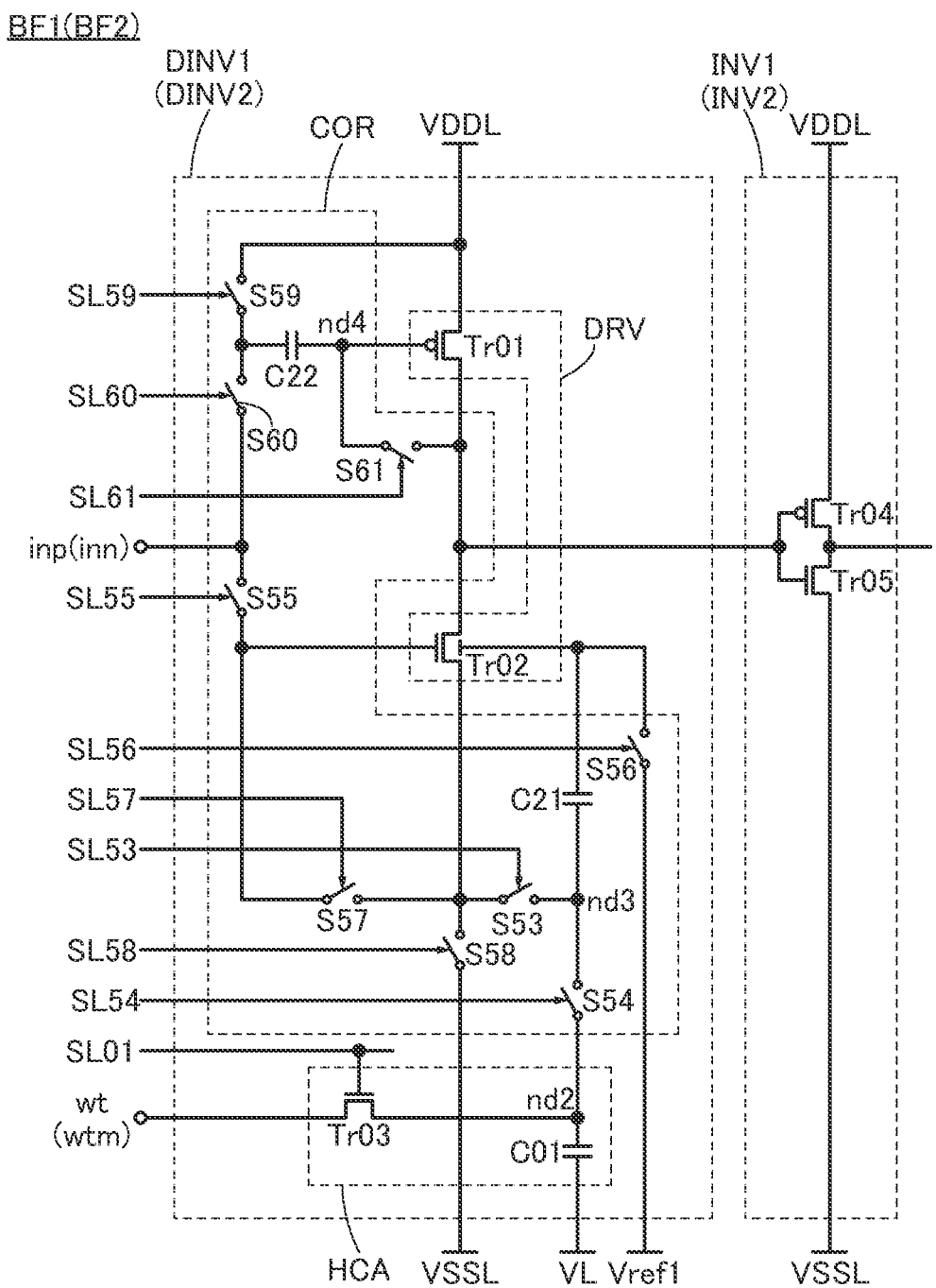
FIG. 25 A circuit diagram illustrating a configuration example of a circuit included in a semiconductor device.

As another example, FIG. 25 illustrates an example of a configuration in which the circuit BF1 in FIG. 18 described in Configuration example 2 and the circuit BF1 in FIG. 20(A) described in Configuration example 3 are combined. When the circuit BF1 illustrated in FIG. 25 is used in the circuit MPC in the foregoing embodiment, the threshold voltages of the transistor Tr01 and the transistor Tr02 included in the circuit BF1 can be corrected. In this case, the wiring SL54 to the wiring SL61 correspond to the wiring CL in FIG. 15(A) (the reference numeral of the wiring CL is not shown in FIG. 25).

Figure 26:
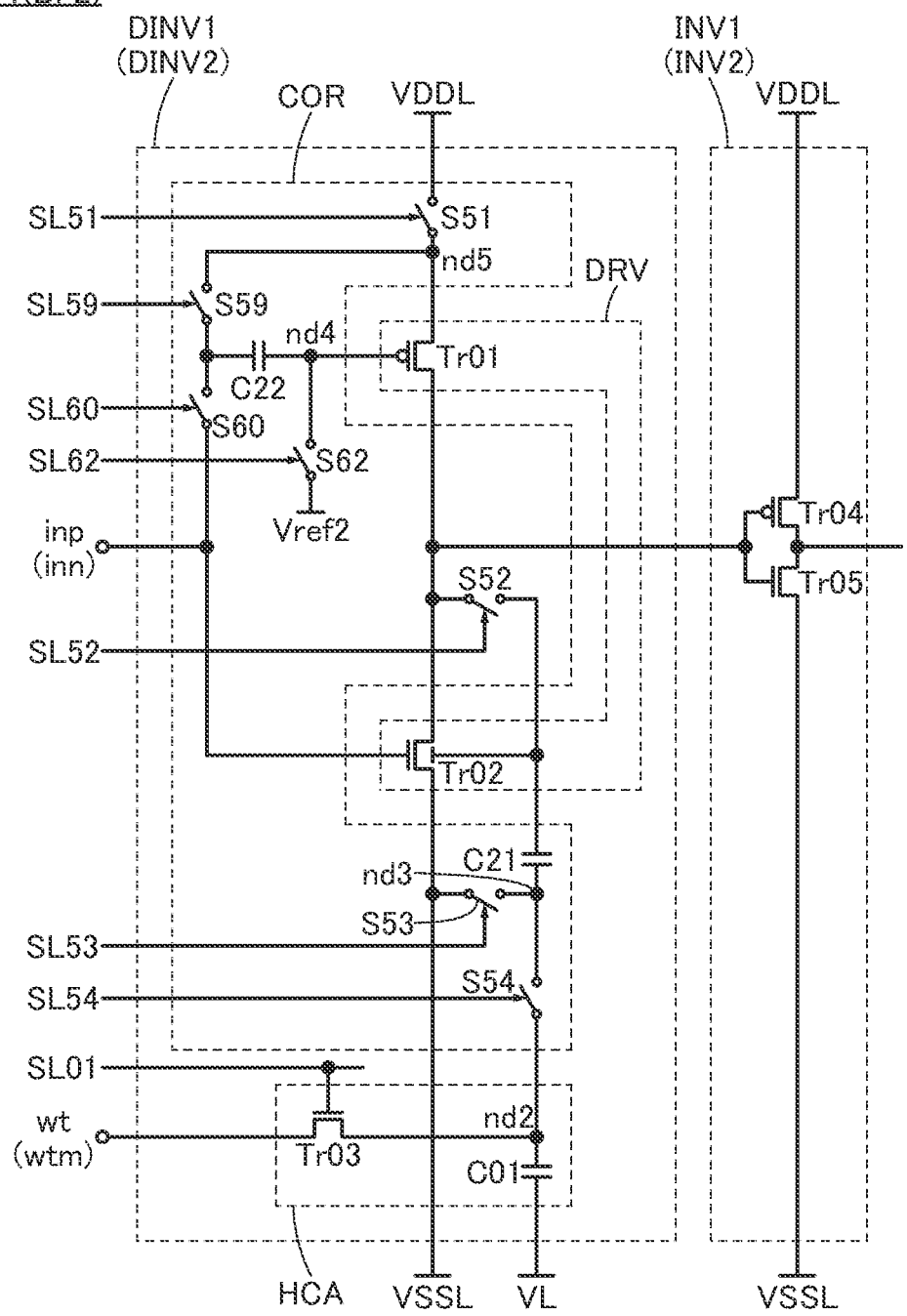
FIG. 26 A circuit diagram illustrating a configuration example of a circuit included in a semiconductor device.

As another example, FIG. 26 illustrates an example of a configuration in which the circuit BF1 in FIG. 16(B) described in Configuration example 1 and the circuit BF1 in FIG. 22 described in Configuration example 4 are combined. Note that the circuit BF1 illustrated in FIG. 26 is configured such that the switch S51 included in the circuit BF1 in FIG. 16(B) and the switch S51 included in the circuit BF1 in FIG. 22 are the same switch. When the circuit BF1 in FIG. 26 is used in the circuit MPC in the foregoing embodiment, the threshold voltages of the transistor Tr01 and the transistor Tr02 included in the circuit BF1 can be corrected. In this case, the wiring SL51 to the wiring SL54, the wiring SL59, the wiring SL60, and the wiring SL62 correspond to the wiring CL in FIG. 15(A) (the reference numeral of the wiring CL is not shown in FIG. 26).

Figure 27:
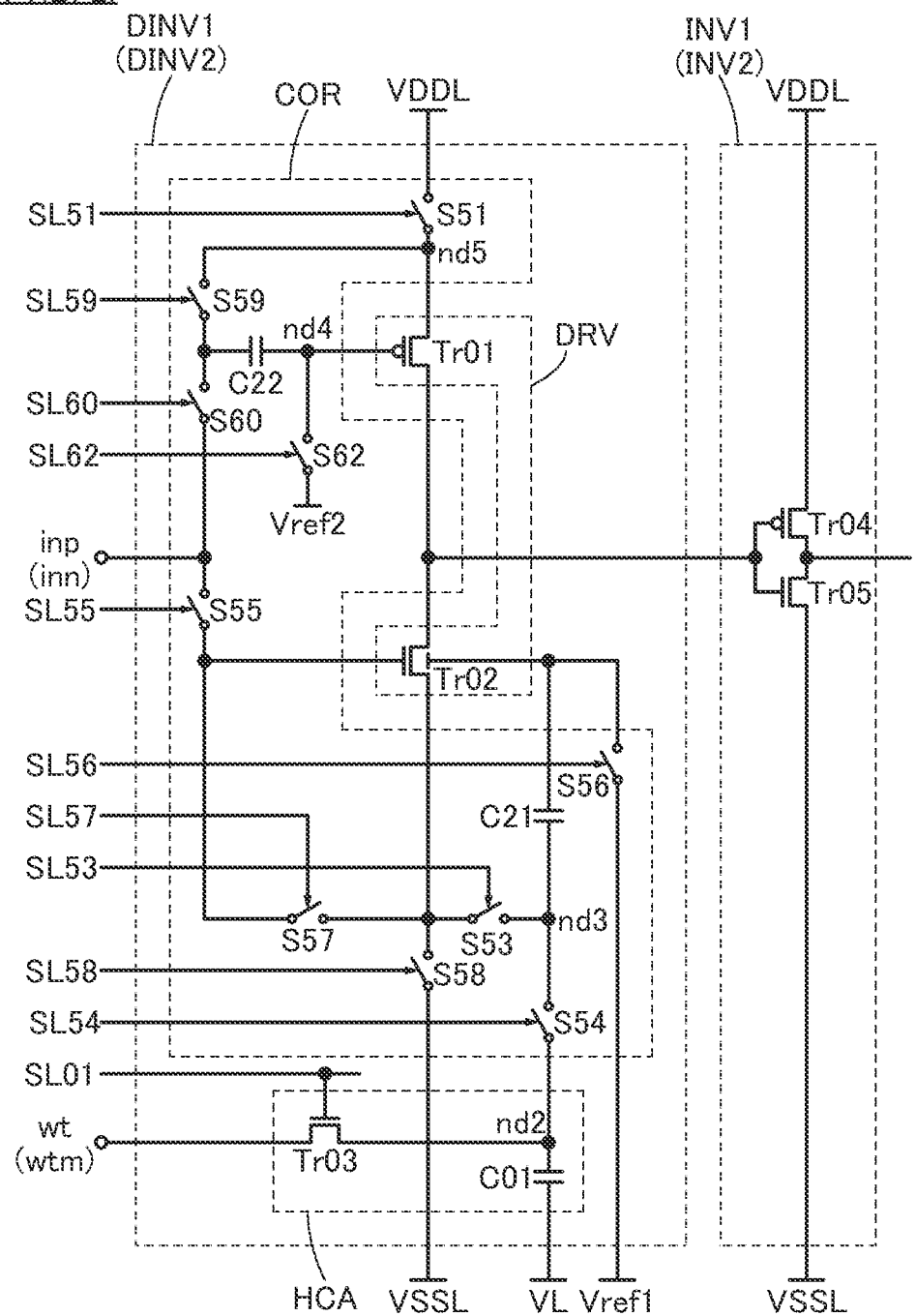
FIG. 27 A circuit diagram illustrating a configuration example of a circuit included in a semiconductor device.

As another example, FIG. 27 illustrates an example of a configuration in which the circuit BF1 in FIG. 18 described in Configuration example 2 and the circuit BF1 in FIG. 22 described in Configuration example 4 are combined. When the circuit BF1 illustrated in FIG. 27 is used in the circuit MPC in the foregoing embodiment, the threshold voltages of the transistor Tr01 and the transistor Tr02 included in the circuit BF1 can be corrected. In this case, the wiring SL51, the wiring SL53 to the wiring SL60, and the wiring SL62 correspond to the wiring CL in FIG. 15(A) (the reference numeral of the wiring CL is not shown in FIG. 27).

CONFIGURATION EXAMPLE 6

Configuration example 5 shows the examples where Configuration example 1 or Configuration example 2 and Configuration example 3 or Configuration example 4, which have been described in this embodiment, are combined; however, one embodiment of the present invention is not limited thereto. For example, Configuration example 1 to Configuration example 4 can be combined with the inverter circuit DINV1 described in Embodiment 3.

Figure 28:
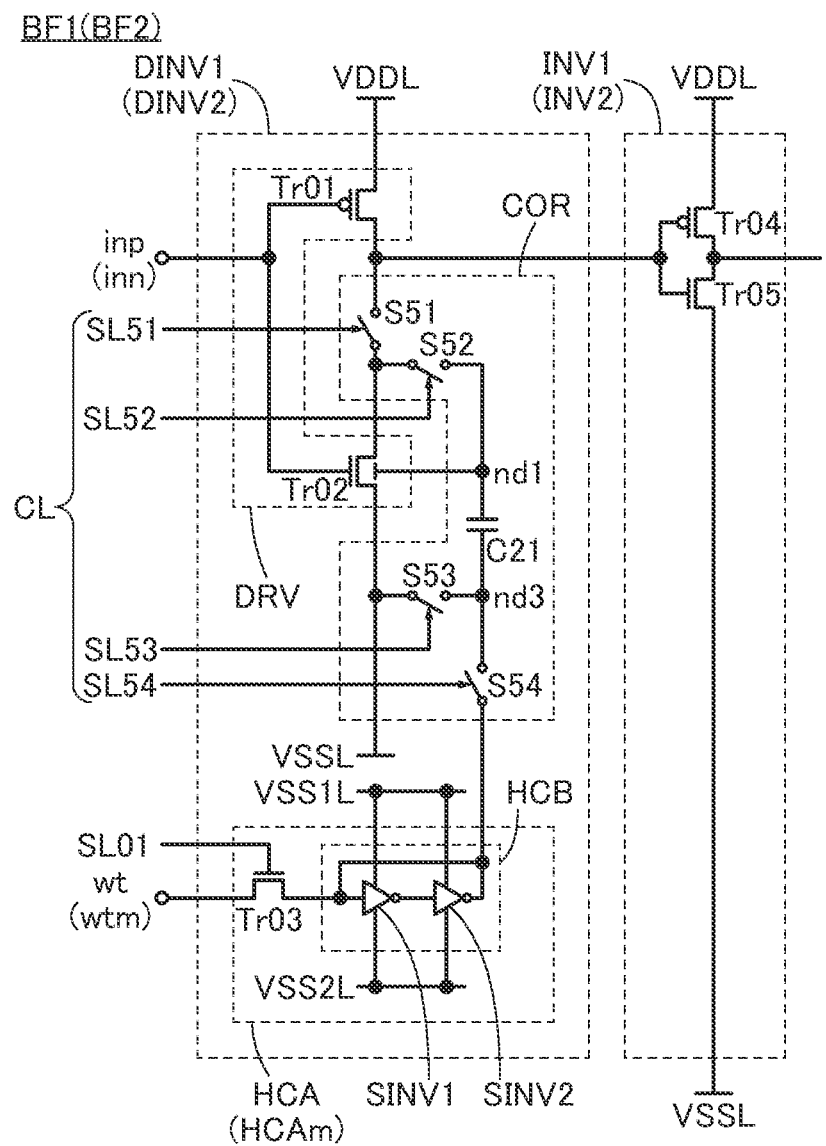
FIG. 28 A circuit diagram illustrating a configuration example of a circuit included in a semiconductor device.

For example, the circuit BF1 in FIG. 16(A) described in Configuration example 1 and the inverter circuit DINV1 in FIG. 12(B) described in Embodiment 3 can be combined to constitute the circuit BF1 illustrated in FIG. 28. The circuit BF1 illustrated in FIG. 28 has a configuration where the holding unit HCA in FIG. 16(A) is replaced with a circuit in which the holding unit HCB in FIG. 12(B) and the transistor Tr03 are combined.

In FIG. 28, the output terminal of the inverter circuit SINV1 is electrically connected to the input terminal of the inverter circuit SINV2; the output terminal of the inverter circuit SINV2 is electrically connected to the second terminal of the switch S54, the input terminal of the inverter circuit SINV1, and the first terminal of the transistor Tr03; and the second terminal of the transistor Tr03 is electrically connected to the terminal wt.

Like the transistor Tr03 included in the circuit BF1 in FIG. 16(A), the transistor Tr03 functions as a switching element for holding a potential corresponding to a weight coefficient that is input from the terminal wt. Note that in some cases, the transistor Tr03 is not necessarily provided in the inverter circuit DINV1 in FIG. 28, as in the case of the inverter circuit DINV1 in FIG. 12(B).

The description of FIG. 12(B) in Embodiment 3 is referred to for the holding unit HCB.

Figure 29:
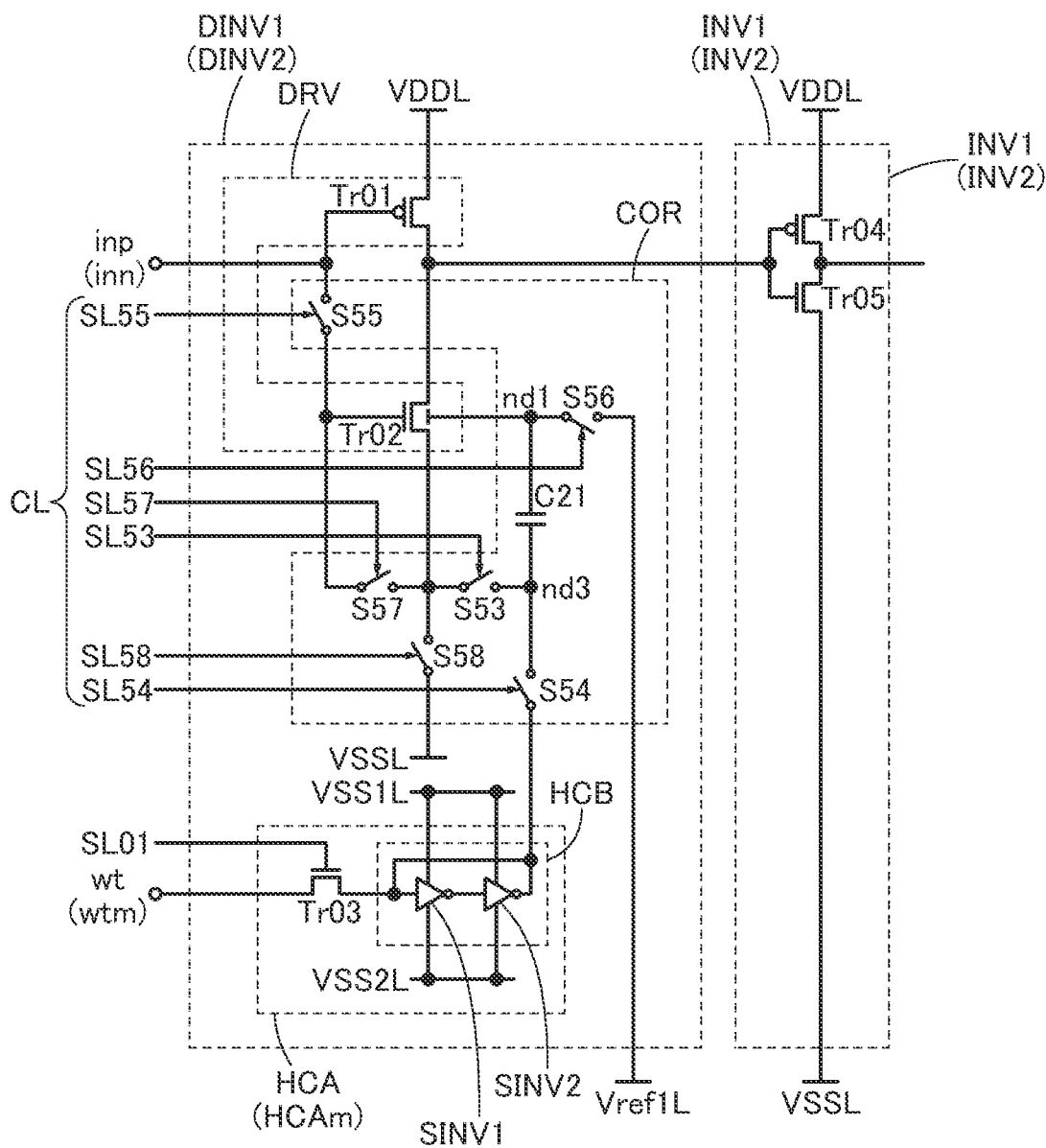
FIG. 29 A circuit diagram illustrating a configuration example of a circuit included in a semiconductor device.

FIG. 28 illustrates the circuit in which the holding unit HCA in FIG. 16(A) is combined with the holding unit HCB in FIG. 12(B) and the transistor Tr03; another example is a circuit in which HCA included in the circuit BF1 in FIG. 18 is combined with the holding unit HCB in FIG. 12(B) and the transistor Tr03 (see FIG. 29).

Figure 30:
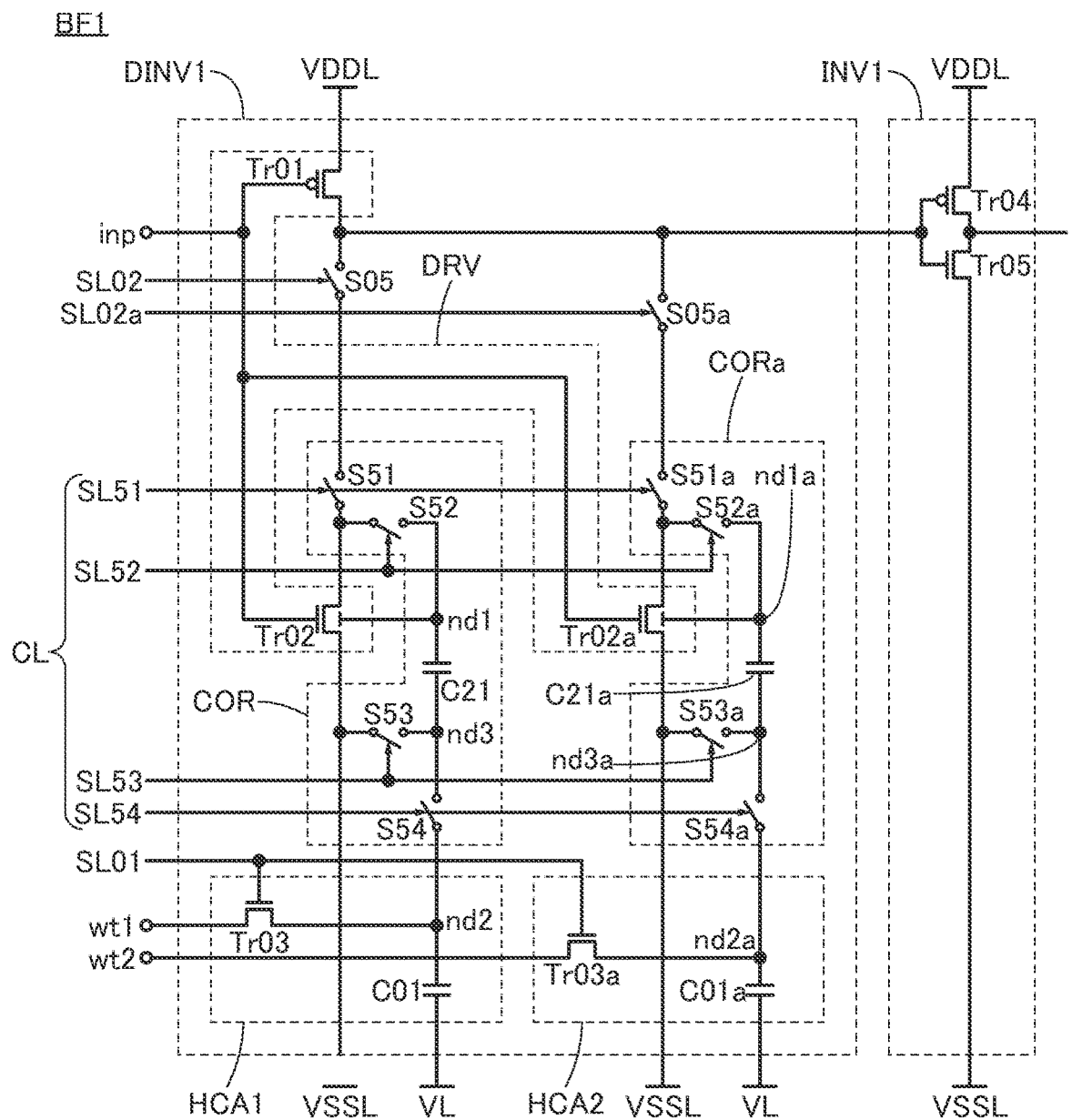
FIG. 30 A circuit diagram illustrating a configuration example of a circuit included in a semiconductor device.

For example, the circuit BF1 in FIG. 16(A) described in Configuration example 1 and the inverter circuit DINV1 in FIG. 14(A) described in Embodiment 3 can be combined to constitute the circuit BF1 illustrated in FIG. 30. Like the circuit BF1 in FIG. 14(A) in Embodiment 3, the circuit BF1 illustrated in FIG. 30 has a circuit configuration in which two weight coefficients can be held and the weight coefficients can be switched according to circumstances.

Since the circuit BF1 in FIG. 30 is configured to switch two weight coefficients, the driver unit DRV included in the circuit BF1 in FIG. 30 has a configuration in which the transistor Tr02a is added to the driver unit DRV of the circuit BF1 in FIG. 16(A). To correct the threshold voltage of the transistor Tr02a, the inverter circuit DINV1 includes a correction unit CORa having the same circuit configuration as the correction unit COR. Furthermore, to hold two potentials corresponding to weight coefficients, the inverter circuit DINV1 includes the holding unit HCA1 and the holding unit HCA2 that have the same circuit configuration as the holding unit HCA included in the inverter circuit DINV1 in FIG. 16(A).

Note that in FIG. 30, the circuit components included in the holding unit HCA1 are denoted by the same reference numerals as the circuit components included in the holding unit HCA of the inverter circuit DINV1 in FIG. 16(A). Meanwhile, to distinguish the circuit components included in the holding unit HCA2 from the circuit components in the holding unit HCA1, "a" is added to the reference numerals of the circuit components included in the holding unit HCA of the inverter circuit DINV1 in FIG. 16(A).

Moreover, to distinguish the circuit components included in the correction unit CORa from the circuit components included in the correction unit COR, "a" is added to the reference numerals.

Unlike in FIGS. 15(A) and 15(B), FIGS. 16(A) and 16(B), FIG. 18, FIGS. 20(A) and 20(B), FIG. 22, and FIG. 24 to FIG. 29, parentheses and reference numerals in the parentheses that represent the components of the circuit BF2 are omitted in FIG. 30; however, the circuit BF1 in FIG. 30 can also be applied to the circuit BF2.

The second terminal of the transistor Tr01 is electrically connected to the first terminal of the switch S05, the first terminal of the switch S05a, and the input terminal of the inverter circuit INV1. The second terminal of the switch S05 is electrically connected to the first terminal of the switch S51 in the correction unit COR, and the second terminal of the switch S05a is electrically connected to a first terminal of a switch S51a in the correction unit CORa. The switch S51 and the switch S51a have a function of selecting from weight coefficients held in the holding unit HCA1 and the holding unit HCA2. For example, in the case of using the weight coefficient held in the holding unit HCA1, the switch S05 is turned on and the switch S05a is turned off; in the case of using the weight coefficient held in the holding unit HCA2, the switch S05 is turned off and the switch S05a is turned on. To correct the threshold voltages of the transistor Tr02 and the transistor Tr02a, the switch S51 and the switch S51a can be turned on at the same time.

A control terminal of the switch S51a is electrically connected to the wiring SL51, a control terminal of a switch S52a is electrically connected to the wiring SL52, a control terminal of a switch S53a is electrically connected to the wiring SL53, and a control terminal of a switch S54a is electrically connected to the wiring SL54. In other words, the switch S51a to the switch S54a in the correction unit CORa are respectively switched in the same manner as the switch S51 to the switch S54 in the correction unit COR; hence, correction of the threshold voltage of the transistor Tr02a can be performed at the same time as correction of the threshold voltage of the transistor Tr02.

CONFIGURATION EXAMPLE 7

Configuration example 1 to Configuration example 6 show the circuits BF1 each having the circuit configuration applicable to the circuit BF1 in FIG. 15(A); the driver unit DRV and/or the inverter circuit INV1 described in Configuration example 1 to Configuration example 6 may be replaced with the logic circuit LGC1 or the logic circuit LGC2 each having a function of an inverter circuit, as in the configuration example of the circuit BF1 in FIG. 15(B).

Figure 31A:
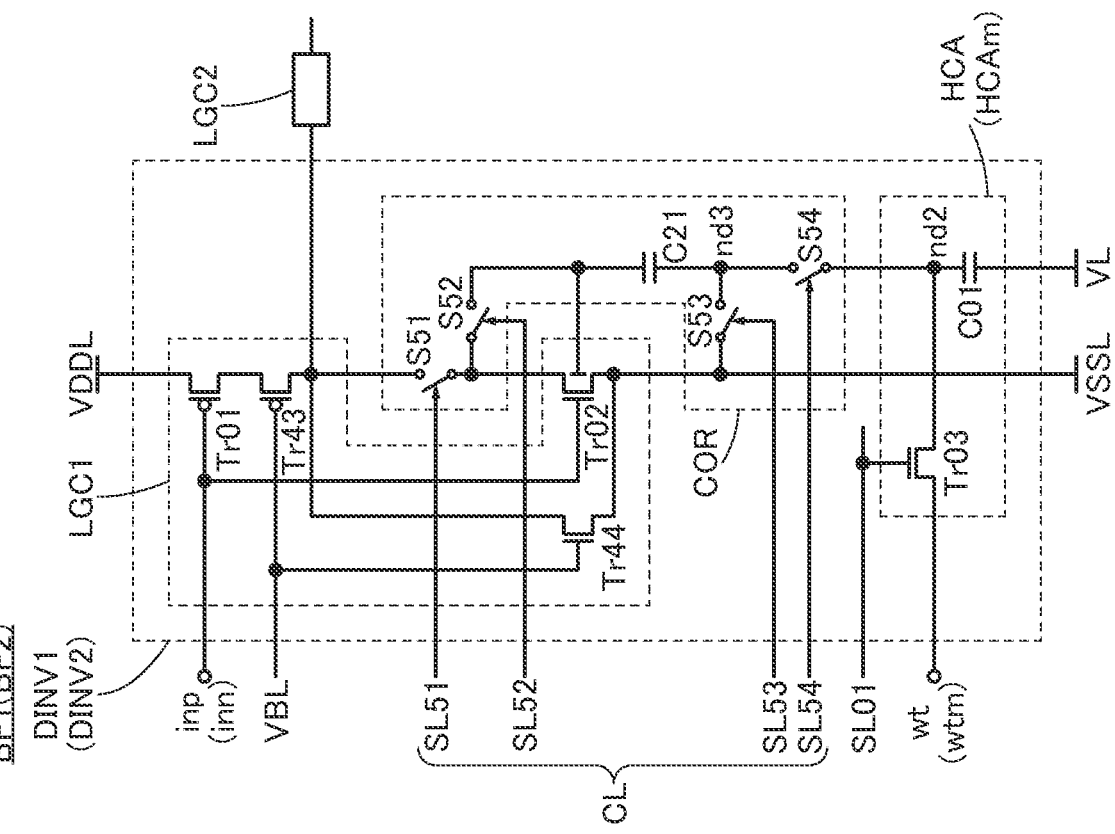
FIGS. 31(A), (B) Circuit diagrams illustrating configuration examples of a circuit included in a semiconductor device.

As an example, FIG. 31(A) illustrates a circuit configuration in which the driver unit DRV and the inverter circuit INV1 in FIG. 16(A) described in Configuration example 1 are replaced with the logic circuit LGC1 and the logic circuit LGC2, respectively. Note that in FIG. 31(A), the logic circuit LGC1 has a configuration of a NAND circuit as an example.

In FIG. 31(A), the logic circuit LGC1 includes the transistor Tr01, the transistor Tr02, a transistor Tr41, and a transistor Tr42, and the NAND circuit is configured with these transistors. Specifically, the first terminal of the transistor Tr01 is electrically connected to the wiring VDDL, the second terminal of the transistor Tr01 is electrically connected to a first terminal of the transistor Tr41 and an input terminal of the logic circuit LGC2, and the gate of the transistor Tr01 is electrically connected to the terminal inp and the gate of the transistor Tr02. A second terminal of the transistor Tr41 is electrically connected to the first terminal of the switch S51, and a gate of the transistor Tr41 is electrically connected to a gate of the transistor Tr42 and a wiring VAL. A first terminal of the transistor Tr42 is electrically connected to the wiring VDDL, and a second terminal of the transistor Tr42 is electrically connected to an input terminal of the logic circuit LGC2. The second terminal of the switch S51 is electrically connected to the first terminal of the transistor Tr02.

The description of FIG. 16(A) is referred to for the connection structures other than the above.

The wiring VAL functions as a wiring for supplying a constant voltage. The constant voltage is preferably a high-level potential. When the wiring VAL serves as a wiring for supplying a high-level potential, the logic circuit LGC1 in FIG. 31(A) can function as an inverter circuit.

The connection structure around the transistor Tr02 included in the circuit BF1 in FIG. 31(A) is similar to the connection structure around the transistor Tr02 in the circuit BF1 in FIG. 16(A). That is, like the circuit BF1 in FIG. 16(A), the circuit BF1 in FIG. 31(A) is capable of correcting the threshold voltage of the transistor Tr02 included in the logic circuit LGC1.

Although configured as a NAND circuit in FIG. 30(A), the logic circuit LGC1 may be configured as a NOR circuit, for example. In the circuit BF1 in FIG. 31(B), the logic circuit LGC1 is configured as a NOR circuit as an example.

Figure 31B:
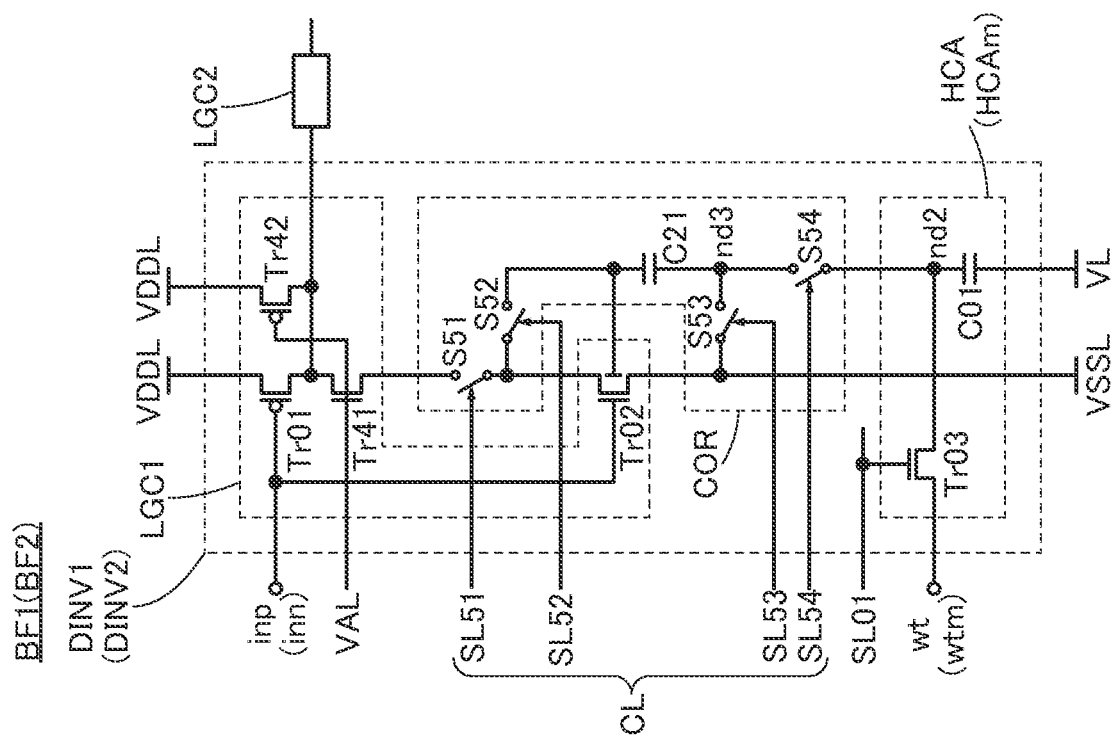

In FIG. 31(B), the logic circuit LGC1 includes the transistor Tr01, the transistor Tr02, a transistor Tr43, and a transistor Tr44, and the NOR circuit is configured with these transistors. Specifically, the first terminal of the transistor Tr01 is electrically connected to the wiring VDDL, the second terminal of the transistor Tr01 is electrically connected to a first terminal of the transistor Tr43, and the gate of the transistor Tr01 is electrically connected to the terminal inp and the gate of the transistor Tr02. A second terminal of the transistor Tr43 is electrically connected to the first terminal of the switch S51, the input terminal of the logic circuit LGC2, and a first terminal of the transistor Tr44; and a gate of the transistor Tr43 is electrically connected to a gate of the transistor Tr44 and a wiring VBL. The first terminal of the transistor Tr02 is electrically connected to the second terminal of the switch S51, and the second terminal of the transistor Tr02 is electrically connected to a second terminal of the transistor Tr44. The second terminal of the switch S51 is electrically connected to the first terminal of the transistor Tr02.

The description of FIG. 16(A) is referred to for the connection structures other than the above.

The wiring VBL functions as a wiring for supplying a constant voltage. The constant voltage is preferably a low-level potential. When the wiring VBL serves as a wiring for supplying a low-level potential, the logic circuit LGC1 in FIG. 31(B) can function as an inverter circuit.

The connection structure around the transistor Tr02 included in the circuit BF1 in FIG. 31(B) is similar to the connection structure around the transistor Tr02 in the circuit BF1 in FIG. 16(A). That is, like the circuit BF1 in FIG. 16(A), the circuit BF1 in FIG. 31(B) is capable of correcting the threshold voltage of the transistor Tr02 included in the logic circuit LGC1.

As described above, even when the driver unit DRV and/or the inverter circuit INV1 in FIG. 15(A) are/is replaced with the logic circuit LGC1 or the logic circuit LGC2 having a function of an inverter circuit as in the configuration example of the circuit BF1 in FIG. 15(B), the circuit BF1 in FIG. 15(B) can have a function similar to that of the circuit BF1 in FIG. 15(A). Accordingly, the inverter circuit DINV1 (the inverter circuit DINV2) (to be exact, the driver unit DRV having a function of an inverter circuit) and/or the inverter circuit INV1 (the inverter circuit INV2) described in this specification and the like can be configured as a logic circuit such as a NAND circuit or a NOR circuit. Moreover, the inverter circuit DINV1 (the inverter circuit DINV2) (the driver unit DRV having a function of an inverter circuit) and/or the inverter circuit INV1 (the inverter circuit INV2) may be a logic circuit in which a NAND circuit, a NOR circuit, an XOR circuit, and/or the like are combined.

<Configuration Example of Arithmetic Circuit>

Here, the description will be made on an example of an arithmetic circuit in which the circuit BF1 described in Configuration example 1 to Configuration example 7 is used in the circuit MPC described in Embodiment 1 and the circuits MPC are arranged in a matrix as in the arithmetic circuit 120 described in Embodiment 2.

First, the description is made on a configuration example of the circuit MPC using the circuit BF1 (the circuit BF2) in FIG. 16(A) described in Configuration example 1 and wirings electrically connected to the circuit MPC. The circuit MPC illustrated in FIG. 32(A) includes the circuit BF1 in FIG. 16 and the circuit BF2 having the same configuration as the circuit BF1.

Figure 32A:
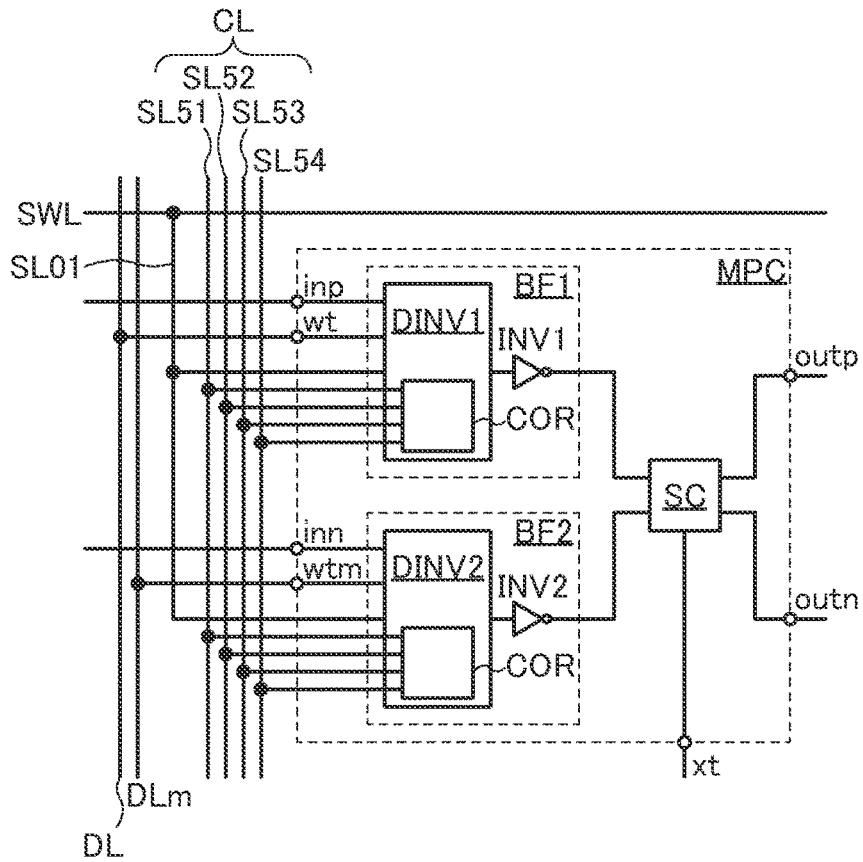
FIGS. 32(A), (B) Block diagrams illustrating configuration examples of a circuit included in a semiconductor device.

In FIG. 32(A), the correction unit COR is shown in each of the inverter circuit DINV1 and the inverter circuit DINV2 included in the circuit MPC. The wiring SL51 to the wiring SL54 can be electrically connected to each of the correction units COR; with such a connection structure, the threshold voltages of the transistors Tr02 (not illustrated) included in the inverter circuit DINV1 and the inverter circuit DINV2 can be corrected at the same time.

Figure 32B:
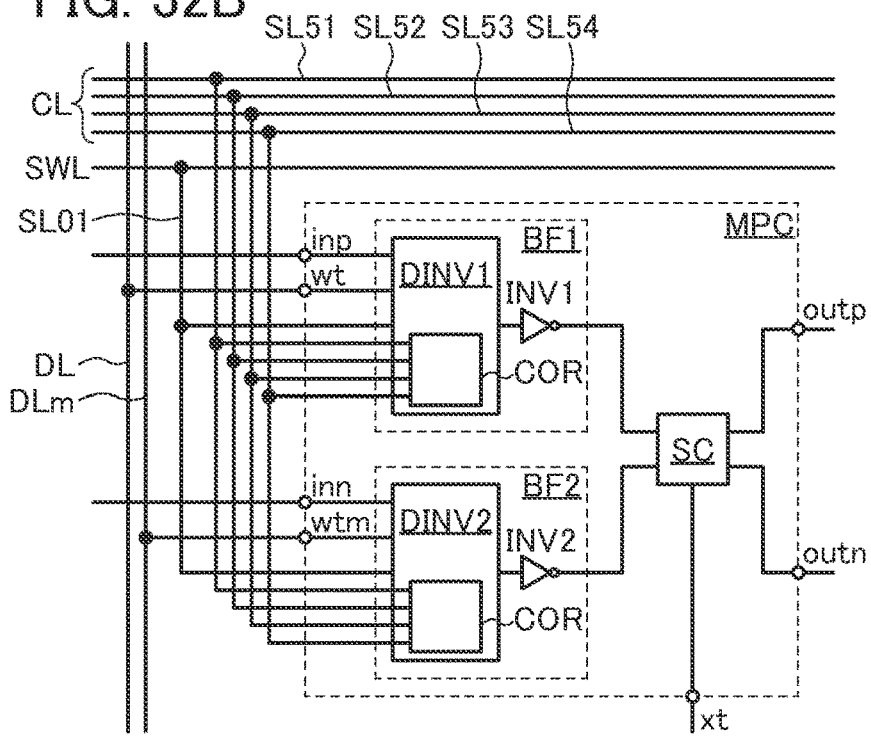

In FIG. 32(A), the wiring SL51 to the wiring SL54 are collectively denoted as the wiring CL. The wiring CL can extend in the column direction, for example. As another example, the wiring CL may extend in the row direction, as illustrated in FIG. 32(B). As another example, some of the wiring SL51 to the wiring SL54 may extend in the column direction and the other may extend in the row direction (not illustrated).

FIGS. 32(A) and 32(B) illustrate circuit configurations in which the circuit BF1 (the circuit BF2) in FIG. 16(A) of Configuration example 1 is used in the circuit MPC, and thus show the wiring SL51 to the wiring SL54 as the wiring CL; when the circuit BF1 (the circuit BF2) described in a different configuration example is used in the circuit MPC, wirings corresponding to the wiring CL may be different from the wiring SL51 to the wiring SL54. For example, when the circuit BF1 (the circuit BF2) in FIG. 20(A) of Configuration example 3 is used in the circuit MPC, the wiring SL51 and the wiring SL59 to the wiring SL61 correspond to the wiring CL; when the circuit BF1 (the circuit BF2) in FIG. 26 of Configuration example 5 is used in the circuit MPC, the wiring SL51 to the wiring SL54, the wiring SL59, the wiring SL60, and the wiring SL62 correspond to the wiring CL.

The terminal wt electrically connected to the inverter circuit DINV1 is electrically connected to the wiring DL, and the terminal wt electrically connected to the inverter circuit DINV2 is electrically connected to the wiring DLm. The wiring SL01 electrically connected to the inverter circuit DINV1 and the inverter circuit DINV2 is electrically connected to the wiring SWL.

The wiring DL and/or the wiring DLm can extend in the column direction, for example. In addition, the wiring SWL can extend in the row direction, for example. Note that the directions where the wiring DL, the wiring DLm, and the wiring SWL in the circuit MPC illustrated in FIGS. 32(A) and 32(B) extend are the same as the directions where the wiring DL, the wiring DLm, and the wiring SWL connected to the circuit MPC illustrated in FIG. 9 extend.

As an example, the circuits MPC in FIGS. 32(A) and 32(B) can have a configuration in which the wiring DL is extended in the column direction and the wiring SWL and the wiring SWLm are extended in the row direction as in the circuit MPC illustrated in FIG. 11. In this case, the circuits MPC in FIGS. 32(A) and 32(B) have a configuration in which the terminal wt and the terminal wtm are electrically connected to the wiring DL, the wiring SL01 of the inverter circuit DINV1 is electrically connected to the wiring SWL, and the wiring SL01 of the inverter circuit DINV2 is electrically connected to the wiring SWLm (not illustrated). The description of FIG. 11 is referred to for the detailed connection structures.

Figure 33:
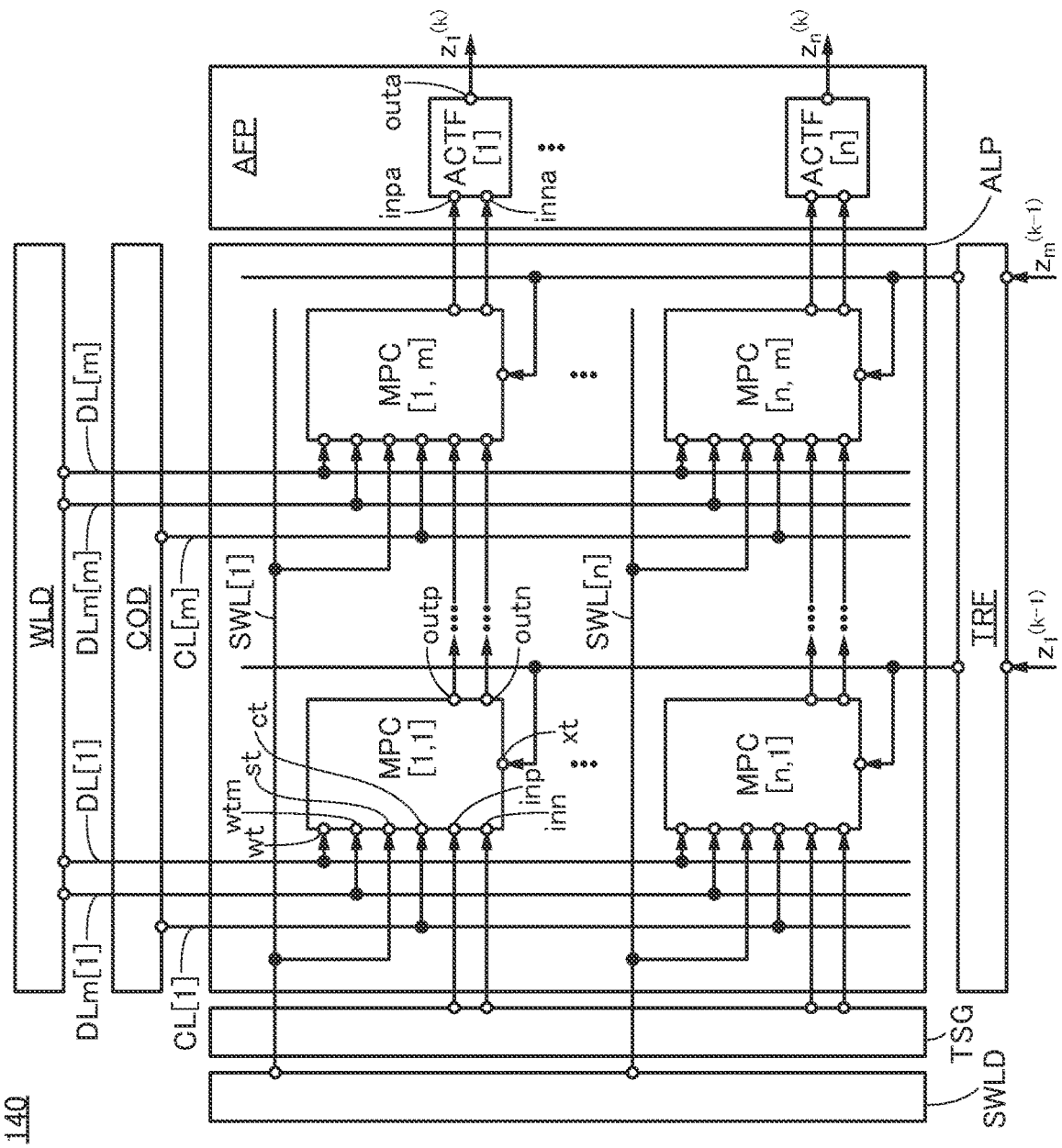
FIG. 33 A block diagram illustrating a structure example of a semiconductor device.

Next, FIG. 33 illustrates a structure example of an arithmetic circuit in which the circuits MPC in FIG. 32(A) are arranged in a matrix.

An arithmetic circuit 140 has a structure in which the circuit MPC in FIG. 32(A) is used and a circuit COD is additionally provided in the structure of the arithmetic circuit 120 in FIG. 9 described in Embodiment 2. Therefore, the description in Embodiment 2 is referred to for the circuit AFP including a plurality of circuits ACTF, the circuit TSG, the circuit WLD, the circuit SWLD, and the converter circuit TRF illustrated in FIG. 33.

As in the arithmetic circuit 120 in FIG. 9, the array portion ALP includes n×m circuits MPC, and the circuits MPC are arranged in a matrix of n rows and m columns in the array portion ALP. Note that in FIG. 9, the circuit MPC in the j-th row and the i-th column (here, j is an integer greater than or equal to 1 and less than or equal to n, and i is an integer greater than or equal to 1 and less than or equal to m) is denoted as the circuit MPC[j,i]. Note that FIG. 33 illustrates only the circuit MPC[1,1], the circuit MPC[1,m], the circuit MPC[n,1], and the circuit MPC[n,m] and does not show the other circuits MPC.

For convenience, FIG. 33 illustrates a terminal ct for each of the circuit MPC[1,1] to the circuit MPC[n,m]. The terminal ct functions as a terminal for supplying a signal to the correction units COR of the inverter circuit DINV1 and the inverter circuit DINV2 included in each of the circuit MPC[1,1] to the circuit MPC[n,m].

The terminals ct of the circuit MPC[1,i] to the circuit MPC[n,i] are electrically connected to a wiring CL[i]. The wiring CL[i] corresponds to the wiring CL in Configuration example 1 to Configuration example 7, and FIG. 33 illustrates a wiring CL[1] and a wiring CL[m].

The circuit COD has a function of supplying a predetermined signal to the wiring CL[1] to the wiring CL[m] to operate the correction units COR of the inverter circuit DINV1 and the inverter circuit DINV2 included in each of the circuit MPC[1,1] to the circuit MPC[n,m]. As described in the operation example in FIG. 16(A), by supplying a predetermined signal to the wiring SL51 to the wiring SL54 included in each of the wiring CL[1] to the wiring CL[m], the circuit COD can correct the threshold voltages of the transistors Tr02 of the inverter circuit DINV1 and the inverter circuit DINV2 included in each of the circuit MPC[1,1] to the circuit MPC[n,m].

Note that this embodiment can be combined with other embodiments in this specification as appropriate.

Embodiment 5

In this embodiment, an example of a structure of an OS transistor that can be used in the semiconductor device described in the above embodiment will be described.
Structure Example of Semiconductor Device>

Figure 34:
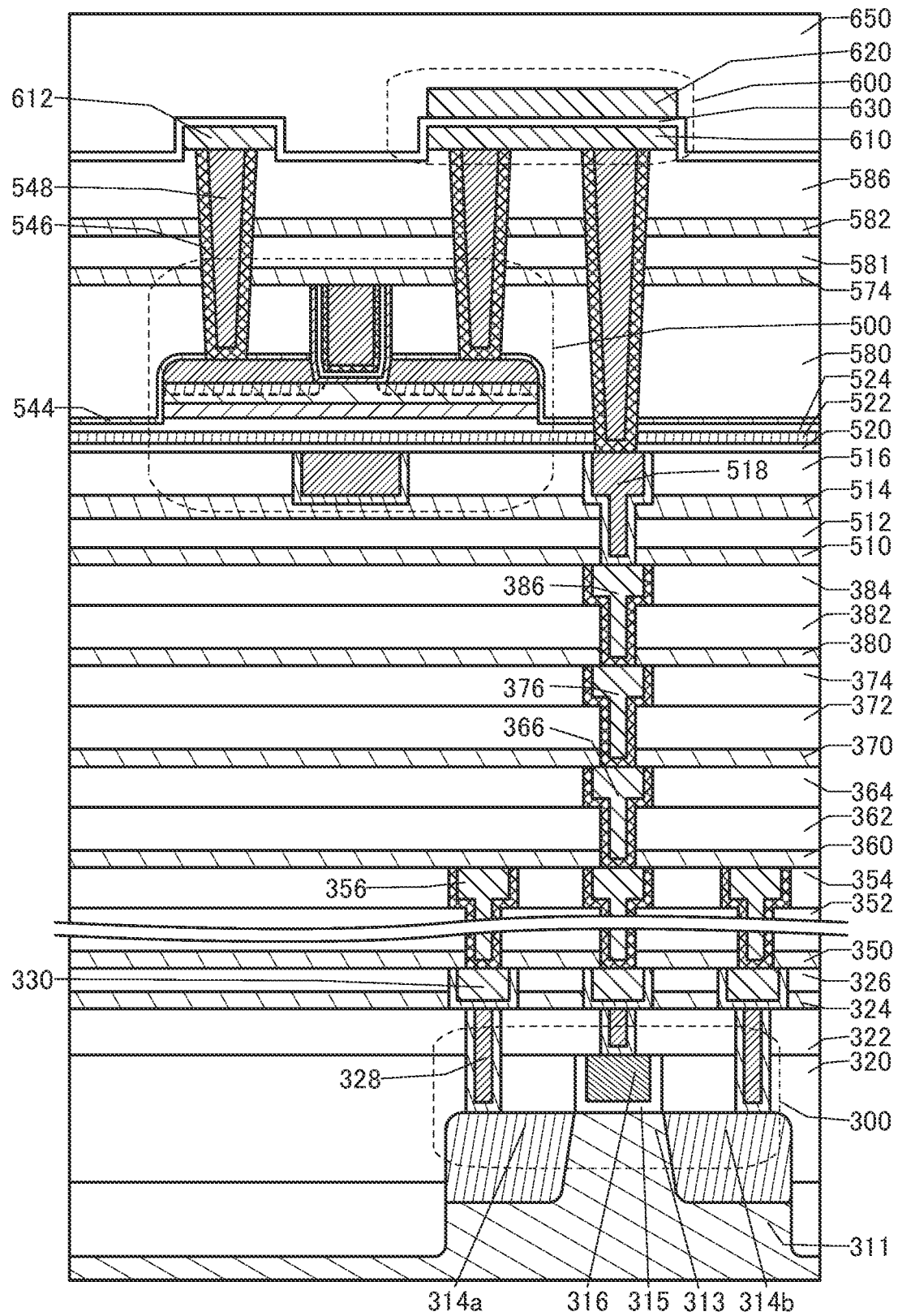
FIG. 34 A cross-sectional view illustrating a structure example of a semiconductor device.
Figure 36A:
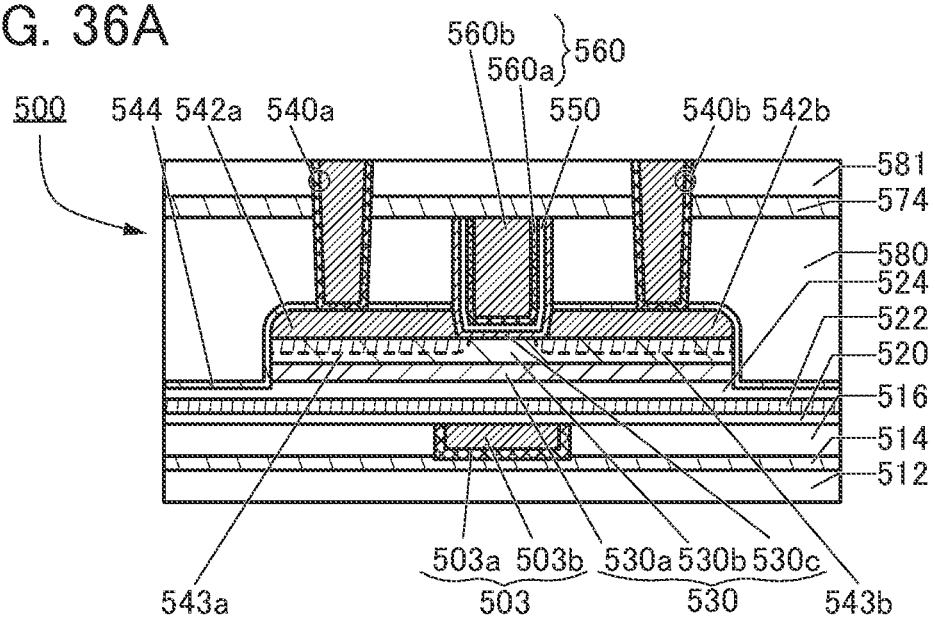
FIGS. 36(A), (B), (C) Cross-sectional views illustrating structure examples of transistors.
Figure 36B:
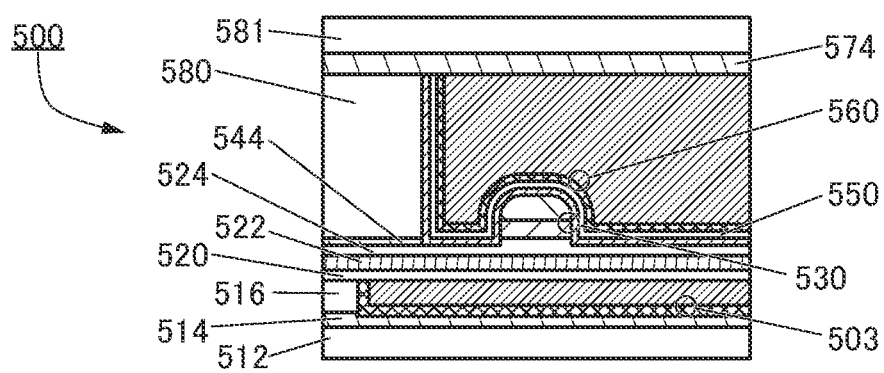
Figure 36C:
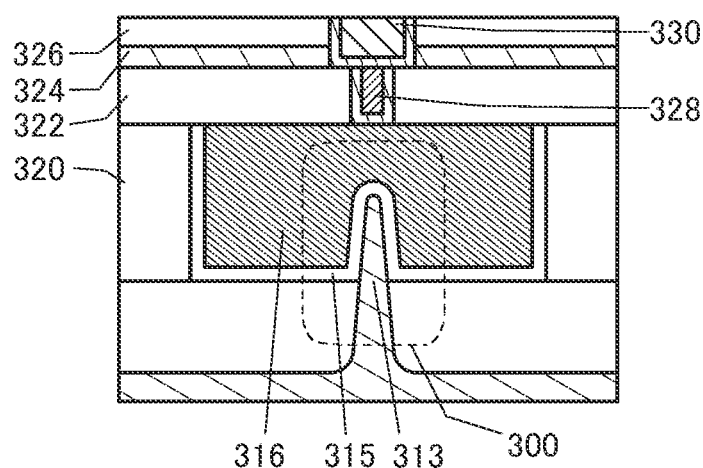

A semiconductor device illustrated in FIG. 34 includes a transistor 300, a transistor 500, and a capacitor 600. FIG. 36(A) is a cross-sectional view of the transistor 500 in the channel length direction, FIG. 36(B) is a cross-sectional view of the transistor 500 in the channel width direction, and FIG. 36(C) is a cross-sectional view of the transistor 300 in the channel width direction.

The transistor 500 is a transistor including a metal oxide in its channel formation region (an OS transistor). Since the off-state current of the transistor 500 is low, the use of the transistor 500 in a semiconductor device, particularly as the transistor Tr03 and the like in the arithmetic circuit 110, enables long-term retention of written data. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as illustrated in FIG. 34. The transistor 500 is provided above the transistor 300, and the capacitor 600 is provided above the transistor 300 and the transistor 500. Note that as the capacitor 600, the capacitor C01 in the circuit BF1 can be used, for example.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as the transistor in the above embodiment, for example.

In the transistor 300, the top surface and the side surface in the channel width direction of the semiconductor region 313 are covered with the conductor 316 with the insulator 315 therebetween, as illustrated in FIG. 36(C). Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 35:
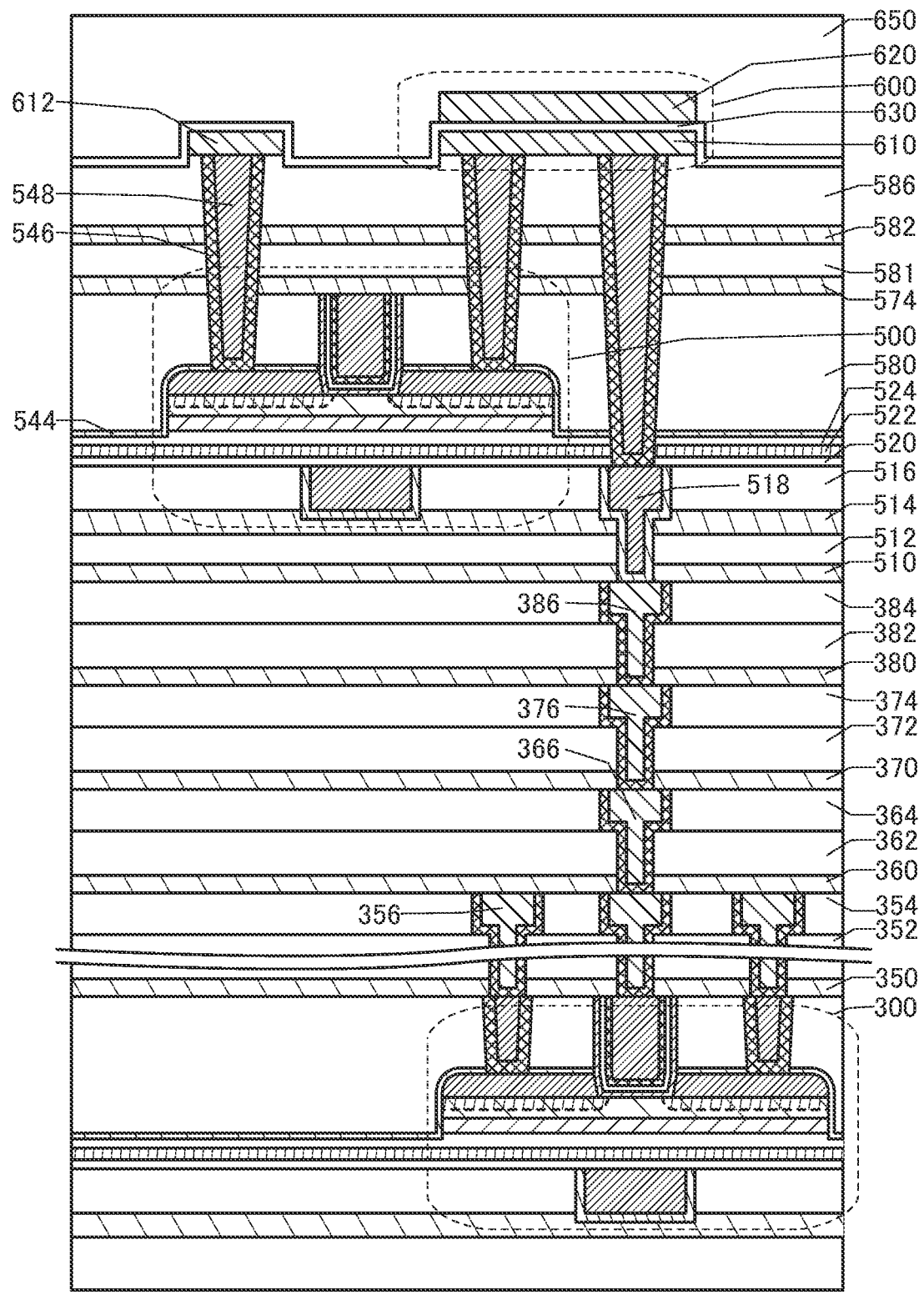
FIG. 35 A cross-sectional view illustrating a structure example of a semiconductor device.

Note that the transistor 300 illustrated in FIG. 34 is just an example and is not limited to having the structure shown therein; an appropriate transistor can be used in accordance with a circuit configuration or a driving method. For example, when a semiconductor device is configured as a single-polarity circuit using only OS transistors, the transistor 300 employs a structure similar to that of the transistor 500 using an oxide semiconductor, as illustrated in FIG. 35. Note that the details of the transistor 500 will be described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low permittivity for an interlayer film can reduce the parasitic capacitance between wirings.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 34, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by the barrier layer, so that the diffusion of hydrogen from the transistor 300 to the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 34, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 34, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 34, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less or five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents hydrogen or impurities from the substrate 311, a region where the transistor 300 is provided, or the like from diffusing to the region where the transistor 500 is provided. Therefore, a material similar to that for the insulator 324 can be used.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Thus, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. The use of a material with a relatively low permittivity for these insulators can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be formed using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 to the transistor 500 can be inhibited.

The transistor 500 is provided over the insulator 516.

As illustrated in FIGS. 36(A) and 36(B), the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and has an opening between the conductor 542a and the conductor 542b, an oxide 530c positioned on a bottom surface and a side surface of the opening, an insulator 550 positioned on the formation surface of the oxide 530c, and a conductor 560 positioned on the formation surface of the insulator 550.

As illustrated in FIGS. 36(A) and 36(B), an insulator 544 is preferably provided between the insulator 580 and the oxide 530a, the oxide 530b, the conductor 542a, and the conductor 542b. As illustrated in FIGS. 36(A) and 36(B), the conductor 560 preferably includes a conductor 560a provided on the inner side of the insulator 550 and a conductor 560b provided to be embedded on the inner side of the conductor 560a. As illustrated in FIGS. 36(A) and 36(B), an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure where the three layers of the oxide 530a, the oxide 530b, and the oxide 530c are stacked in the region where the channel is formed and its vicinity; however, the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. The transistor 500 illustrated in FIG. 34 and FIGS. 36(A) and 36(B) is just an example and is not limited to the structure shown therein; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of the opening in the insulator 514 and the insulator 516, and a conductor 503b is formed further inside. Although the transistor 500 in which the conductor 503a and the conductor 503b are stacked is illustrated, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, the conductor 503b is preferably formed using a conductive material that has high conductivity and contains tungsten, copper, or aluminum as its main component. In that case, a conductor 505 does not always need to be provided. Note that the conductor 503b is a single layer in the diagram but may have a stacked-layer structure, for example, a stacked-layer structure of titanium or titanium nitride and any of the above conductive materials.

The insulator 520, the insulator 522, the insulator 524, and the insulator 550 have a function of a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

When the insulator 524 includes an excess-oxygen region, the insulator 522 preferably has a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be lowered while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high dielectric constant can be obtained.

Note that in the transistor 500 in FIGS. 36(A) and 36(B), the insulator 520, the insulator 522, and the insulator 524 are shown as the second gate insulating film having a stacked-layer structure of three layers; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In-M-Zn oxide that can be used as the oxide 530 is particularly preferably a CAAC—OS or a CAC—OS each of which will be described in Embodiment 6. Alternatively, an In—Ga oxide or an In—Zn oxide may be used as the oxide 530.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can inhibit diffusion of impurities into the oxide 530b from the components formed below the oxide 530a. By including the oxide 530c over the oxide 530b, the oxide 530 can inhibit diffusion of impurities into the oxide 530b from the components formed above the oxide 530c.

The oxide 530 preferably has a stacked-layer structure of oxides that differ in the atomic ratio of metal atoms. Specifically, the atomic proportion of the element M to the constituent elements in the metal oxide used as the oxide 530a is preferably greater than that in the metal oxide used as the oxide 530b. The atomic ratio of the element M to In in the metal oxide used as the oxide 530a is preferably greater than that in the metal oxide used as the oxide 530b. The atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of the oxide 530a and the oxide 530c is preferably higher than that of the oxide 530b. In other words, the electron affinity of the oxide 530a and the oxide 530c is preferably smaller than that of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

Although the conductor 542a and the conductor 542b having a single-layer structure are illustrated in FIG. 36(A), they may have a stacked-layer structure of two or more layers. For example, a tantalum nitride film and a tungsten film can be stacked. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 36(A), a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such cases, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate is preferable because it has higher heat resistance than a hafnium oxide film and thus is less likely to be crystallized by heat treatment in later steps. Note that the insulator 544 is not an essential component when the conductor 542a and the conductor 542b are an oxidation-resistant material or do not significantly lose the conductivity even after absorbing oxygen. Design is appropriately determined in consideration of required transistor characteristics.

The insulator 544 can inhibit impurities such as water and hydrogen contained in the insulator 580 from diffusing into the oxide 530b through the oxide 530c and the insulator 550. The insulator 544 can also inhibit oxidation of the conductor 560 due to excess oxygen contained in the insulator 580.

The insulator 550 functions as a first gate insulating film. The insulator 550 is preferably provided in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 to the conductor 560. Providing the metal oxide that inhibits oxygen diffusion suppresses diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high dielectric constant.

Although the conductor 560 functioning as the first gate electrode has a two-layer structure in FIGS. 36(A) and 36(B), the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. In addition, for the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is formed to be embedded in the opening of the insulator 580 and the region between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is formed by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductor 540a and the conductor 540b each have a structure similar to that of a conductor 546 and a conductor 548 that will be described later.

An insulator 582 is provided over the insulator 581. A material having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be formed using a material similar to that for the insulator 320. The use of a material with a relatively low permittivity for these insulators can reduce the parasitic capacitance between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be formed using a material similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 34; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be formed using a material similar to that for the insulator 320. The insulator 650 may function as a planarization film that covers an uneven shape thereunder.

With the use of this structure, a change in electrical characteristics can be reduced and the reliability can be improved in a semiconductor device including a transistor including an oxide semiconductor. Alternatively, a semiconductor device using a transistor including an oxide semiconductor can be miniaturized or highly integrated.

<Structure Examples of Transistors>

The structure of the transistor 500 in the semiconductor device described in this embodiment is not limited to the above. Structure examples that can be used for the transistor 500 will be described below. Note that transistors described below are variation examples of the above transistor; therefore, differences from the above transistor are mainly described below and the description of portions identical to the above is sometimes omitted.

TRANSISTOR STRUCTURE EXAMPLE 1

Figure 37A:
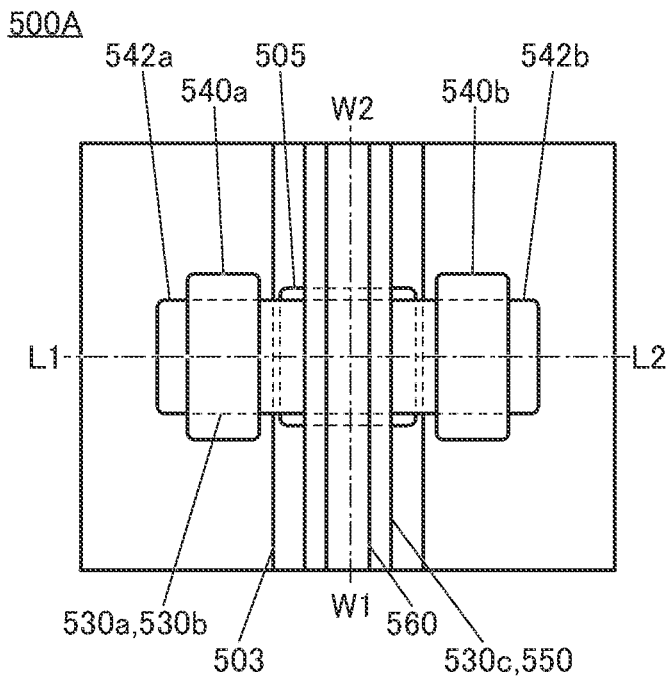
FIG. 37(A) A top view illustrating a structure example of a transistor, and (B), (C) cross-sectional views illustrating the structure example of the transistor.
Figure 37C:
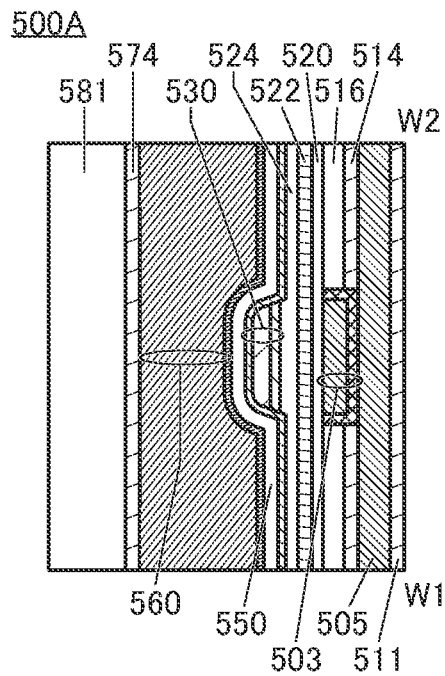
Figure 37B:
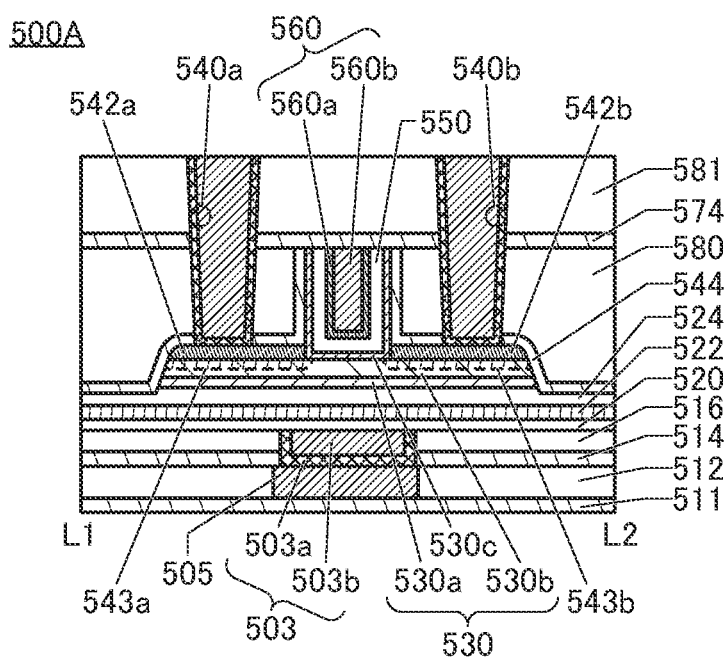

A structure example of a transistor 500A will be described with reference to FIGS. 37(A) to 37(C). FIG. 37(A) is a top view of the transistor 500A. FIG. 37(B) is a cross-sectional view of a portion along the dashed-dotted line L1-L2 in FIG. 37(A). FIG. 37(C) is a cross-sectional view of a portion along the dashed-dotted line W1-W2 in FIG. 37(A). Note that for simplification of the drawing, some components are not illustrated in the top view in FIG. 37(A).

The transistor 500A illustrated in FIGS. 37(A) to 37(C) has a structure where an insulator 511 functioning as an interlayer film and the conductor 505 functioning as a wiring are added to the transistor 500 illustrated in FIG. 36(A).

In the transistor 500A illustrated in FIGS. 37(A) to 37(C), the oxide 530c, the insulator 550, and the conductor 560 are provided in an opening in the insulator 580 with the insulator 544 positioned therebetween. Moreover, the oxide 530c, the insulator 550, and the conductor 560 are provided between the conductor 542a and the conductor 542b.

As the insulator 511, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba,Sr)$TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film for inhibiting impurities such as water or hydrogen from entering the transistor 500A from the substrate side. Accordingly, the insulator 511 is preferably formed using an insulating material having a function of inhibiting diffusion of impurities such as a hydrogen atom, a hydrogen molecule, a water molecule, and a copper atom (an insulating material through which the above impurities are less likely to pass). Alternatively, the insulator 511 is preferably formed using an insulating material having a function of inhibiting diffusion of oxygen (e.g., at least one of oxygen atoms, oxygen molecules, and the like) (an insulating material through which the above oxygen is less likely to pass). Further alternatively, aluminum oxide or silicon nitride, for example, may be used for the insulator 511. Such a structure can inhibit diffusion of impurities such as hydrogen or water into the transistor 500A from the substrate side through the insulator 511.

For example, the permittivity of the insulator 512 is preferably lower than that of the insulator 511. The use of a material having a low permittivity for the interlayer film can reduce the parasitic capacitance between wirings.

The conductor 505 is formed to be embedded in the insulator 512. Here, the top surface of the conductor 505 and the top surface of the insulator 512 can be at substantially the same level. Although the conductor 505 is shown as a single layer, the present invention is not limited to this. For example, the conductor 505 may have a multilayer structure of two or more layers. The conductor 505 is preferably formed using a conductive material that has high conductivity and contains tungsten, copper, or aluminum as its main component.

Like the insulator 511 or the insulator 512, the insulator 514 and the insulator 516 function as interlayer films. For example, the insulator 514 preferably functions as a barrier film for inhibiting impurities such as water or hydrogen from entering the transistor 500A from the substrate side. This structure can inhibit diffusion of impurities such as hydrogen or water into the transistor 500A side from the substrate side through the insulator 514. Moreover, for example, the insulator 516 preferably has a lower permittivity than the insulator 514. The use of a material having a low permittivity for the interlayer film can reduce the parasitic capacitance between wirings.

The insulator 522 preferably has a barrier property. The insulator 522 having a barrier property functions as a layer that inhibits entry of impurities such as hydrogen into the transistor 500A from the surroundings of the transistor 500A.

The oxide 530c is preferably provided in the opening in the insulator 580 with the insulator 544 positioned therebetween. When the insulator 544 has a barrier property, diffusion of impurities from the insulator 580 into the oxide 530 can be inhibited.

A barrier layer may be provided over the conductor 542a and the conductor 542b. The barrier layer is preferably formed using a material having a barrier property against oxygen or hydrogen. This structure can inhibit oxidation of the conductor 542a and the conductor 542b at the time of forming the insulator 544.

For the barrier layer, for example, a metal oxide can be used. In particular, an insulating film of aluminum oxide, hafnium oxide, gallium oxide, or the like, which has a barrier property against oxygen and hydrogen, is preferably used. Alternatively, silicon nitride deposited by a CVD method may be used.

When the barrier layer is included, the range of choices for the material of the conductor 542a and the conductor 542b can be expanded. For example, the conductor 542a and the conductor 542b can be formed using a material with a low oxidation resistance and high conductivity, such as tungsten or aluminum. Furthermore, a conductor that can be easily deposited or processed can be used, for example.

The insulator 550 functions as a first gate insulating film. The insulator 550 is preferably provided in the opening in the insulator 580 with the oxide 530c and the insulator 544 positioned therebetween.

Like the conductor 503, the conductor 540a and the conductor 540b can be a single layer or stacked layers using a conductive material such as a metal material, an alloy material, a metal nitride material, or a metal oxide material. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For example, by employing a stacked-layer structure of tantalum nitride or the like, which is a conductor having a barrier property against hydrogen and oxygen, and tungsten, which has high conductivity, the conductor 540a and the conductor 540b can inhibit diffusion of impurities from the outside while maintaining conductivity as wirings.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has small variation in electrical characteristics, stable electrical characteristics, and high reliability can be provided.

TRANSISTOR STRUCTURE EXAMPLE 2

Figure 38A:
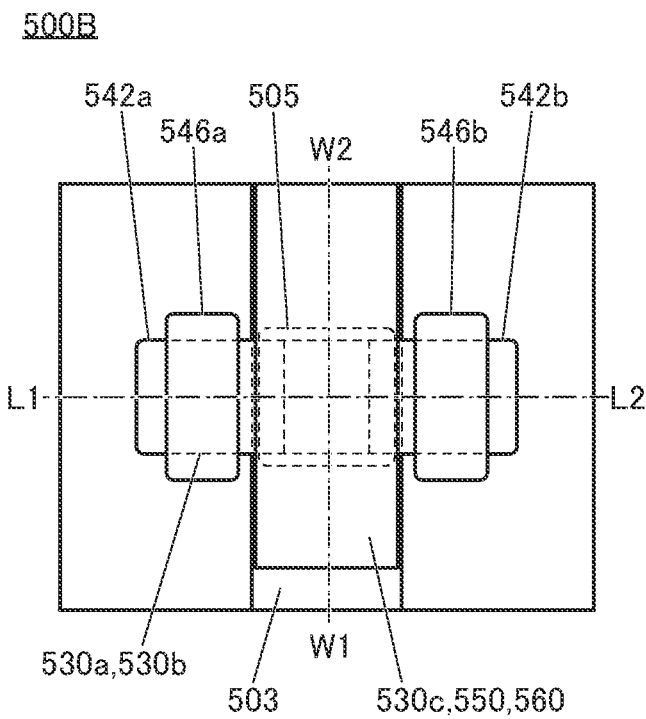
FIG. 38(A) A top view illustrating a structure example of a transistor, and (B), (C) cross-sectional views illustrating the structure example of the transistor.
Figure 38C:
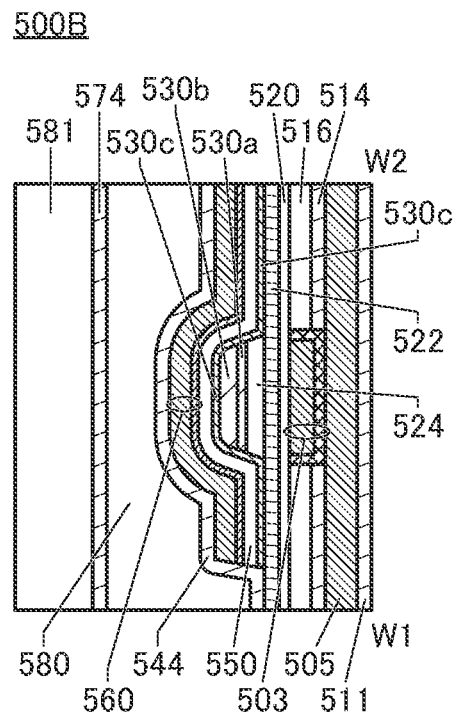
Figure 38B:
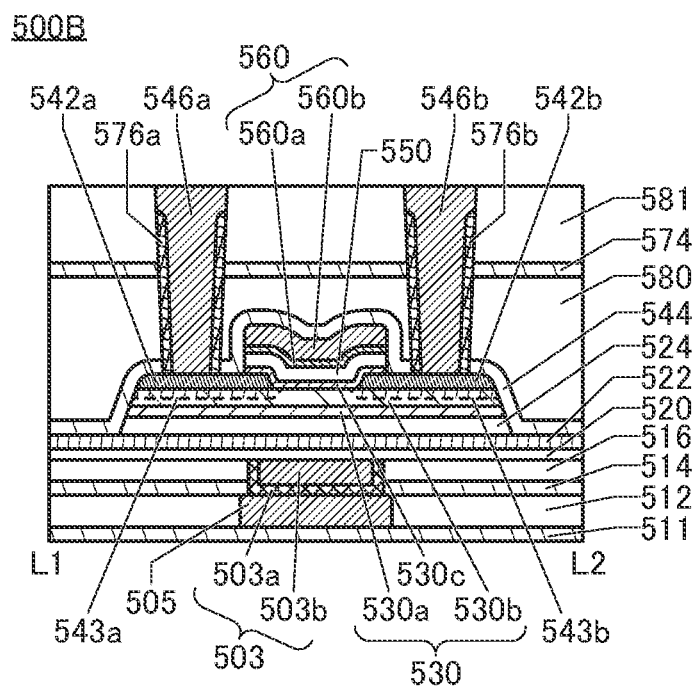

A structure example of a transistor 500B will be described with reference to FIGS. 38(A) to 38(C). FIG. 38(A) is a top view of the transistor 500B. FIG. 38(B) is a cross-sectional view of a portion along the dashed-dotted line L1-L2 in FIG. 38(A). FIG. 38(C) is a cross-sectional view of a portion along the dashed-dotted line W1-W2 in FIG. 38(A). Note that for simplification of the drawing, some components are not illustrated in the top view in FIG. 38(A).

The transistor 500B is a variation example of the transistor 500A. Therefore, differences from the transistor 500A are mainly described to avoid repeated description.

The transistor 500B includes a region where the conductor 542a (the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 544 is preferably provided to cover a top surface and a side surface of the conductor 560, a side surface of the insulator 550, and a side surface of the oxide 530c.

The insulator 544 can inhibit oxidation of the conductor 560. Moreover, the insulator 544 can inhibit diffusion of impurities such as water and hydrogen contained in the insulator 580 into the transistor 500B.

A contact plug of the transistor 500B has a structure different from that of the contact plug of the transistor 500A. In the transistor 500B, an insulator 576a (an insulator 576b) having a barrier property is provided between the insulator 580 and the conductor 546a (the conductor 546b) serving as a contact plug. Providing the insulator 576a (the insulator 576b) can inhibit oxygen in the insulator 580 from reacting with the conductor 546 and oxidizing the conductor 546.

Furthermore, with the insulator 576a (the insulator 576b) having a barrier property, the range of choices for the materials for the conductors used as plugs and wirings can be expanded. The use of a metal material having an oxygen absorbing property and high conductivity for the conductor 546a (the insulator 546b), for example, can provide a semiconductor device with low power consumption. Specifically, it is possible to use a material with a low oxidation resistance and high conductivity, such as tungsten or aluminum. Furthermore, a conductor that can be easily formed or processed can be used, for example.

TRANSISTOR STRUCTURE EXAMPLE 3

Figure 39A:
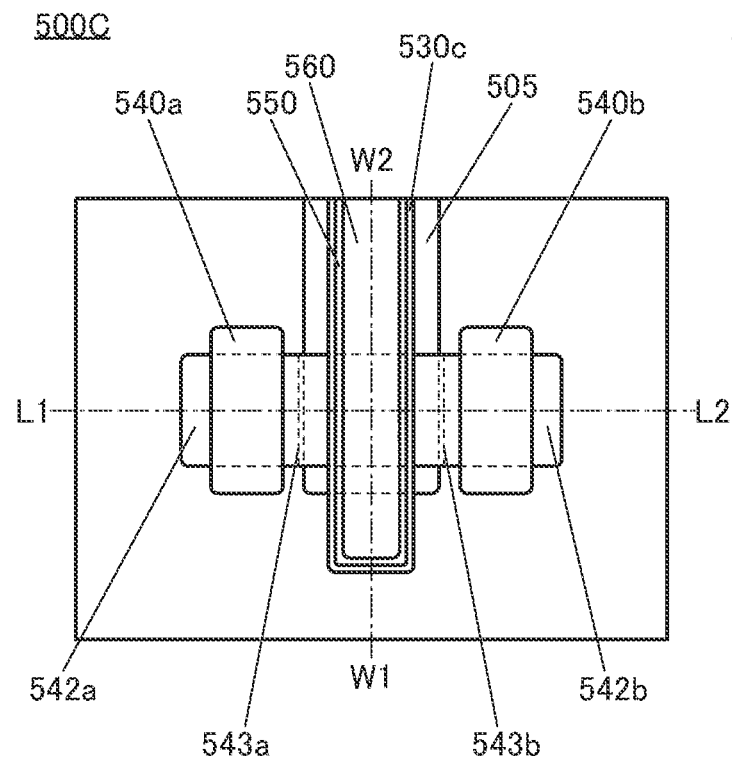
FIG. 39(A) A top view illustrating a structure example of a transistor, and (B), (C) cross-sectional views illustrating the structure example of the transistor.
Figure 39C:
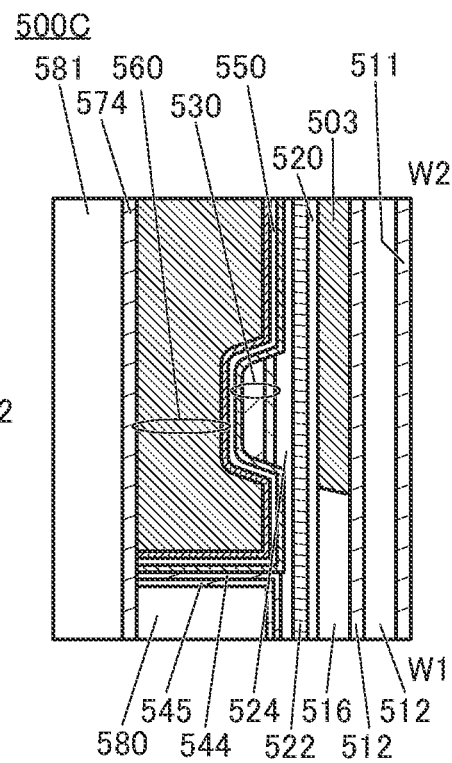
Figure 39B:
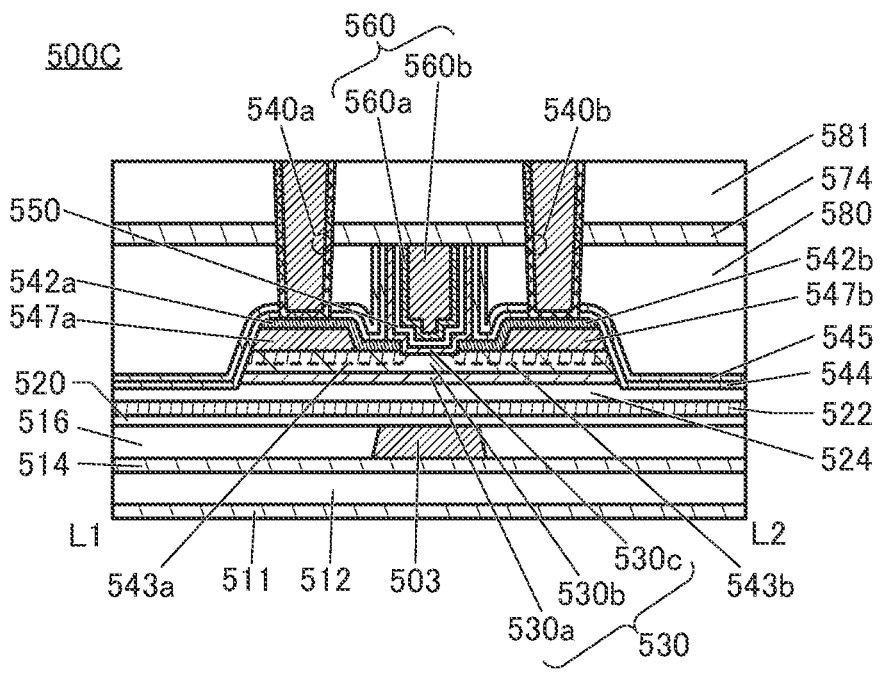

A structure example of a transistor 500C will be described with reference to FIGS. 39(A) to 39(C). FIG. 39(A) is a top view of the transistor 500C. FIG. 39(B) is a cross-sectional view of a portion along the dashed-dotted line L1-L2 in FIG. 39(A). FIG. 39(C) is a cross-sectional view of a portion along the dashed-dotted line W1-W2 in FIG. 39(A). Note that for simplification of the drawing, some components are not illustrated in the top view in FIG. 39(A).

The transistor 500C is a variation example of the transistor 500A. Therefore, differences from the transistor 500A are mainly described to avoid repeated description.

The transistor 500C illustrated in FIGS. 39(A) to 39(C) includes a conductor 547a between the conductor 542a and the oxide 530b, and a conductor 547b between the conductor 542b and the oxide 530b. The conductor 542a (the conductor 542b) has a region that extends beyond the top surface of the conductor 547a (the conductor 547b) and its side surface close to the conductor 560 and is in contact with the top surface of the oxide 530b. Here, the conductor 547a and the conductor 547b are formed using a conductor that can be used as the conductor 542a and the conductor 542b. Furthermore, the conductor 547a and the conductor 547b are preferably thicker than at least the conductor 542a and the conductor 542b.

In the transistor 500C illustrated in FIG. 39, because of the above structure, the conductor 542a and the conductor 542b can be closer to the conductor 560 than in the transistor 500A. Alternatively, the conductor 560 and the end portions of the conductor 542a and the conductor 542b can overlap with each other. Accordingly, the effective channel length of the transistor 500C can be shortened, and the on-state current and the frequency characteristics can be improved.

The conductor 547a (the conductor 547b) is preferably provided to overlap with the conductor 542a (the conductor 542b). With this structure, the conductor 547a (the conductor 547b) can function as a stopper to prevent over-etching of the oxide 530b in etching for forming the opening in which the conductor 540a (the conductor 540b) is to be embedded.

The transistor 500C illustrated in FIG. 39 has a structure in which an insulator 545 is positioned on and in contact with the insulator 544. The insulator 544 preferably functions as a barrier insulating film for inhibiting impurities such as water or hydrogen and excess oxygen from entering the transistor 500C from the insulator 580 side. The insulator 545 can be formed using an insulator that can be used as the insulator 544. The insulator 544 may be formed using a nitride insulator such as aluminum nitride, aluminum titanium nitride, titanium nitride, silicon nitride, or silicon nitride oxide, for example.

Unlike in the transistor 500A in FIG. 37, the conductor 503 has a single-layer structure in the transistor 500C in FIG. 39. In this case, an insulating film to be the insulator 516 is formed over the patterned conductor 503, and an upper portion of the insulating film is removed by a CMP method or the like until the top surface of the conductor 503 is exposed. Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of the insulating layer formed over the conductor 503 and the increase in crystallinity of the oxide 530b and the oxide 530c.

TRANSISTOR STRUCTURE EXAMPLE 4

Figure 40A:
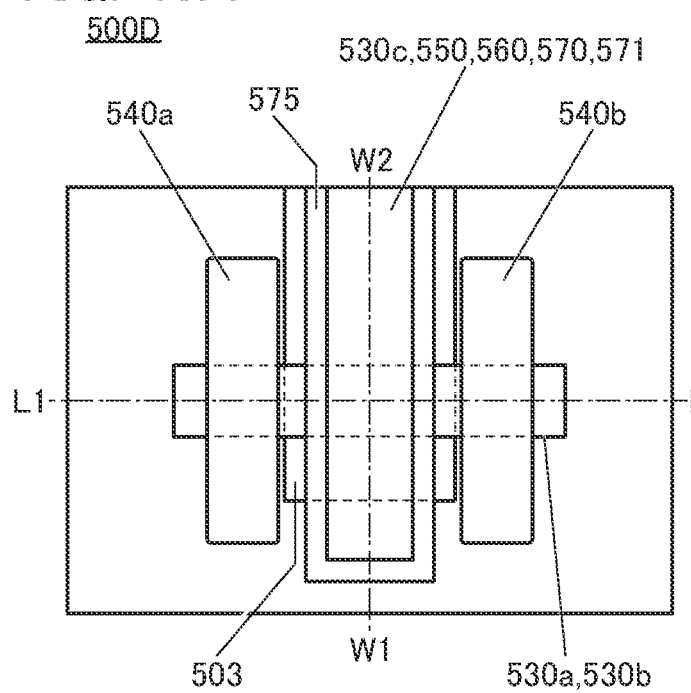
FIG. 40(A) A top view illustrating a structure example of a transistor, and (B), (C) cross-sectional views illustrating the structure example of the transistor.
Figure 40C:
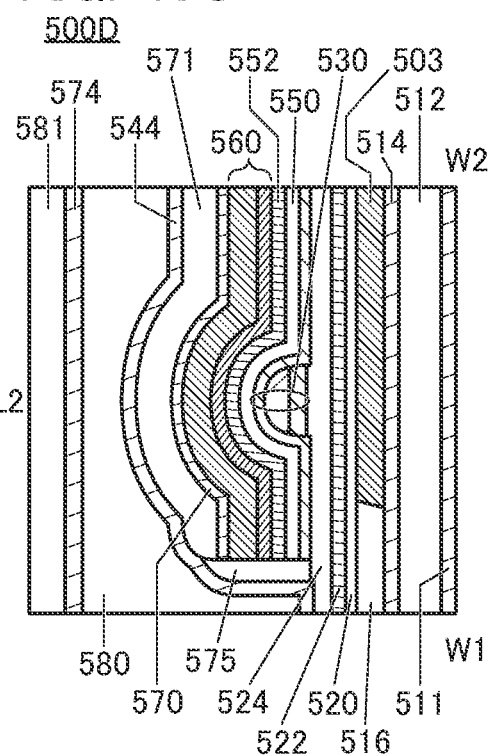
Figure 40B:
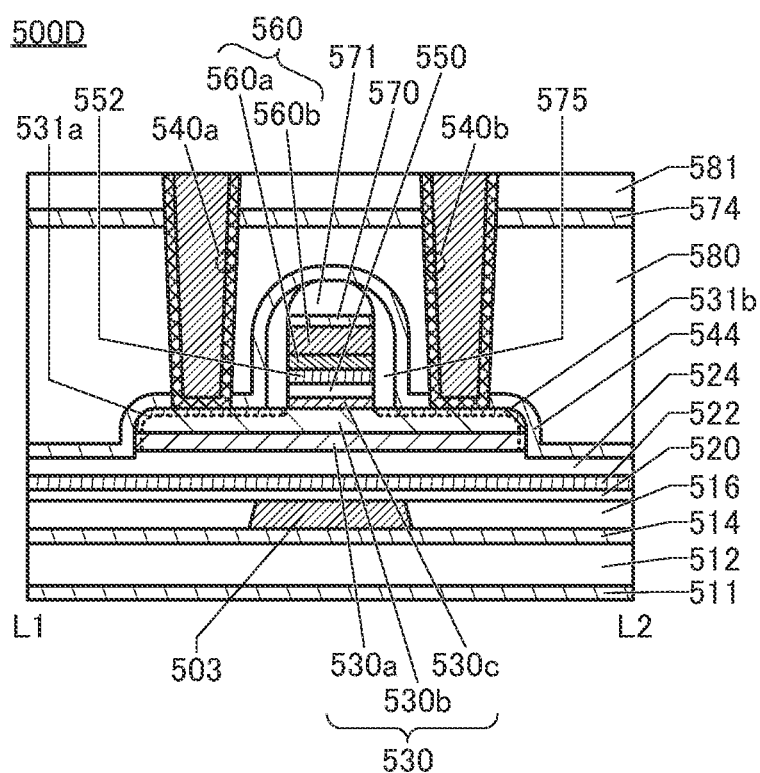

A structure example of a transistor 500D will be described with reference to FIGS. 40(A) to 40(C). FIG. 40(A) is a top view of the transistor 500D. FIG. 40(B) is a cross-sectional view of a portion along the dashed-dotted line L1-L2 in FIG. 40(A). FIG. 40(C) is a cross-sectional view of a portion along the dashed-dotted line W1-W2 in FIG. 40(A). Note that for simplification of the drawing, some components are not illustrated in the top view of FIG. 40(A).

The transistor 500D is a variation example of the above transistors. Therefore, differences from the above transistors are mainly described to avoid repeated description.

The transistor 500D illustrated in FIGS. 40(A) to 40(C) differs from the transistor 500 and the transistor 500A to the transistor 500C in not having the conductor 542a and the conductor 542b and in including a region 531a and a region 531b on part of the exposed surface of the oxide 530b. One of the region 531a and the region 531b functions as a source region, and the other functions as a drain region.

Moreover, in the transistor 500D, the conductor 505 is not provided as in the transistor 500C in FIG. 39, and the conductor 503 having a function of a second gate also functions as a wiring. The transistor 500D includes the insulator 550 over the oxide 530c and a metal oxide 552 over the insulator 550. The conductor 560 is placed over the metal oxide 552, and an insulator 570 is placed over the conductor 560. An insulator 571 is placed over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be suppressed.

Note that the metal oxide 552 may have a function of part of the first gate. For example, an oxide semiconductor that can be used as the oxide 530 can be used as the metal oxide 552. In this case, when the conductor 560 is formed by a sputtering method, the electrical resistance of the metal oxide 552 is lowered so that the metal oxide 552 can be a conductive layer, that is, an OC electrode.

The metal oxide 552 may have a function of part of a gate insulating film. For that reason, when silicon oxide, silicon oxynitride, or the like is used for the insulator 550, the metal oxide 552 is preferably a metal oxide that is a high-k material with a high dielectric constant. Such a stacked-layer structure can have thermal stability and a high dielectric constant. Accordingly, a gate potential that is applied during operation of the transistor can be lowered while the physical thickness is maintained. In addition, the equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 500D can be increased without a reduction in influence of electric fields from the conductor 560. Meanwhile, with the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric fields applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one or more selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate is preferable because it has higher heat resistance than a hafnium oxide film and thus is less likely to be crystallized by heat treatment in later steps. Note that the metal oxide 552 is not an essential component. Design is appropriately determined in consideration of required transistor characteristics.

The insulator 570 is preferably formed using an insulating material having a function of inhibiting transmission of oxygen and impurities such as water or hydrogen. For example, aluminum oxide or hafnium oxide is preferably used. Thus, oxidation of the conductor 560 due to oxygen from above the insulator 570 can be inhibited. Moreover, impurities such as water or hydrogen from above the insulator 570 can be prevented from entering the oxide 530 through the conductor 560 and the insulator 550.

The insulator 571 functions as a hard mask. By provision of the insulator 571, the conductor 560 can be processed to have a side surface that is substantially perpendicular; specifically, the angle formed by the side surface of the conductor 560 and the substrate surface can be greater than or equal to 75° and less than or equal to 100°, preferably greater than or equal to 80° and less than or equal to 95°.

The insulator 571 may be formed using an insulating material having a function of inhibiting transmission of oxygen and impurities such as water or hydrogen so that the insulator 571 also functions as a barrier layer. In this case, the insulator 570 is not necessarily provided.

Parts of the insulator 570, the conductor 560, the metal oxide 552, the insulator 550, and the oxide 530c are selectively removed using the insulator 571 as a hard mask, whereby their side surfaces can be substantially aligned with each other and the surface of the oxide 530b can be partly exposed.

The transistor 500D includes the region 531a and the region 531b on part of the exposed surface of the oxide 530b. One of the region 531a and the region 531b functions as the source region, and the other functions as the drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an impurity element refers to an element other than main constituent elements.

Alternatively, the region 531a and the region 531b can be formed in such manner that, after part of the surface of the oxide 530b is exposed, a metal film is formed and then heat treatment s performed so that the element contained in the metal film is diffused into the oxide 530b.

The electrical resistivity of some regions of the oxide 530b to which the impurity element has been added decreases. For that reason, the region 531a and the region 531b are sometimes referred to impurity regions or low-resistance regions.

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between the channel formation region and the source/drain region (the region 531a or the region 531b). The formation of the region 531a and the region 531b in a self-aligned manner achieves a higher on-state current, a lower threshold voltage, and a higher operating frequency, for example.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 575. In this case, the insulator 575 serves as a mask like the insulator 571 or the like. Thus, the impurity element is not added to the region of the oxide 530b overlapping with the insulator 575, so that the electrical resistivity of the region can be kept high.

The transistor 500D includes the insulator 575 on the side surfaces of the insulator 570, the conductor 560, the metal oxide 552, the insulator 550, and the oxide 530c. The insulator 575 is preferably an insulator having a low dielectric constant. The insulator 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used as the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 500D also includes the insulator 544 over the insulator 575 and the oxide 530. The insulator 544 is preferably formed by a sputtering method. When a sputtering method is used, an insulator containing few impurities such as water or hydrogen can be deposited. For example, aluminum oxide is preferably used for the insulator 544.

Note that an oxide film formed by a sputtering method may extract hydrogen from the component over which the oxide film is formed. For that reason, the hydrogen concentration in the oxide 530 and the insulator 575 can be reduced when the insulator 544 absorbs hydrogen and water from the oxide 530 and the insulator 575.

TRANSISTOR STRUCTURE EXAMPLE 5

Figure 41A:
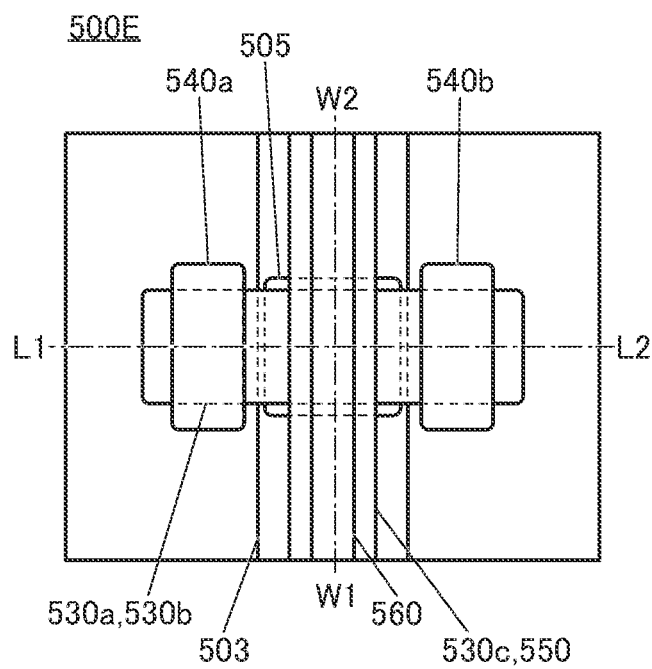
FIG. 41(A) A top view illustrating a structure example of a transistor, and (B), (C) cross-sectional views illustrating the structure example of the transistor.
Figure 41C:
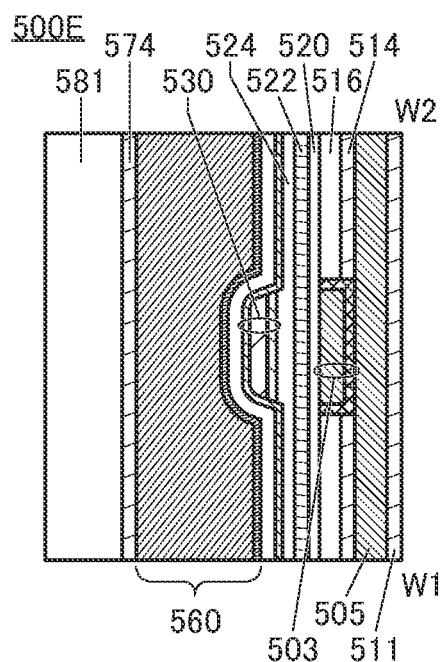
Figure 41B:
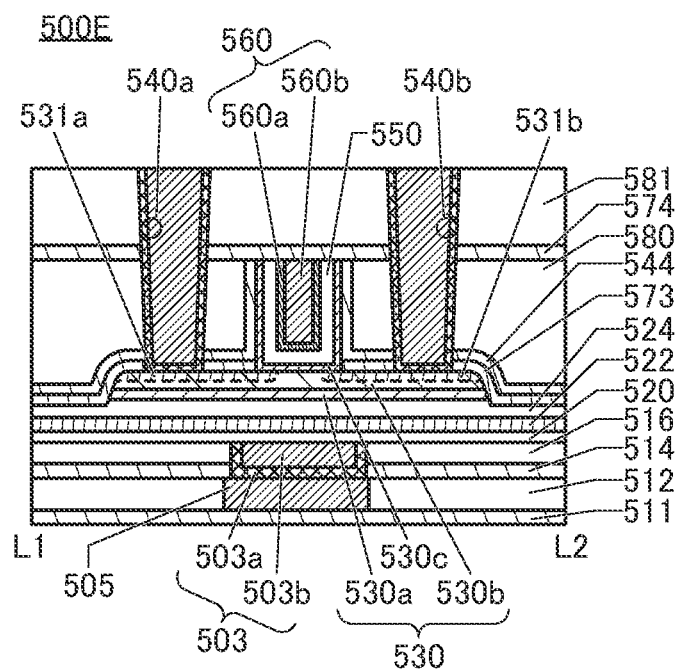

A structure example of a transistor 500E will be described with reference to FIGS. 41(A) to 41(C). FIG. 41(A) is a top view of the transistor 500E. FIG. 41(B) is a cross-sectional view of a portion along the dashed-dotted line L1-L2 in FIG. 41(A). FIG. 41(C) is a cross-sectional view of a portion along the dashed-dotted line W1-W2 in FIG. 41(A). Note that for simplification of the drawing, some components are not illustrated in the top view in FIG. 41(A).

The transistor 500E is a variation example of the above transistors. Therefore, differences from the above transistors are mainly described to avoid repeated description.

In FIGS. 41(A) to 41(C), as in the transistor 500D, the conductor 542a and the conductor 542b are not provided, and part of the exposed surface of the oxide 530b includes the region 531a and the region 531b. One of the region 531a and the region 531b functions as a source region, and the other functions as a drain region. Moreover, an insulator 573 is provided between the oxide 530b and the insulator 544.

The region 531a and the region 531b illustrated in FIG. 41 are regions where an element described below is added to the oxide 530b. The region 531a and the region 531b can be formed using a dummy gate, for example.

Specifically, a dummy gate is provided over the oxide 530b, and an element that reduces the resistance of some regions of the oxide 530b is added using the dummy gate as a mask. That is, the element is added to regions of the oxide 530 that do not overlap with the dummy gate, whereby the region 531a and the region 531b are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of some regions of the oxide 530b are boron and phosphorus. Moreover, hydrogen, carbon, nitrogen, fluorine, sulfur, chlorine, titanium, a rare gas element, or the like may be used. Typical examples of rare gas elements include helium, neon, argon, krypton, and xenon. The concentration of the element can be measured by secondary ion mass spectrometry (SIMS) or the like.

In particular, boron and phosphorus can be added by an apparatus in the manufacturing line for a Si transistor containing amorphous silicon, low-temperature polysilicon, or the like in its semiconductor layer; thus, the resistance of part of the oxide 530b can be reduced by using the apparatus in the manufacturing line. That is, part of the manufacturing line for a Si transistor can be used in the process of manufacturing the transistor 500E.

Next, an insulating film to be the insulator 573 and an insulating film to be the insulator 544 may be formed over the oxide 530b and the dummy gate. Stacking the insulating film to be the insulator 573 and the insulating film to be the insulator 544 can provide a region where the region 531a or the region 531b, the oxide 530c, and the insulator 550 overlap with each other.

Specifically, after an insulating film to be the insulator 580 is provided over the insulating film to be the insulator 544, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 544 and the insulator 573 are exposed at the side surface of the opening provided in the insulator 580, and the region 531a and the region 531b provided in the oxide 530b are partly exposed at the bottom surface of the opening. Next, an oxide film to be the oxide 530c, an insulating film to be the insulator 550, and a conductive film to be the conductor 560 are formed in this order in the opening, and then are partly removed by CMP treatment or the like until the insulator 580 is exposed; consequently, the transistor illustrated in FIG. 41 can be formed.

Note that the insulator 573 and the insulator 544 are not essential components. Design is appropriately determined in consideration of required transistor characteristics.

Since the transistor illustrated in FIG. 41 is not provided with the conductor 542a and the conductor 542b, the cost can be reduced.

TRANSISTOR STRUCTURE EXAMPLE 6

Although FIG. 36 illustrates the structure example in which the conductor 560 functioning as the gate is formed inside the opening in the insulator 580, it is possible to employ a structure where the insulator is provided above the conductor, for example. FIG. 42 and FIG. 43 illustrate a structure example of such a transistor.

Figure 42A:
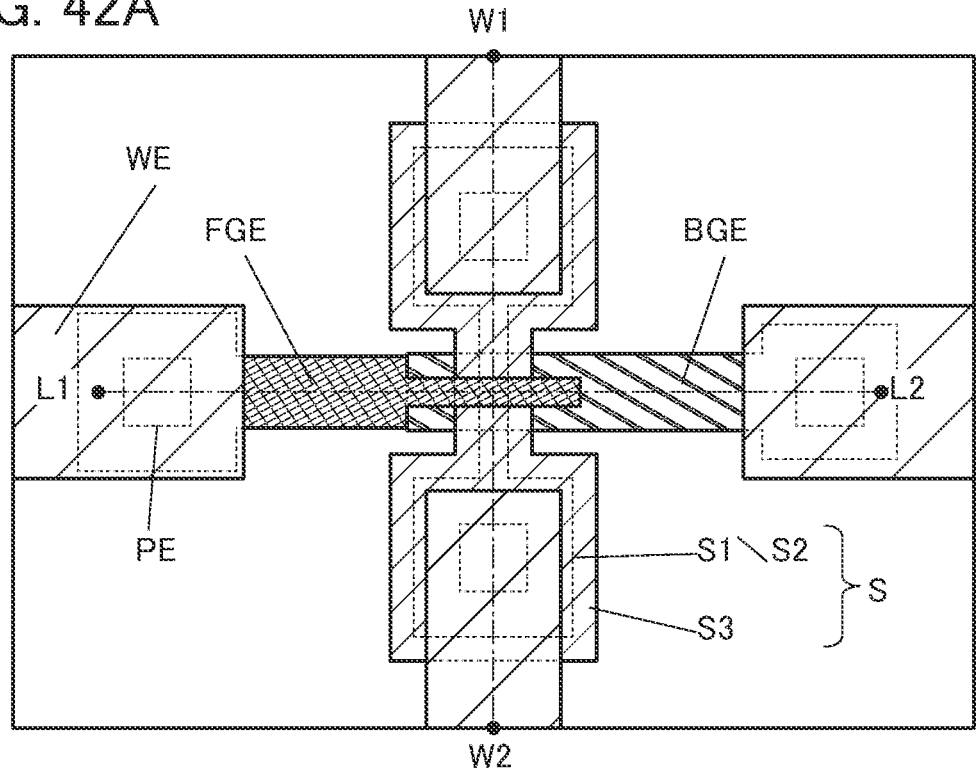
FIG. 42(A) A top view illustrating a structure example of a transistor, and (B) a perspective view illustrating the structure example of the transistor.
Figure 42B:
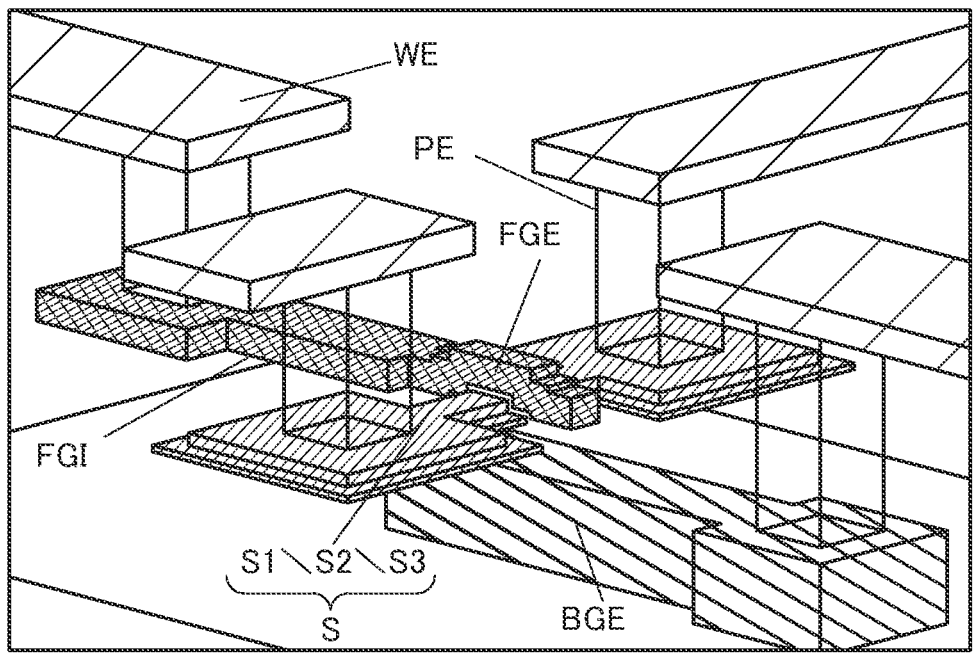
Figure 43A:
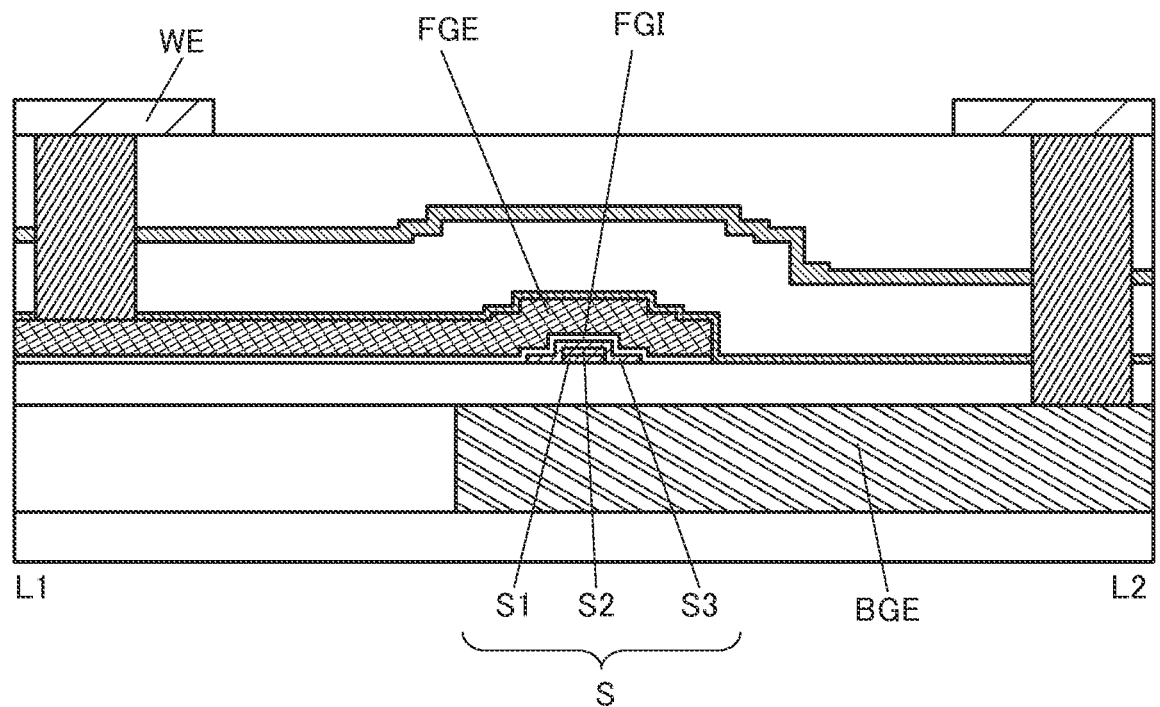
FIGS. 43(A), (B) Cross-sectional views illustrating a structure example of a transistor.
Figure 43B:
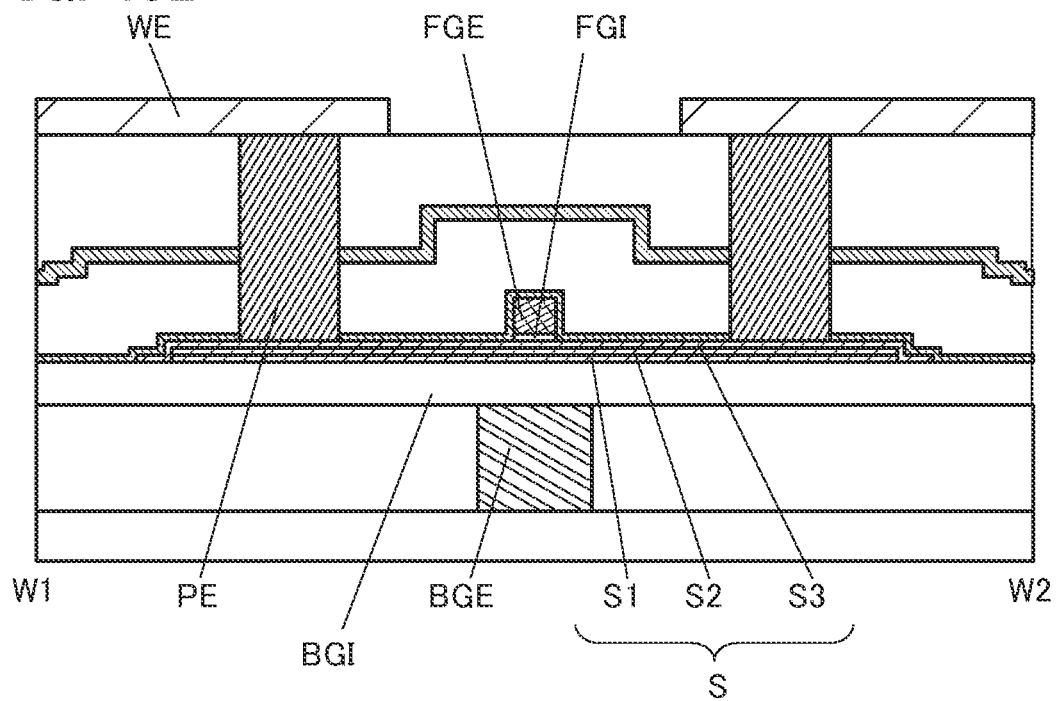

FIG. 42(A) is a top view of the transistor, and FIG. 42(B) is a perspective view of the transistor. FIG. 43(A) is a cross-sectional view along L1-L2 in FIG. 42(A), and FIG. 43(B) is a cross-sectional view along W1-W2.

The transistor illustrated in FIG. 42 and FIG. 43 includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S, the conductor BGE, or the conductor FGE. An example where the oxide semiconductor S includes three layers of oxides S1, S2, and S3 is shown here.

<Structure Example of Capacitor>

Figure 44A:
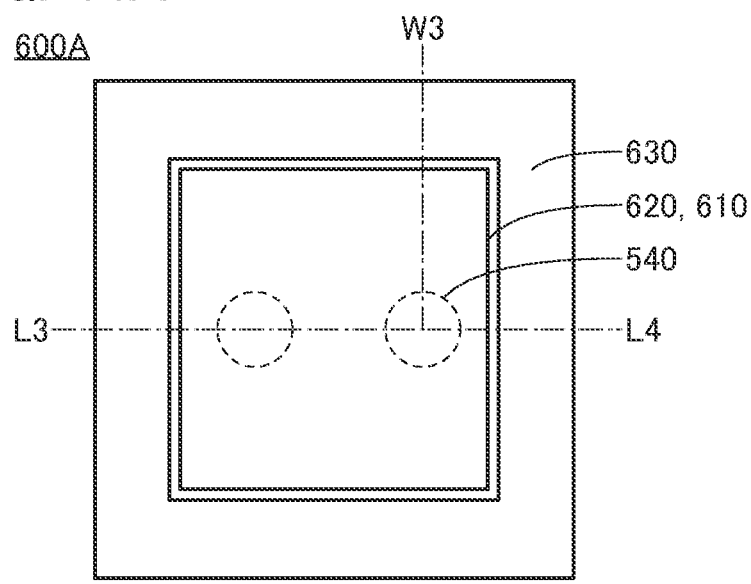
FIG. 44(A) A top view illustrating a structure example of a capacitor, and (B), (C) cross-sectional perspective views illustrating the structure example of the capacitor.
Figure 44B:
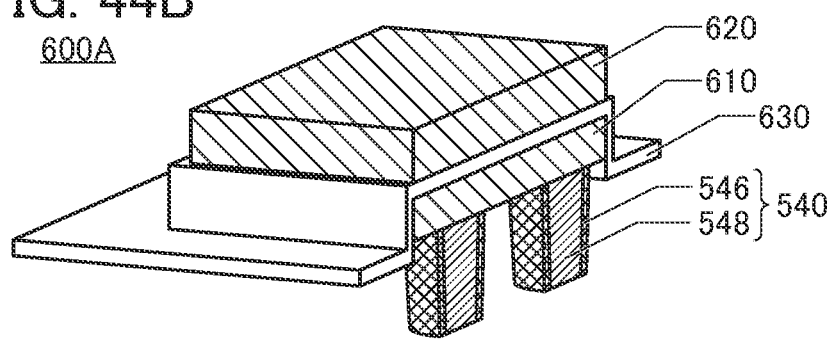
Figure 44C:
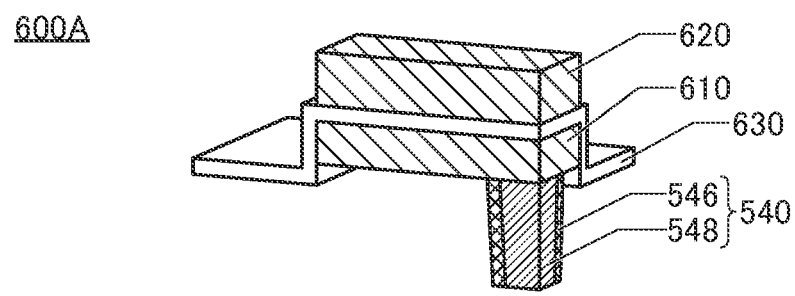

FIG. 44 illustrates a capacitor 600A as an example of the capacitor 600 that can be used in the semiconductor device shown in FIG. 34. FIG. 44(A) is a top view of the capacitor 600A, FIG. 44(B) is a perspective view illustrating a cross section of the capacitor 600A along the dashed-dotted line L3-L4, and FIG. 44(C) is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric between the pair of electrodes.

A bottom portion of the conductor 610 in the capacitor 600 is electrically connected to the conductor 546 and the conductor 548. The conductor 546 and the conductor 548 function as plugs or wirings for connecting to another circuit component. In FIG. 44, the conductor 546 and the conductor 548 are collectively denoted as a conductor 540.

For clarification of the drawing, the insulator 586 in which the conductor 546 and the conductor 548 are embedded and the insulator 650 that covers the conductor 620 and the insulator 630 are omitted in FIG. 44.

Although the capacitor 600 illustrated in each of FIG. 34, FIG. 35, and FIG. 44 is a planar capacitor, the shape of the capacitor is not limited thereto. For example, the capacitor 600 may be a cylindrical capacitor 600B illustrated in FIG. 45.

Figure 45A:
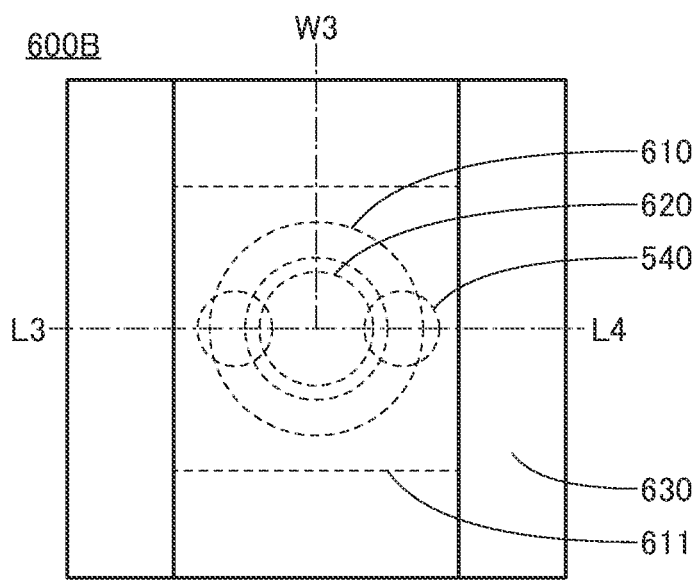
FIG. 45(A) A top view illustrating a structure example of a capacitor, (B) a cross-sectional view illustrating the structure example of the capacitor, and (C) a cross-sectional perspective view illustrating the structure example of the capacitor.
Figure 45B:
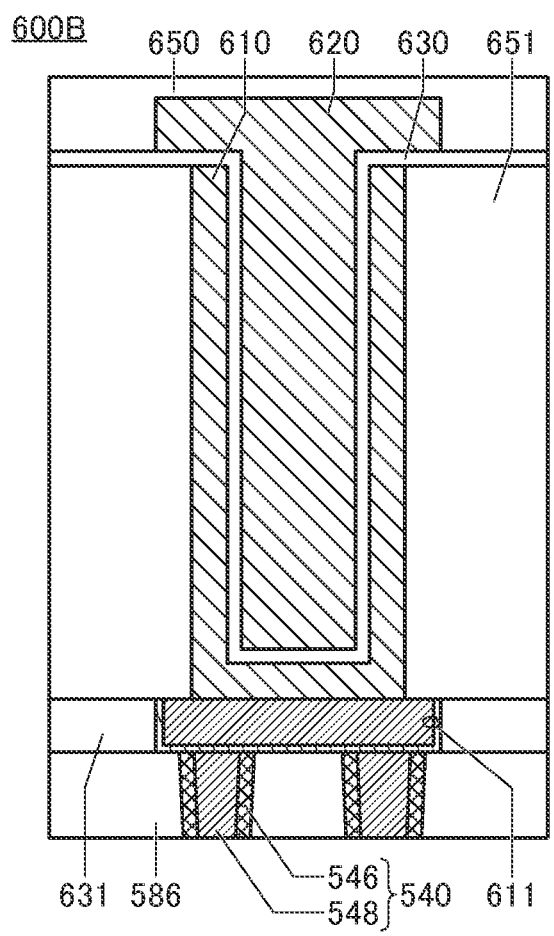
Figure 45C:
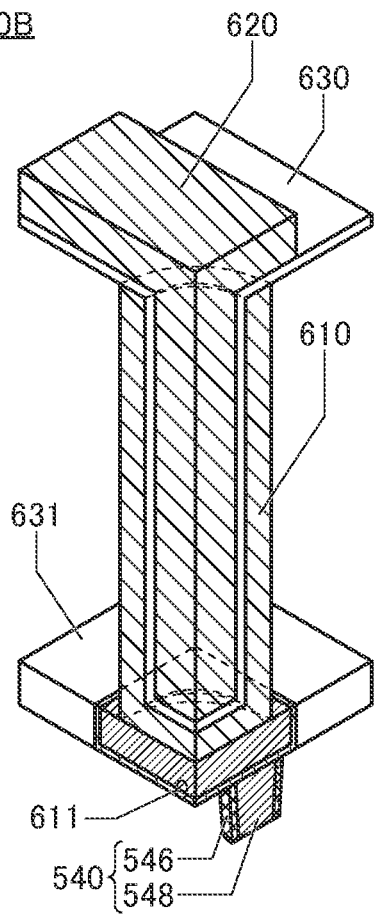

FIG. 45(A) is a top view of the capacitor 600B, FIG. 45(B) is a perspective view illustrating a cross section of the capacitor 600B along the dashed-dotted line L3-L4, and FIG. 45(C) is a perspective view illustrating a cross section of the capacitor 600B along the dashed-dotted line W3-L4.

In FIG. 45(B), the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For clarification of the drawing, the insulator 586, the insulator 650, and the insulator 651 are omitted in FIG. 45(C).

The insulator 631 can be formed using a material similar to that for the insulator 586, for example.

A conductor 611 is embedded in the insulator 631 to be electrically connected to the conductor 540. The conductor 611 can be formed using a material similar to that for the conductor 330 and the conductor 518, for example.

The insulator 651 can be formed using a material similar to that for the insulator 586, for example.

The insulator 651 has an opening as described above, and the opening overlaps with the conductor 611.

The conductor 610 is formed on the bottom portion and the side surface of the opening. In other words, the conductor 621 overlaps with the conductor 611 and is electrically connected to the conductor 611.

The conductor 610 is formed in such a manner that an opening is formed in the insulator 651 by an etching method or the like, the conductor 610 is then deposited by a sputtering method, an ALD method, or the like, and after that, the conductor 610 deposited over the insulator 651 is removed by a CMP (Chemical Mechanical Polishing) method or the like while the conductor 610 deposited in the opening is left.

The insulator 630 is positioned over the insulator 651 and over the formation surface of the conductor 610. Note that the insulator 630 functions as a dielectric between the pair of electrodes in the capacitor.

The conductor 620 is formed over the insulator 630 so as to fill the opening of the insulator 651.

The insulator 650 is formed to cover the insulator 630 and the conductor 620.

The capacitance of the cylindrical capacitor 600B illustrated in FIG. 45 can be higher than that of the planar capacitor 600A. Thus, when the capacitor 600B is used as the capacitors C01 and C01m described in the above embodiment, for example, a voltage between the terminals of the capacitor can be maintained for long time.

Note that this embodiment can be combined with other embodiments in this specification as appropriate.

Embodiment 6

In this embodiment, the composition of a metal oxide that can be used in the OS transistor described in the above embodiment will be described.

<Composition of Metal Oxide>

In this specification and the like, CAAC (c-axis aligned crystal) and CAC (Cloud-Aligned Composite) may be stated. Note that CAAC refers to an example of a crystal structure, and CAC refers to an example of a function or a material composition.

A CAC—OS or a CAC-metal oxide has a conducting function in part of the material and has an insulating function in another part of the material; as a whole, the CAC—OS or the CAC-metal oxide has a function of a semiconductor. In the case where the CAC—OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC—OS or the CAC-metal oxide. In the CAC—OS or the CAC-metal oxide, separation of the functions can maximize each function.

The CAC—OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC—OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC—OS or the CAC-metal oxide includes components having different band gaps. For example, the CAC—OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC—OS or CAC-metal oxide is used in a channel region of a transistor, high current driving capability in the on state of the transistor, that is, a high on-state current and high field-effect mobility can be obtained.

In other words, the CAC—OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC—OS (c-axis aligned crystal crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC—OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC—OS. That is, formation of a crystal grain boundary is inhibited by the distortion of lattice arrangement. This is probably because the CAAC—OS can tolerate distortion owing to the low density of oxygen atom arrangement in the a-b plane direction, a change in interatomic bond distance by replacement of a metal element, and the like.

The CAAC—OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC—OS is an oxide semiconductor with high crystallinity. Meanwhile, in the CAAC—OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC—OS can be regarded as an oxide semiconductor that has small amounts of impurities and defects (e.g., oxygen vacancies). Thus, an oxide semiconductor including the CAAC—OS is physically stable. Therefore, the oxide semiconductor including the CAAC—OS is resistant to heat and has high reliability. In addition, the CAAC—OS is stable with respect to high temperature in the manufacturing process (what is called thermal budget). Accordingly, the use of the CAAC—OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC—OS.

An oxide semiconductor has various structures with different properties. Two or more of the amorphous oxide semiconductor, the polycrystalline oxide semiconductor, the a-like OS, the nc-OS, and the CAAC—OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier density is preferably used for a transistor. In the case where the carrier density of an oxide semiconductor film is reduced, the impurity concentration in the oxide semiconductor film is reduced to reduce the density of defect states. In this specification and the like, a state with a low impurity concentration and a low density of defect states is referred to as a highly purified intrinsic or substantially highly purified intrinsic state. For example, the carrier density of the oxide semiconductor is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase in carrier density. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

Note that this embodiment can be combined with other embodiments in this specification as appropriate.

Embodiment 7

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 46(A).

Figure 46A:
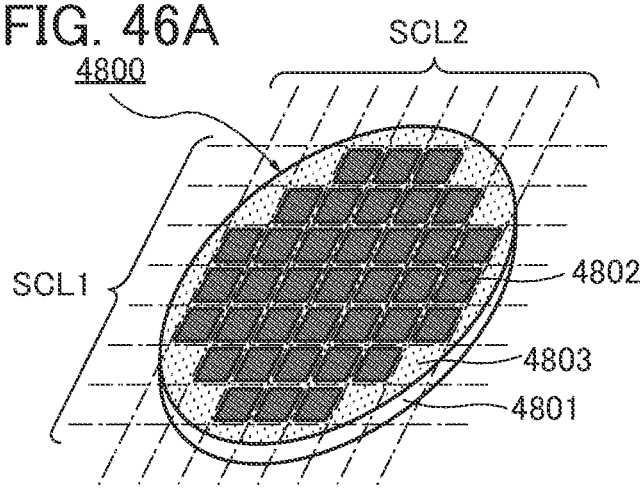
FIG. 46(A) A perspective view illustrating an example of a semiconductor wafer, and (B), (C), (D) perspective views illustrating examples of electronic components.

A semiconductor wafer 4800 illustrated in FIG. 46(A) includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as a dicing line or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 46B:
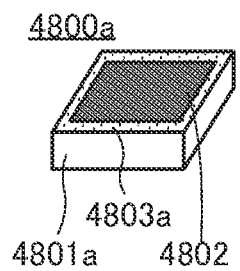

With the dicing step, a chip 4800a as illustrated in FIG. 46(B) can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 46(A). The element substrate may be a rectangular semiconductor wafer, for example. The shape of the element substrate can be changed as appropriate, depending on a manufacturing process of an element and an apparatus for manufacturing the element.

<Electronic Components>

Next, examples of electronic components incorporating the chip 4800a are described with reference to FIGS. 46(C) and 46(D).

Figure 46C:
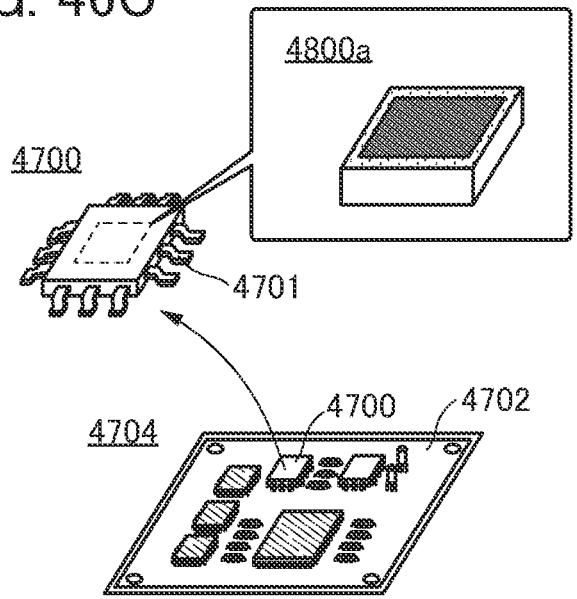

FIG. 46(C) is a perspective view of an electronic component 4700 and a substrate (a mounting board 4704) on which the electronic component 4700 is mounted. The electronic component 4700 illustrated in FIG. 46(C) includes a lead 4701 and the above-described chip 4800a, and functions as an IC chip or the like. In particular, in this specification and the like, the electronic component 4700 including the semiconductor device such as the arithmetic circuit 110 described in the above embodiment is referred to as a brain-morphic processor (BMP).

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a QFP (Quad Flat Package) is used as the package of the electronic component 4700 in FIG. 46(C), the mode of the package is not limited thereto.

The electronic component 4700 is mounted on a printed circuit board 4702, for example. A plurality of such IC chips are combined and electrically connected to each other on the printed circuit board 4702, whereby the mounting board 4704 is completed.

Figure 46D:
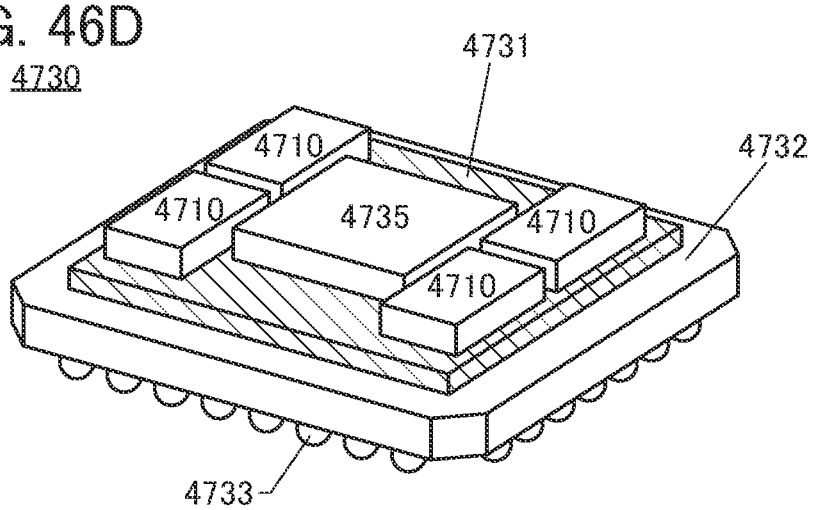

FIG. 46(D) is a perspective view of an electronic component 4730. The electronic component 4730 is an example of a SiP (System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode may be provided in the interposer 4731 and used to electrically connect an integrated circuit and the package substrate 4732. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 46(D) illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with other embodiments in this specification as appropriate.

Embodiment 8

Figure 47:
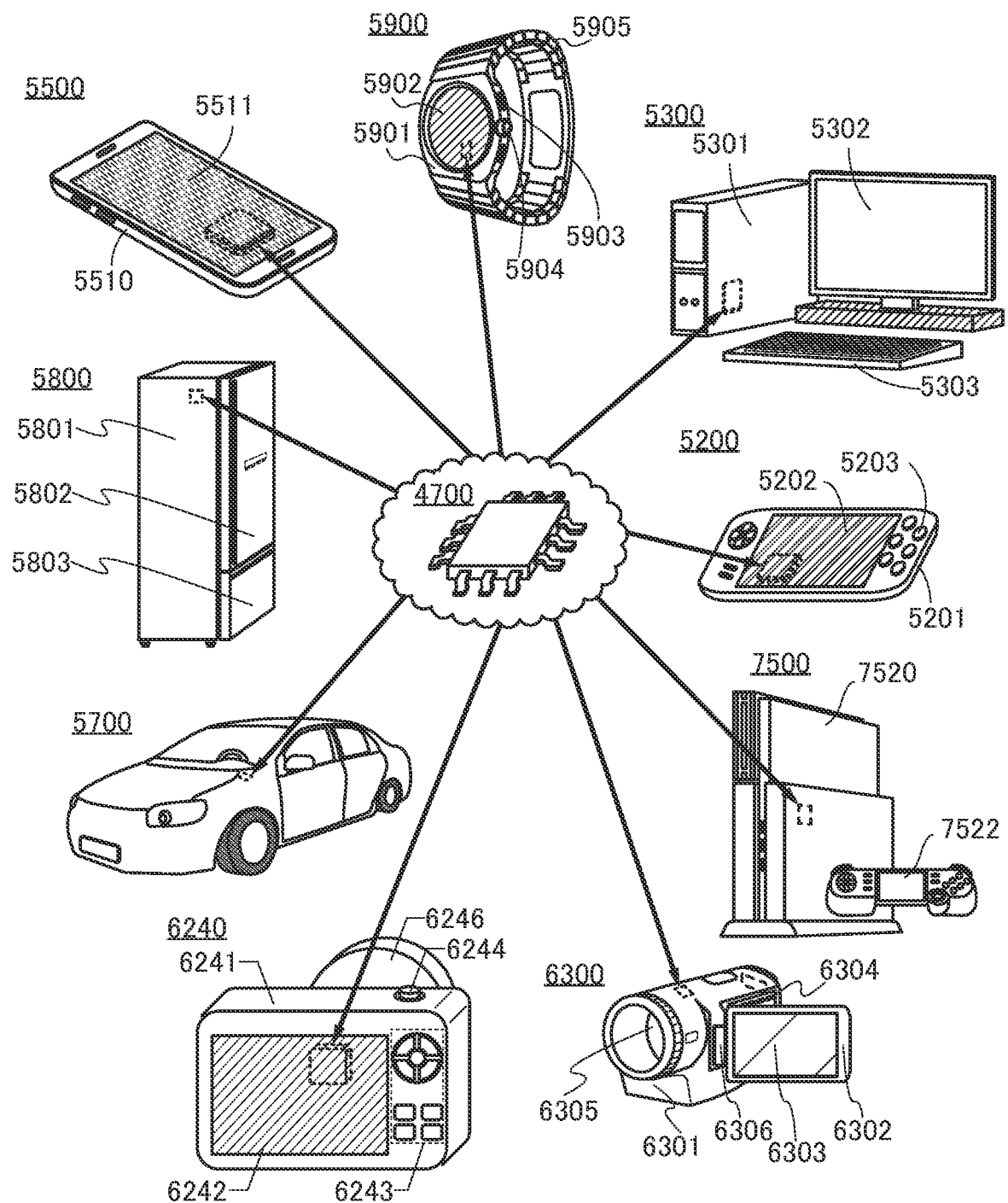
FIG. 47 A perspective view illustrating examples of electronic devices.

This embodiment will show examples of electronic devices including the semiconductor device described in the above embodiment. FIG. 47 illustrates electronic devices each of which includes the electronic component 4700 (BMP) including the semiconductor device.

[Mobile Phone]

An information terminal 5500 illustrated in FIG. 47 is a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Wearable Terminal]

FIG. 47 illustrates a smart watch 5900 as an example of a wearable terminal. The smart watch 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application that manages the health condition of the user of the wearable terminal and a navigation system that selects the optimal route and navigates the user on the basis of the input of the destination.

[Information Terminal]

FIG. 47 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 47 illustrates the smartphone and the desktop information terminal as examples of the electronic device, one embodiment of the present invention can also be applied to information terminals other than a smartphone and a desktop information terminal. Examples of information terminals other than a smartphone and a desktop information terminal include a PDA (Personal Digital Assistant), a laptop information terminal, and a workstation.

[Household Appliance]

FIG. 47 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

The electric refrigerator-freezer is described here as an example of a household appliance; other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 47 illustrates a portable game machine 5200 as an example of a game machine. The portable game machine 5200 includes a housing 5201, a display portion 5202, a button 5203, and the like.

FIG. 47 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 47, the controller 7522 can include a display portion that displays a game image, and an input interface besides a button, such as a touch panel, a stick, a rotating knob, and a sliding knob, for example. The shape of the controller 7522 is not limited to that in FIG. 47, and may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary gaming machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

The portable game machine 5200 including the semiconductor device described in the above embodiment can have low power consumption. Moreover, heat generation from a circuit can be reduced owing to low power consumption; thus, the influence of heat generation on the circuit, the peripheral circuit, and the module can be reduced.

Furthermore, when the semiconductor device described in the above embodiment is used in the portable game machine 5200, the portable game machine 5200 including artificial intelligence can be obtained.

In general, the progress of a game, the actions and words of game characters, and expressions of a phenomenon and the like in the game are programmed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although FIG. 47 illustrates the portable game machine and the home stationary game machine as examples of game machines, the electronic device of one embodiment of the present invention is not limited thereto. Examples of the electronic device of one embodiment of the present invention include an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 47 illustrates an automobile 5700 as an example of a moving vehicle.

An instrument panel that provides various kinds of information such as a speedometer; a tachometer; a mileage, a fuel meter, a gearshift indicator; and air-conditioning settings is provided around the driver's seat in the automobile 5700. In addition, a display device showing the above information may be provided around the driver's seat.

In particular, the display device can provide the view obstructed by the pillar or the like, the blind areas for the driver's seat, and the like to the driver by displaying an image taken by an imaging device (not illustrated) provided for the automobile 5700. That is, displaying an image taken by the imaging device provided on the outside of the automobile 5700 leads to compensation for the blind spot and enhancement of safety.

Since the semiconductor device described in the above embodiment can be used as the components of artificial intelligence, the semiconductor device described in the above embodiment can be used for an automatic driving system of the automobile 5700, for example. The semiconductor device can also be used for a system for navigation, risk prediction, or the like. The display device may display navigation information, risk prediction information, or the like.

Although an automobile is described above as an example of a moving vehicle, moving vehicles are not limited to an automobile. Examples of moving objects include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

[Camera]

The semiconductor device described in the above embodiment can be used for a camera.

FIG. 47 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally provided in the digital camera 6240.

The digital camera 6240 including the semiconductor device described in the above embodiment can have low power consumption. Moreover, heat generation from a circuit can be reduced owing to low power consumption; thus, the influence of heat generation on the circuit, the peripheral circuit, and the module can be reduced.

Furthermore, when the semiconductor device described in the above embodiment is used in the digital camera 6240, the digital camera 6240 including artificial intelligence can be obtained. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in the above embodiment can be used for a video camera.

FIG. 47 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of artificial intelligence, the video camera 6300 can perform the pattern recognition by artificial intelligence in encoding of the images. The pattern recognition is used to calculate a difference in the human, the animal, the object, and the like between continuously taken image data, so that the data can be compressed.

[Extension Device for PC]

The semiconductor device described in the above embodiment can be used for a calculator such as a PC (Personal Computer) and an extension device for an information terminal.

Figure 48A:
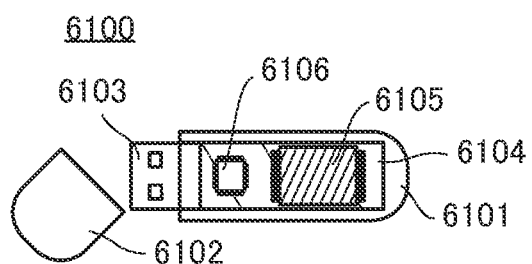
FIG. 48 (A), (B), (C) Perspective views illustrating examples of electronic devices.

FIG. 48(A) illustrates, as an example of the extension device, a portable extension device 6100 that includes a chip capable of arithmetic processing and is externally attached to a PC. The extension device 6100 can perform arithmetic processing using the chip when connected to a PC with a USB (Universal Serial Bus), for example. FIG. 48(A) illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device described in the above embodiment or the like. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the extension device 6100 for a PC and the like can increase the arithmetic processing capability of the PC. Thus, a PC with insufficient processing capability can perform arithmetic operation of artificial intelligence, moving image processing, and the like.

[Broadcasting System]

The semiconductor device described in the above embodiment can be used for a broadcasting system.

Figure 48B:
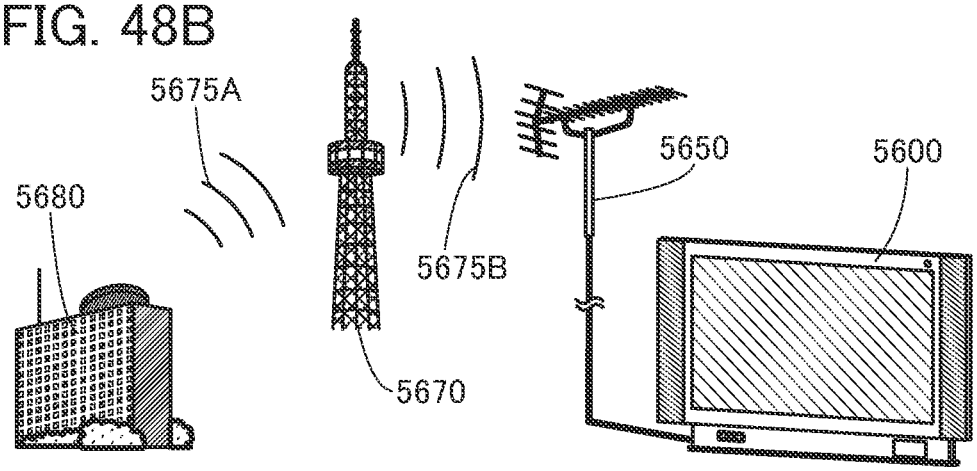

FIG. 48(B) schematically illustrates data transmission in a broadcasting system. Specifically, FIG. 48(B) illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although a UHF (Ultra-High Frequency) antenna is illustrated as the antenna 5650 in FIG. 48(B), a BS/110° CS antenna, a CS antenna, or the like can also be used.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 48(B) and may be satellite broadcasting using an artificial satellite, data broadcasting using an optical line, or the like.

The above-described broadcasting system may utilize artificial intelligence by including the semiconductor device described in the above embodiment. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, by making the artificial intelligence in the recording device learn the user's preference, TV programs that suit the user's preference can be recorded automatically.

[Authentication System]

The semiconductor device described in the above embodiment can be used for an authentication system.

Figure 48C:
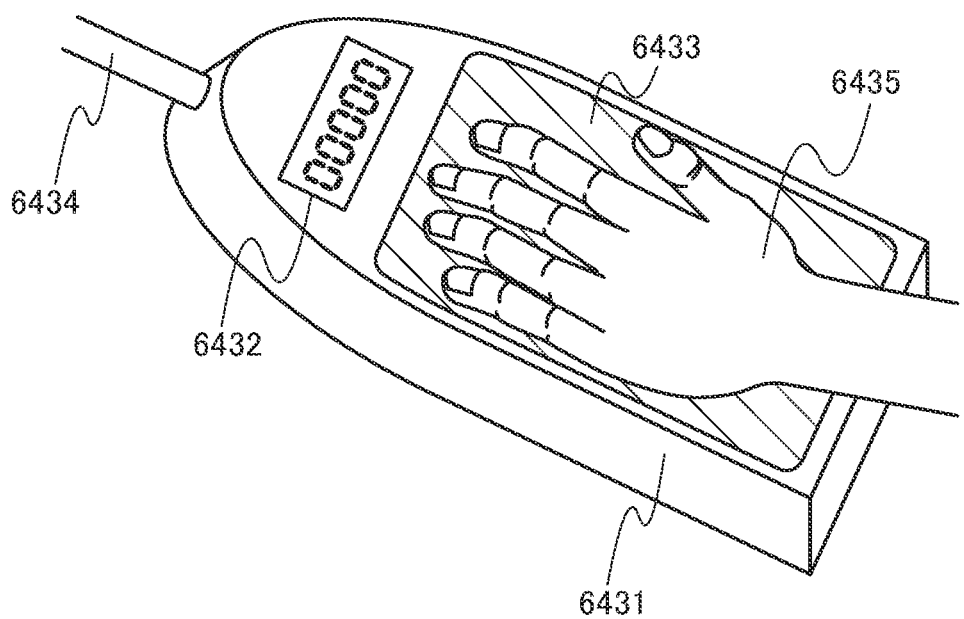

FIG. 48(C) illustrates a palm print authentication device including a housing 6431, a display portion 6432, a palm print reading portion 6433, and a wiring 6434.

In FIG. 48(C), a palm print of a hand 6435 is obtained by the palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with other embodiments in this specification as appropriate.

REFERENCE NUMERALS

MPC: circuit, MPC[1]: circuit, MPC[i]: circuit, MPC[m]: circuit, ACTF: circuit, TRF: converter circuit, BF1: circuit, BF2: circuit, SC: switching circuit, DINV1: inverter circuit, DINV2: inverter circuit, INV1: inverter circuit, INV1A: inverter circuit, INV2: inverter circuit, INV3: inverter circuit, SINV1: inverter circuit, SINV2: inverter circuit, HCA: holding unit, HCAm: holding unit, HCA1: holding unit, HCA2: holding unit, HCB: holding unit, LGC1: logic circuit, LGC2: logic circuit, E[1]: coincidence circuit, E[2]: coincidence circuit, E[i]: coincidence circuit, E[m−2]: coincidence circuit, E[m−1]: coincidence circuit, E[m]: coincidence circuit, inp: terminal, inn: terminal, outp: terminal, outn: terminal, wt: terminal, wtm: terminal, wta: terminal, xt: terminal, st: terminal, stm: terminal, ct: terminal, inpa: terminal, inna: terminal, outa: terminal, SL01: wiring, SL01$m$: wiring, SL01$a$: wiring, SL02: wiring, SL02$a$: wiring, SL51: wiring, SL52: wiring, SL53: wiring, SL54: wiring, SL55: wiring, SL56: wiring, SL57: wiring, SL58: wiring, SL59: wiring, SL60: wiring, SL61: wiring, SL62: wiring, DL: wiring, DLm: wiring, SWL: wiring, SWLm: wiring, CL: wiring, VDDL: wiring, VSSL: wiring, VSS1L: wiring, VSS2L: wiring, VL: wiring, Vref1L: wiring, Vref2L: wiring, VAL: wiring, VBL: wiring, WLD: circuit, AFP: circuit, SWLD: circuit, TSG: circuit, COD: circuit, Tr01: transistor, Tr01$m$: transistor, Tr01*p*: transistor, Tr02: transistor, Tr02*m*: transistor, Tr02*a*: transistor, Tr03: transistor, Tr03*m*: transistor, Tr03*a*: transistor, Tr04: transistor, Tr05: transistor, Tr06: transistor, Tr07: transistor, Tr08: transistor, Tr09: transistor, Tr11: transistor, Tr12: transistor, Tr13: transistor, Tr14: transistor, Tr15: transistor, Tr41: transistor, Tr42: transistor, Tr43: transistor, Tr44: transistor, C01: capacitor, C01*m*: capacitor, C01*a*: capacitor, C21: capacitor, C22: capacitor, LE: load element, S01: switch, S02: switch, S03: switch, S04: switch, S05: switch, S05*a*: switch, S51: switch, S51*a*: switch, S52: switch, S52*a*: switch, S53: switch, S53*a*: switch, S54: switch, S54*a*: switch, S55: switch, S56: switch, S57: switch, S58: switch, S59: switch, S60: switch, S61: switch, S62: switch, A01: analog switch, A02: analog switch, A03: analog switch, A04: analog switch, $N_1^{(1)}$: neuron, $N_p^{(1)}$: neuron, $N_1^{(k-1)}$: neuron, $N_i^{(k-1)}$: neuron, $N_m^{(k-1)}$: neuron, $N_1^{(k)}$: neuron, $N_j^{(k)}$: neuron, $N_n^{(k)}$: neuron, $N_1^{(R)}$: neuron, $N_q^{(R)}$: neuron, BGI: insulator, FGI: insulator, BGE: conductor, FGE: conductor, PE: conductor, WE: conductor, SCL1: scribe line, SCL2: scribe line, 100: neural network, 110: arithmetic circuit, 120: arithmetic circuit, 130: arithmetic circuit, 140: arithmetic circuit, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 500A: transistor, 500B: transistor, 500C: transistor, 500D: transistor, 500E: transistor, 503: conductor, 503*a*: conductor, 503*b*: conductor, 505: conductor, 510: insulator, 511: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 531*a*: region, 531*b*: region, 540: conductor, 540*a*: conductor, 540*b*: conductor, 542*a*: conductor, 542*b*: conductor, 543*a*: region, 543*b*: region, 544: insulator, 545: insulator, 546: conductor, 546*a*: conductor, 546*b*: conductor, 547*a*: conductor, 547*b*: conductor, 548: conductor, 550: insulator, 552: metal oxide, 560: conductor, 560*a*: conductor, 560*b*: conductor, 570: insulator, 571: insulator, 573: insulator, 574: insulator, 575: insulator, 576*a*: insulator, 576*b*: insulator, 580: insulator, 581: insulator, 582: insulator, 586: insulator, 600: capacitor, 600A: capacitor, 600B: capacitor, 610: conductor, 611: conductor, 612: conductor, 620: conductor, 621: conductor, 630: insulator, 631: insulator, 650: insulator, 651: insulator, 4700: electronic component, 4701: lead, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5901: housing, 5902: display portion, 5903: operation button, 5904: operator, 5905: band, 6100: extension device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7520: main body, 7522: controller

The invention claimed is:

1. A semiconductor device comprising a first circuit comprising a first input terminal, a second input terminal, a first output terminal, a second output terminal, a second circuit, a third circuit, and a switching circuit,
   wherein the second circuit comprises a first transistor,
   wherein the first transistor comprises a first gate and a second gate,
   wherein the switching circuit comprises third to fifth input terminals,
   wherein the first input terminal is electrically connected to an input terminal of the second circuit,
   wherein the second input terminal is electrically connected to an input terminal of the third circuit,
   wherein an output terminal of the second circuit is electrically connected to the third input terminal,
   wherein an output terminal of the third circuit is electrically connected to the fourth input terminal,
   wherein the second circuit has:
      a function of correcting a signal input to the input terminal of the second circuit and outputting the corrected signal from the output terminal of the second circuit, and
      a function of changing a time it takes after the signal is input to the input terminal of the second circuit until the corrected signal is output from the output terminal of the second circuit, in accordance with a potential of the second gate of the first transistor,
   wherein the third circuit has a function of correcting a signal input to the input terminal of the third circuit and outputting the corrected signal to the output terminal of the third circuit, and
   wherein the switching circuit has a function of electrically connecting the third input terminal to one of the first output terminal and the second output terminal and electrically connecting the fourth input terminal to the other of the first output terminal and the second output terminal, in accordance with a signal input to the fifth input terminal.

2. The semiconductor device according to claim 1, wherein the second circuit comprises a second transistor, a first holding unit, and a first inverter circuit,
   wherein the first transistor is an n-channel transistor,
   wherein the second transistor is a p-channel transistor,
   wherein the input terminal of the second circuit is electrically connected to a gate of the second transistor and the first gate of the first transistor,
   wherein a first terminal of the second transistor is electrically connected to a first terminal of the first transistor and an input terminal of the first inverter circuit,
   wherein an output terminal of the first inverter circuit is electrically connected to the output terminal of the second circuit,
   wherein the second gate of the first transistor is electrically connected to the first holding unit, and
   wherein the first holding unit has a function of holding the potential of the second gate of the first transistor.

3. The semiconductor device according to claim 2, wherein the first holding unit comprises a sixth transistor and a capacitor,
- wherein the second gate of the first transistor is electrically connected to a first terminal of the sixth transistor and a first terminal of the capacitor, and
- wherein the sixth transistor comprises a metal oxide in a channel formation region.

4. The semiconductor device according to claim 2, wherein the first holding unit comprises a second inverter circuit and a third inverter circuit,
- wherein the second gate of the first transistor is electrically connected to an input terminal of the second inverter circuit and an output terminal of the third inverter circuit, and
- wherein an output terminal of the second inverter circuit is electrically connected to an input terminal of the third inverter circuit.

5. The semiconductor device according to claim 1,
- wherein the second circuit comprises second to fifth transistors, a first holding unit, a second holding unit, and a first inverter circuit,
- wherein the first transistor and the third transistor are n-channel transistors,
- wherein the second transistor is a p-channel transistor,
- wherein the fourth transistor comprises a third gate and a fourth gate,
- wherein the input terminal of the second circuit is electrically connected to a gate of the second transistor, the third gate of the fourth transistor, and the first gate of the first transistor,
- wherein a first terminal of the second transistor is electrically connected to a first terminal of the third transistor, a first terminal of the fifth transistor, and an input terminal of the first inverter circuit,
- wherein a second terminal of the third transistor is electrically connected to a first terminal of the first transistor,
- wherein a second terminal of the fifth transistor is electrically connected to a first terminal of the fourth transistor,
- wherein an output terminal of the first inverter circuit is electrically connected to the output terminal of the second circuit,
- wherein the second gate of the first transistor is electrically connected to the first holding unit,
- wherein the fourth gate of the fourth transistor is electrically connected to the second holding unit,
- wherein the first holding unit has a function of holding the potential of the second gate of the first transistor, and
- wherein the second holding unit has a function of holding a potential of the fourth gate of the fourth transistor.

6. The semiconductor device according to claim 1,
- wherein the second circuit comprises a second transistor, a third transistor, a first holding unit, and a first inverter circuit,
- wherein the first transistor and the third transistor are n-channel transistors,
- wherein the second transistor is a p-channel transistor,
- wherein the input terminal of the second circuit is electrically connected to a gate of the second transistor, a gate of the third transistor, and the first gate of the first transistor,
- wherein a first terminal of the second transistor is electrically connected to a first terminal of the third transistor and an input terminal of the first inverter circuit,
- wherein a second terminal of the third transistor is electrically connected to a first terminal of the first transistor,
- wherein an output terminal of the first inverter circuit is electrically connected to the output terminal of the second circuit,
- wherein the second gate of the first transistor is electrically connected to the first holding unit, and
- wherein the first holding unit has a function of holding the potential of the second gate of the first transistor.

7. The semiconductor device according to claim 1,
- wherein the second circuit comprises a load element, a first holding unit, and a first inverter circuit,
- wherein the input terminal of the second circuit is electrically connected to the first gate of the first transistor,
- wherein a first terminal of the load element is electrically connected to a first terminal of the first transistor and an input terminal of the first inverter circuit,
- wherein an output terminal of the first inverter circuit is electrically connected to the output terminal of the second circuit,
- wherein the second gate of the first transistor is electrically connected to the first holding unit, and
- wherein the first holding unit has a function of holding the potential of the second gate of the first transistor.

8. The semiconductor device according to claim 1, wherein the first transistor comprises a metal oxide in a channel formation region.

* * * * *